US009123878B2

(12) United States Patent
Iwata et al.

(10) Patent No.: US 9,123,878 B2
(45) Date of Patent: Sep. 1, 2015

(54) MAGNETIC MEMORY DEVICE UTILIZING MAGNETIC DOMAIN WALL MOTION

(71) Applicant: KABUSHIKI KAISHA TOSHIBA, Minato-ku, Tokyo (JP)

(72) Inventors: Yoshihisa Iwata, Yokohama (JP); Yoshiaki Osada, Kawasaki (JP); Sumiko Domae, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 65 days.

(21) Appl. No.: 14/156,183

(22) Filed: Jan. 15, 2014

(65) Prior Publication Data

US 2015/0070980 A1   Mar. 12, 2015

Related U.S. Application Data

(60) Provisional application No. 61/875,461, filed on Sep. 9, 2013.

(51) Int. Cl.
| | |
|---|---|
| *G11C 11/00* | (2006.01) |
| *H01L 43/02* | (2006.01) |
| *H01L 27/22* | (2006.01) |
| *G11C 11/16* | (2006.01) |

(52) U.S. Cl.
CPC ............ *H01L 43/02* (2013.01); *G11C 11/1675* (2013.01); *H01L 27/228* (2013.01)

(58) Field of Classification Search
CPC ..................................................... G11C 11/00
USPC ......... 365/48, 55, 62, 66, 74, 78, 80–93, 100, 365/129, 130, 131, 148, 158, 171–173, 209, 365/213, 225.5, 230.07, 232, 243.5; 257/295, 421, 422, 427, E21.665, 257/E27.006; 438/3; 977/933–935
See application file for complete search history.

(56) References Cited

U.S. PATENT DOCUMENTS

| | | | | |
|---|---|---|---|---|
| 3,369,225 | A  * | 2/1968 | Fuller ............................ | 365/87 |
| 2002/0186514 | A1* | 12/2002 | Childress et al. .......... | 360/324.2 |
| 2004/0252538 | A1* | 12/2004 | Parkin ............................ | 365/80 |
| 2004/0252539 | A1* | 12/2004 | Parkin ............................ | 365/80 |
| 2005/0078509 | A1* | 4/2005 | Parkin ........................... | 365/158 |
| 2005/0094427 | A1* | 5/2005 | Parkin ............................ | 365/80 |
| 2006/0120132 | A1* | 6/2006 | Parkin ............................ | 365/80 |
| 2007/0096229 | A1* | 5/2007 | Yoshikawa et al. ........... | 257/421 |
| 2007/0198618 | A1 | 8/2007 | Kim et al. | |
| 2008/0080092 | A1* | 4/2008 | Kim ............................... | 360/110 |
| 2008/0080234 | A1* | 4/2008 | Iwata et al. .................... | 365/171 |

(Continued)

*Primary Examiner* — Harry W Byrne
(74) *Attorney, Agent, or Firm* — Holtz, Holtz, Goodman & Chick PC

(57) ABSTRACT

A magnetic memory device includes a magnetic thin wire including magnetic domains along a direction in which the magnetic thin wire extends. Magnetization directions of the magnetic domains are variable. A magnetic tunnel junction (MTJ) structure includes a pinned layer with a fixed magnetization direction and an insulator, and makes an MTJ including the pinned layer and insulator and a magnetic domain in the magnetic thin wire in a first position to sandwich the insulator with pinned layer. First and second electrodes are at both ends of the magnetic thin wire. At least one third electrode is coupled to the magnetic thin wire between the first and second electrodes.

20 Claims, 55 Drawing Sheets

(56) References Cited

U.S. PATENT DOCUMENTS

| | | |
|---|---|---|
| 2008/0137395 A1 | 6/2008 | Hwang et al. |
| 2008/0239784 A1 | 10/2008 | Gaidis et al. |
| 2010/0157663 A1 | 6/2010 | Lee et al. |
| 2010/0232055 A1 | 9/2010 | Lee et al. |
| 2011/0085258 A1 | 4/2011 | Bae et al. |
| 2012/0250398 A1 | 10/2012 | Morise et al. |
| 2012/0250406 A1 | 10/2012 | Morise et al. |
| 2013/0077395 A1 | 3/2013 | Kondo et al. |

* cited by examiner

| | | Electrodes | | | | | | | | | | |
|---|---|---|---|---|---|---|---|---|---|---|---|---|
| | | E0 | E1 | E2 | E3 | E4 | E5 | E6 | E7 | E8 | E9 | EA |
| Periods | R | V2 | F | V1 | F | F | F | F | F | F | F | F |
| | S | F | V2 | F | V1 | F | F | F | F | F | F | F |
| | T | F | F | V2 | F | V1 | F | F | F | F | F | F |
| | U | F | F | F | V2 | F | V1 | F | F | F | F | F |
| | V | F | F | F | F | V2 | F | V1 | F | F | F | F |
| | W | F | F | F | F | F | V2 | F | V1 | F | F | F |
| | X | F | F | F | F | F | F | V2 | F | V1 | F | F |
| | Y | F | F | F | F | F | F | F | V2 | F | V1 | F |
| | Z | F | F | F | F | F | F | F | F | V2 | F | V1 |

| Signals | Periods |
|---|---|
| | A | B | C | D | E | F | G | H | I |
| E02L | L | L | L | L | L | L | L | H | L |
| E13L | L | L | L | L | L | L | L | L | H |
| E24L | L | L | L | L | L | L | H | L | L |
| E35L | L | L | L | L | L | H | L | L | L |
| E46L | L | L | L | L | H | L | L | L | L |
| E57L | L | L | L | H | L | L | L | L | L |
| E68L | L | L | H | L | L | L | L | L | L |
| E79L | L | H | L | L | L | L | L | L | L |
| E8AL | H | L | L | L | L | L | L | L | L |
| E02R | L | L | L | L | L | L | L | L | L |
| E13R | L | L | L | L | L | L | L | L | L |
| E24R | L | L | L | L | L | L | L | L | L |
| E35R | L | L | L | L | L | L | L | L | L |
| E46R | L | L | L | L | L | L | L | L | L |
| E57R | L | L | L | L | L | L | L | L | L |
| E68R | L | L | L | L | L | L | L | L | L |
| E79R | L | L | L | L | L | L | L | L | L |
| E8AR | L | L | L | L | L | L | L | L | L |

FIG. 9

| Signals | Periods |
|---|---|
| | R | S | T | U | V | W | X | Y | Z |
| E02L | L | L | L | L | L | L | L | L | L |
| E13L | L | L | L | L | L | L | L | L | L |
| E24L | L | L | L | L | L | L | L | L | L |
| E35L | L | L | L | L | L | L | L | L | L |
| E46L | L | L | L | L | L | L | L | L | L |
| E57L | L | L | L | L | L | L | L | L | L |
| E68L | L | L | L | L | L | L | L | L | L |
| E79L | L | L | L | L | L | L | L | L | L |
| E8AL | H | L | L | L | L | L | L | L | L |
| E02R | L | H | L | L | L | L | L | L | L |
| E13R | L | L | H | L | L | L | L | L | L |
| E24R | L | L | L | H | L | L | L | L | L |
| E35R | L | L | L | L | H | L | L | L | L |
| E46R | L | L | L | L | L | H | L | L | L |
| E57R | L | L | L | L | L | L | H | L | L |
| E68R | L | L | L | L | L | L | L | H | L |
| E79R | L | L | L | L | L | L | L | L | L |
| E8AR | L | L | L | L | L | L | L | L | H |

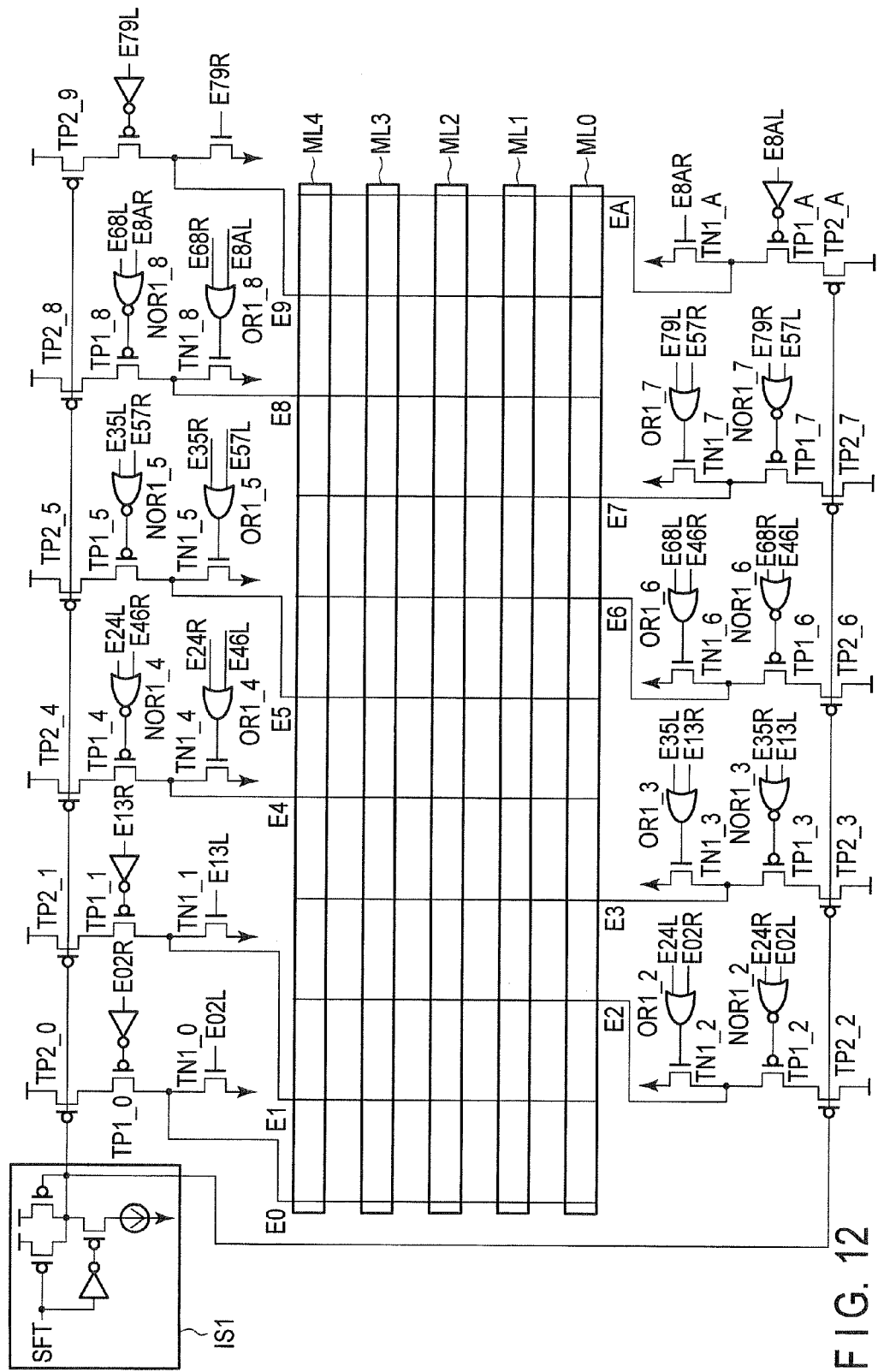
F I G. 12

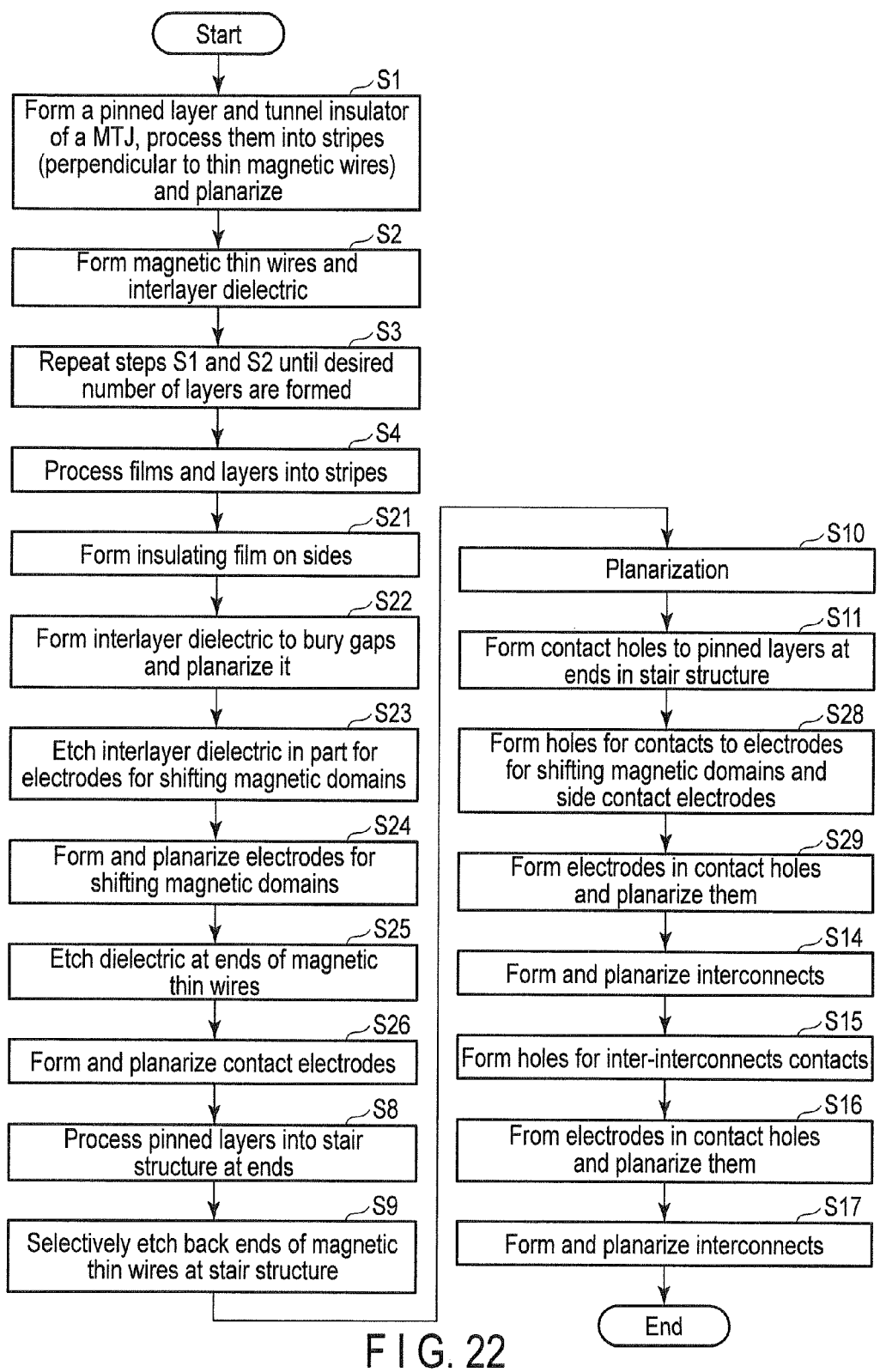
F I G. 22

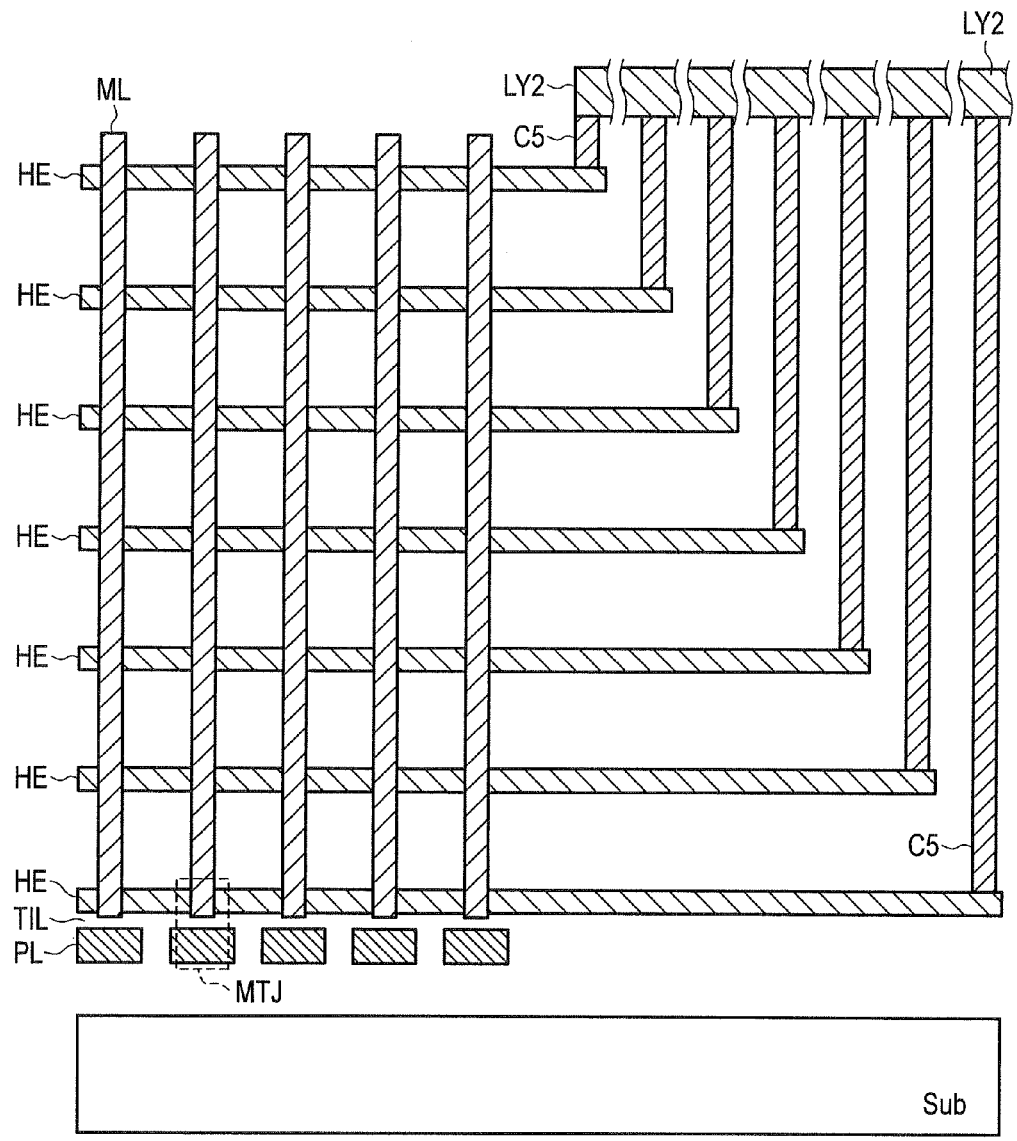
F I G. 23

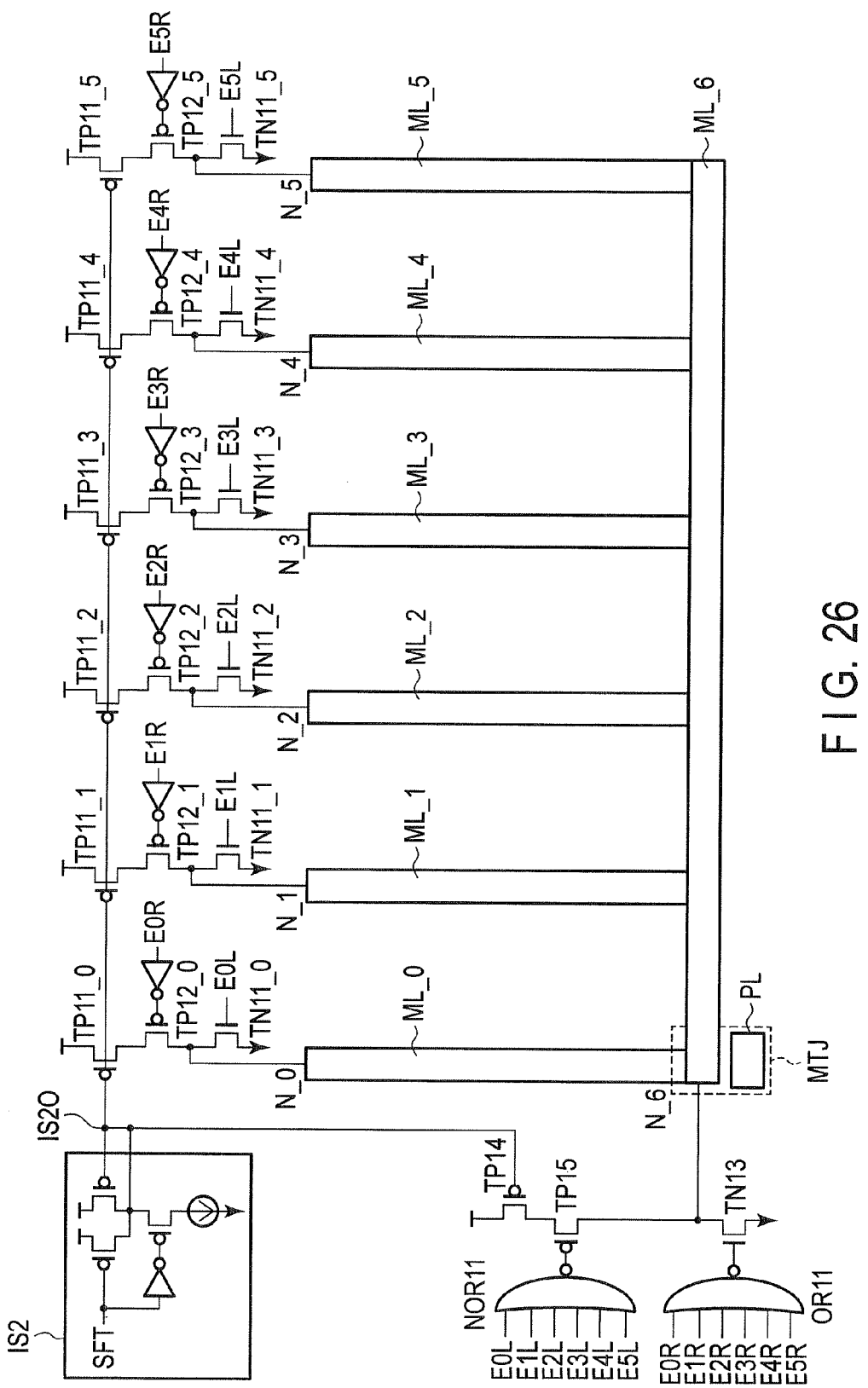
F I G. 26

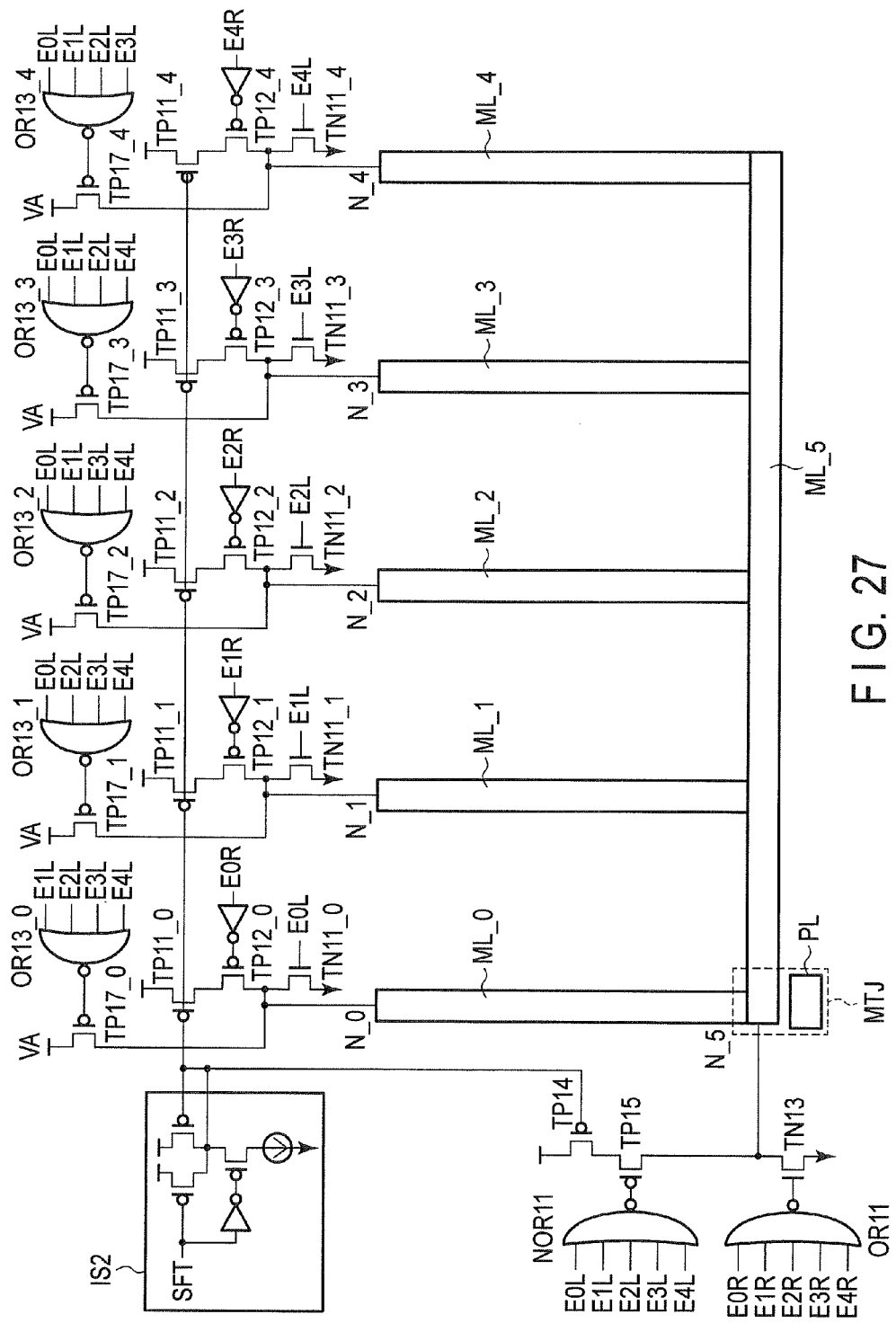
F I G. 27

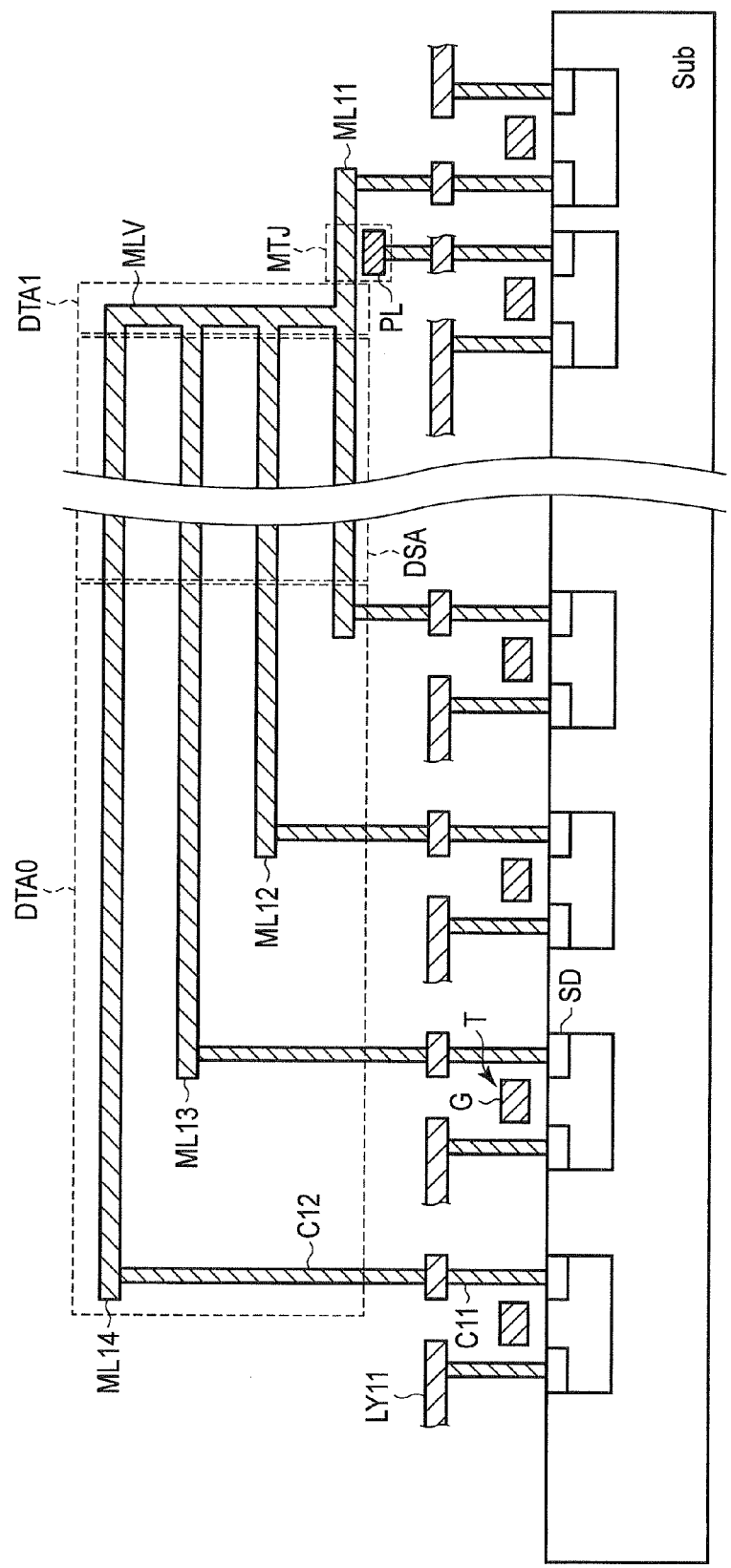
F I G. 28

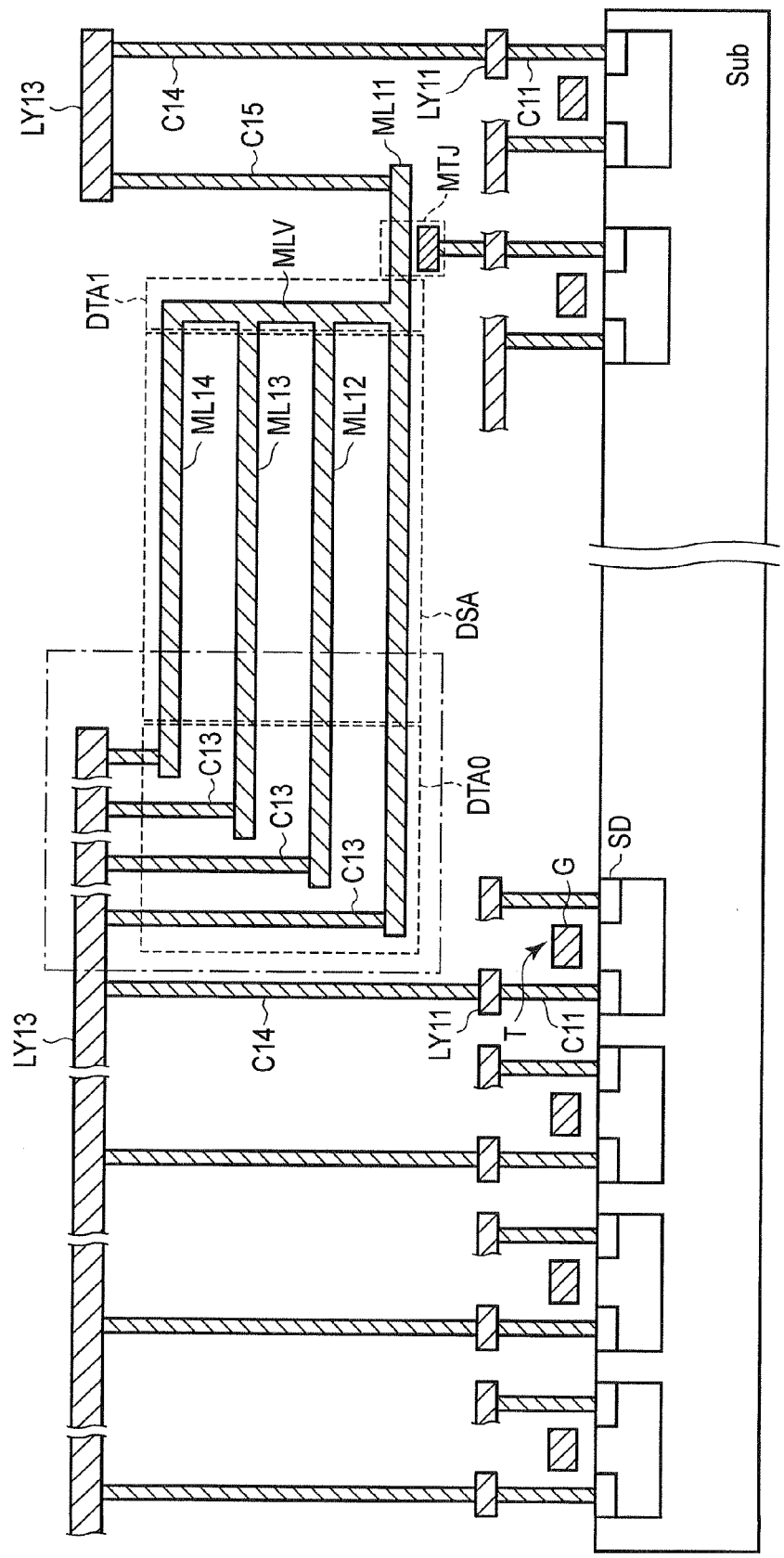
F I G. 29

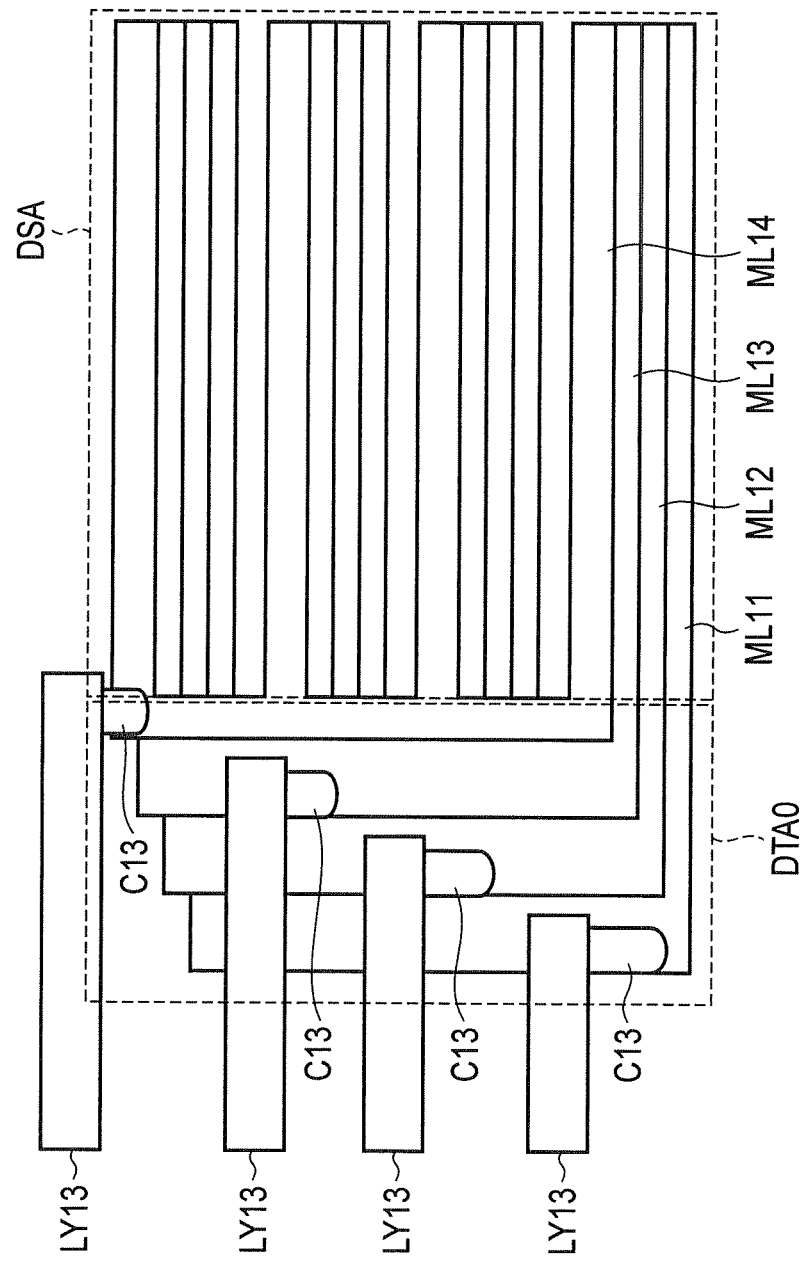
F I G. 30

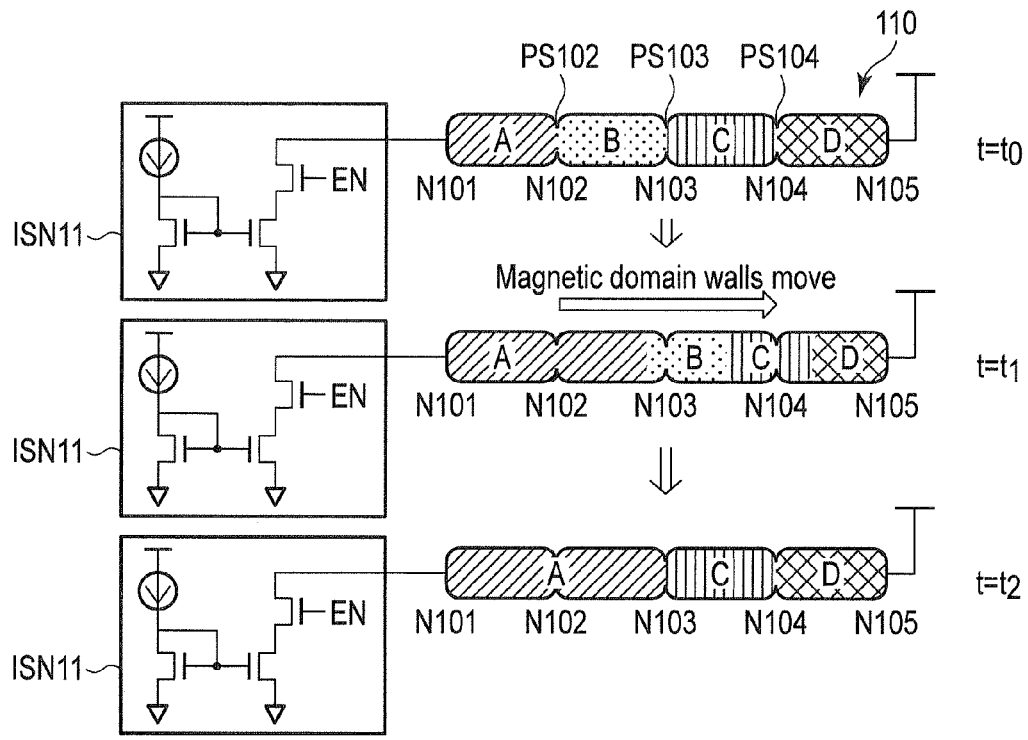
F I G. 33
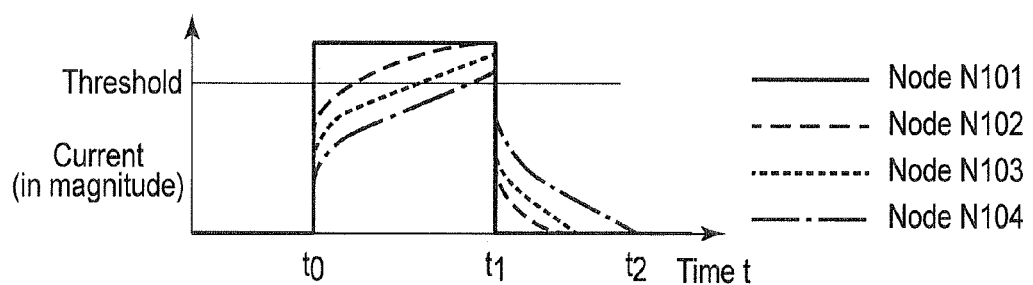
F I G. 34

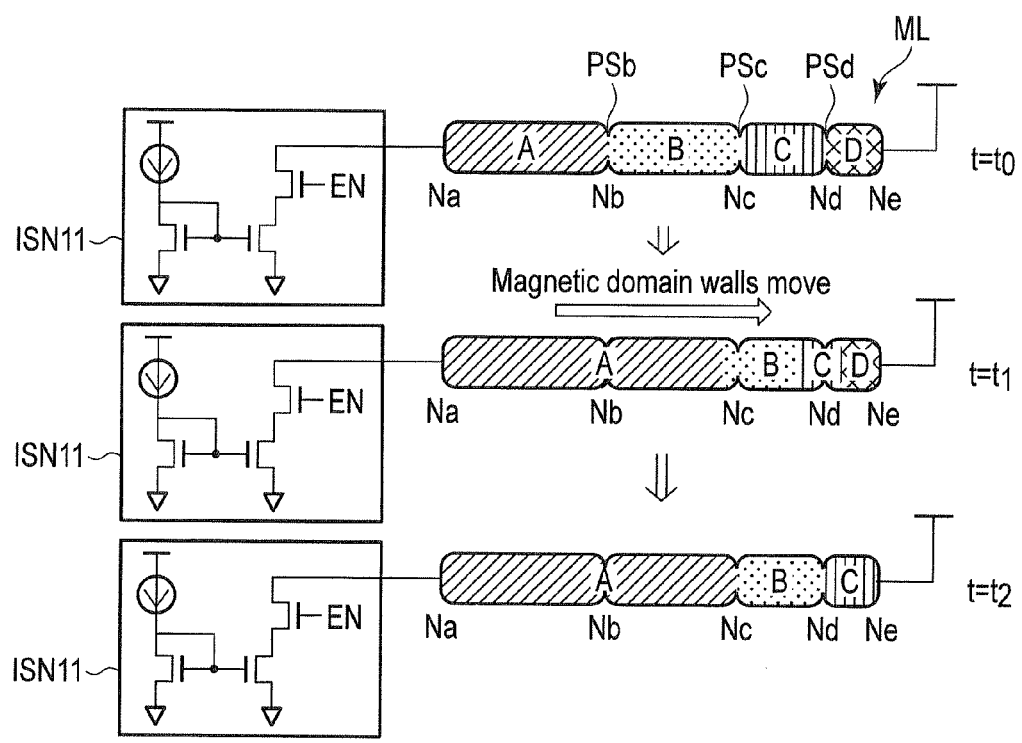
F I G. 35

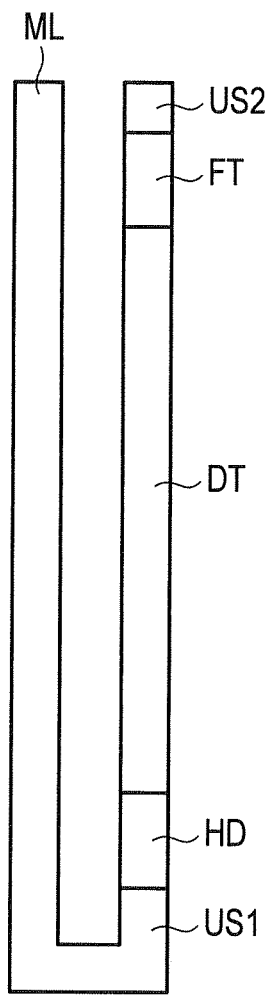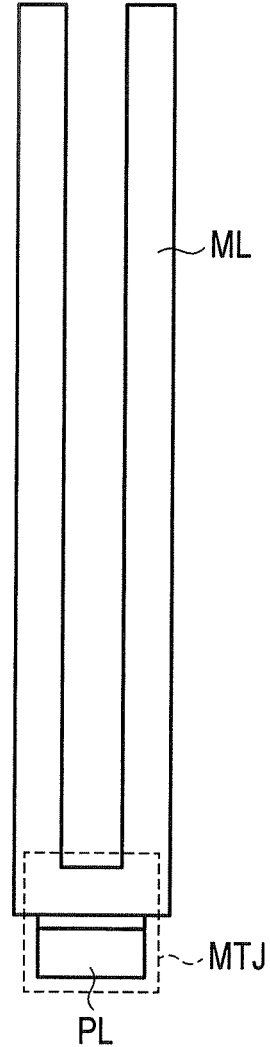
F I G. 38    F I G. 39

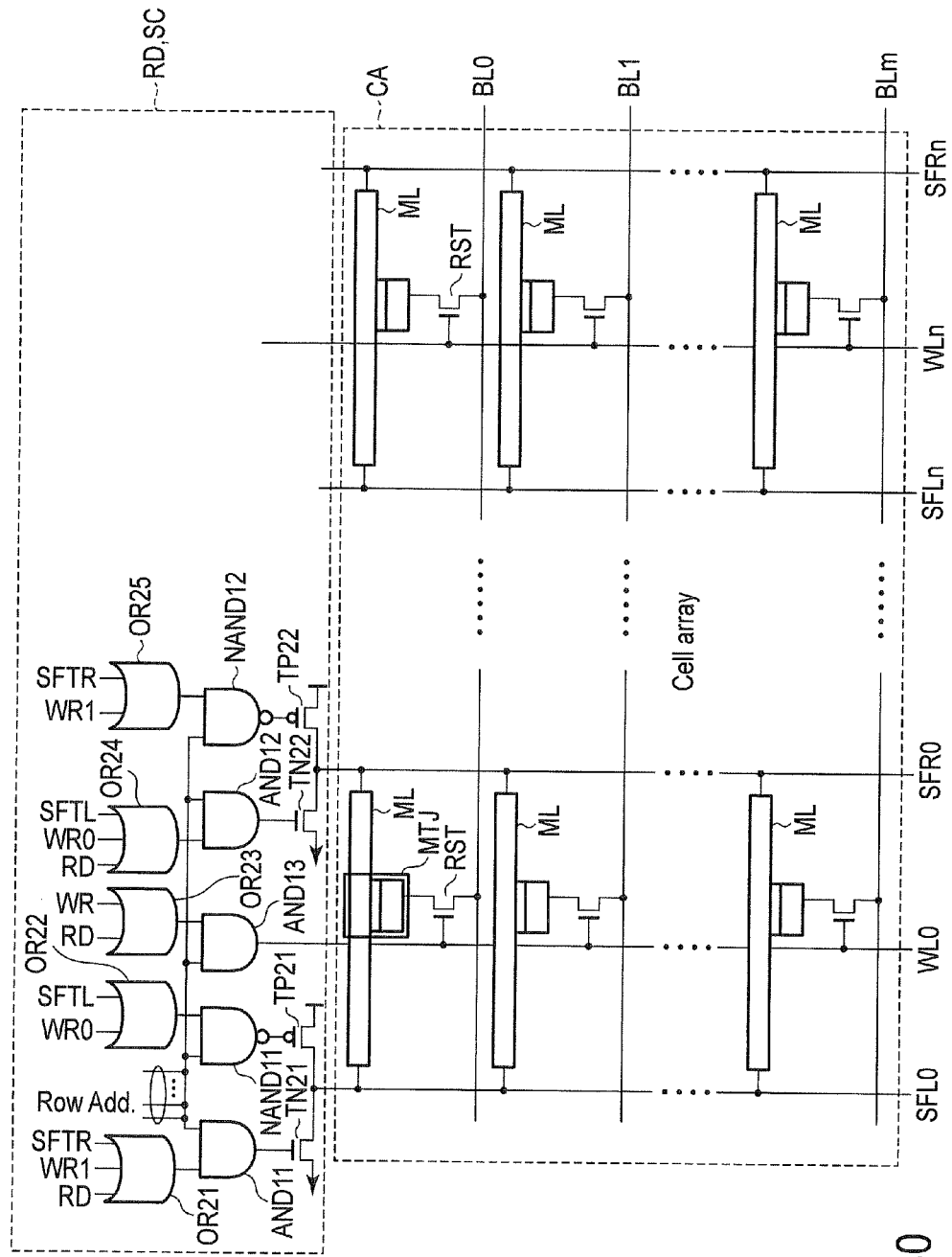
F I G. 40

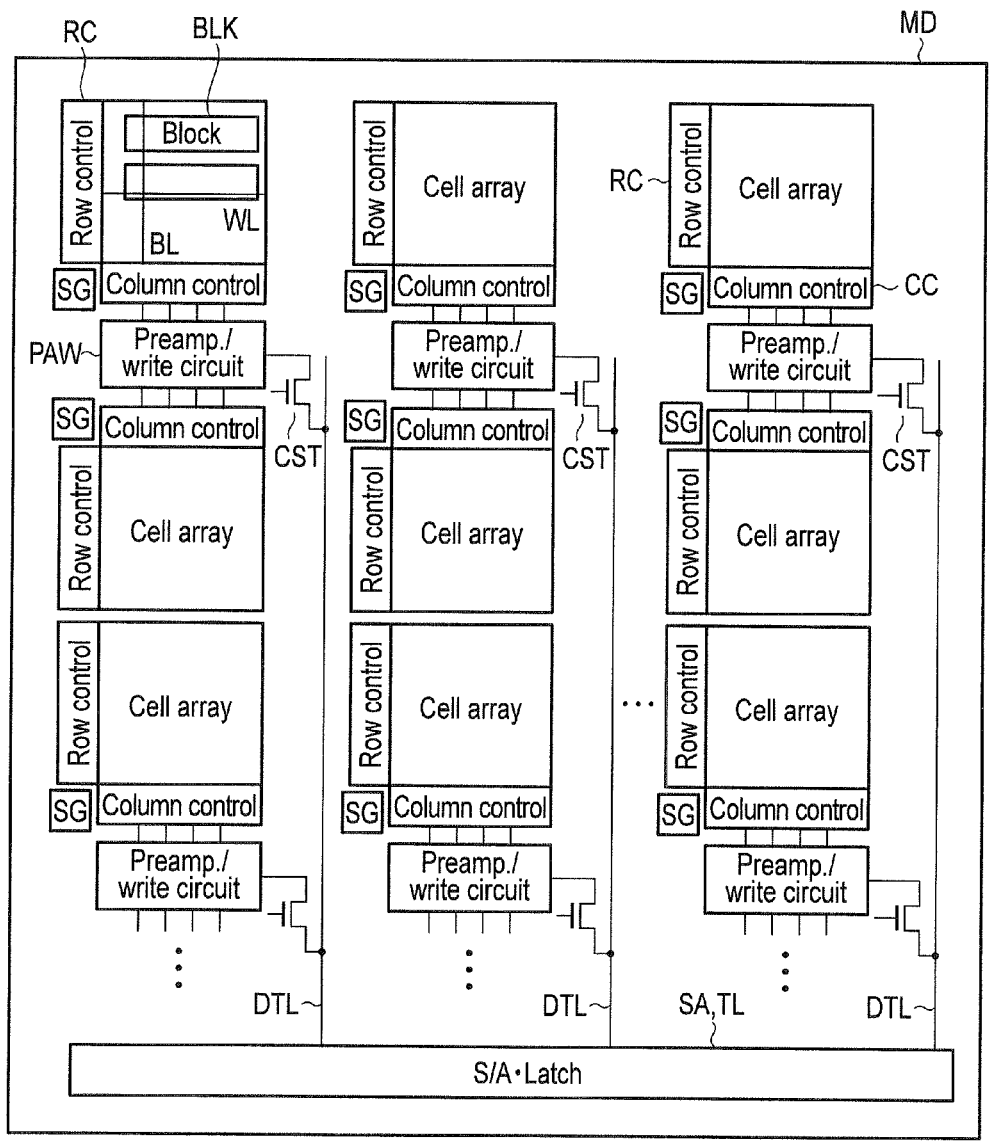
F I G. 44

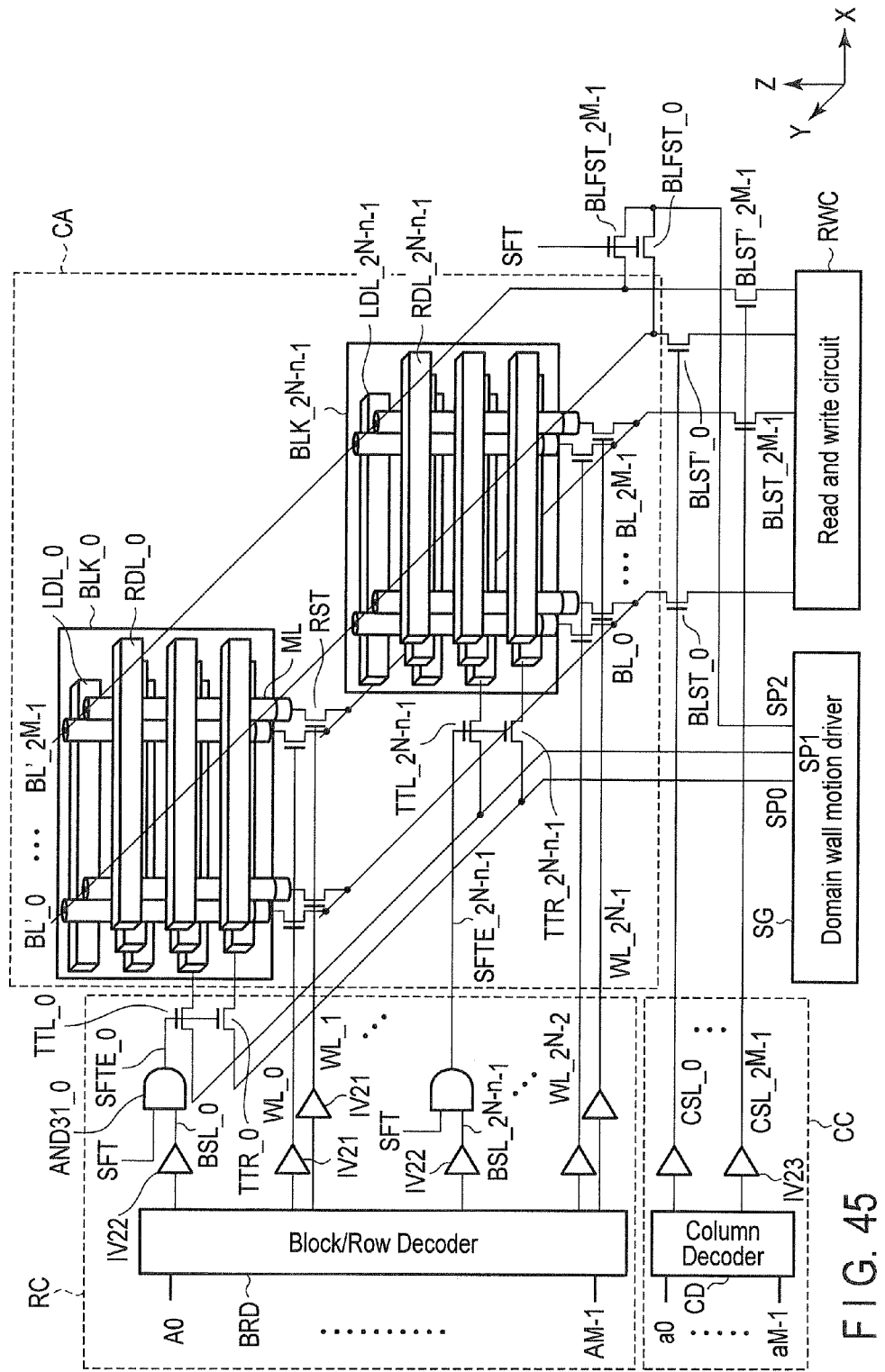
F I G. 45

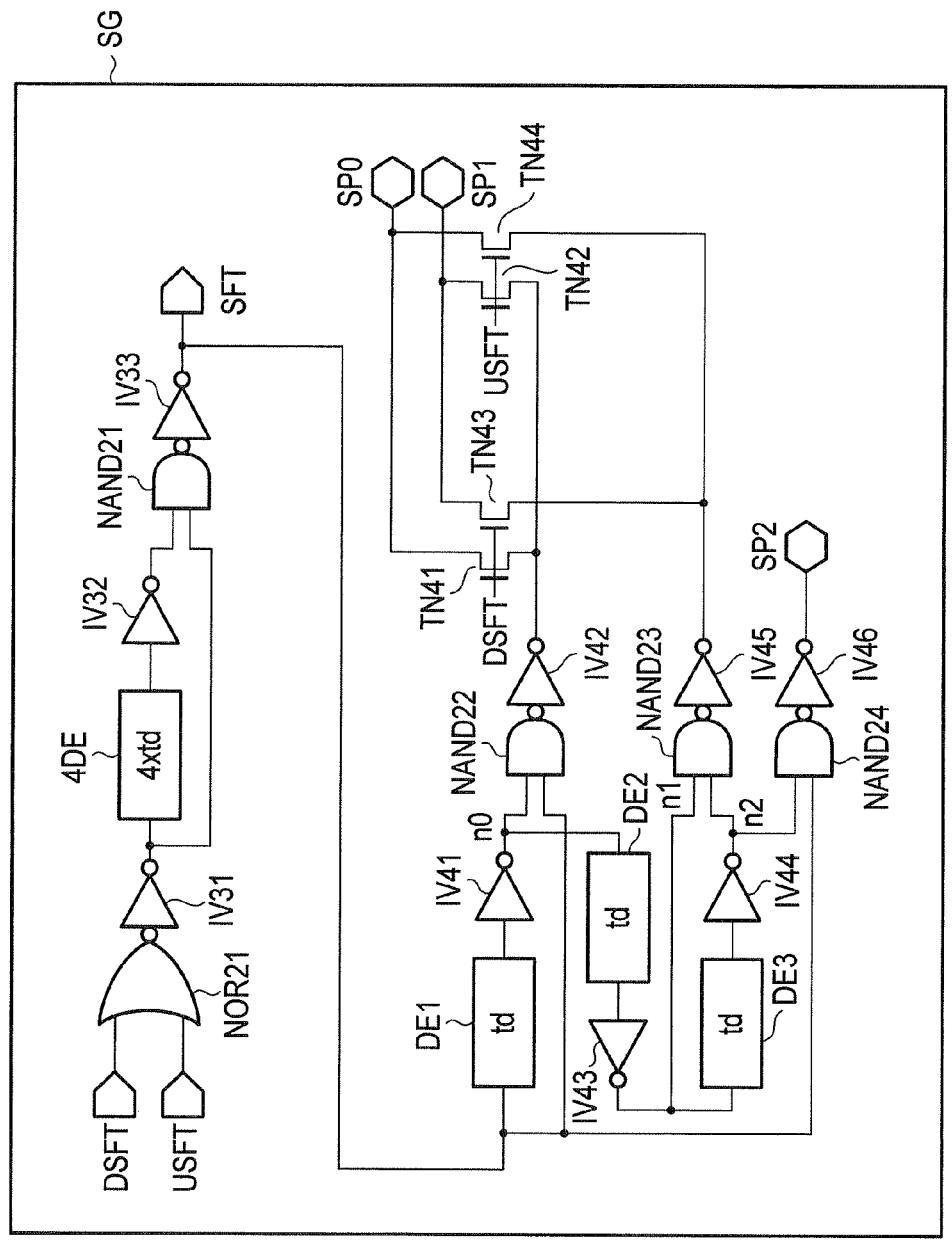
F I G. 49

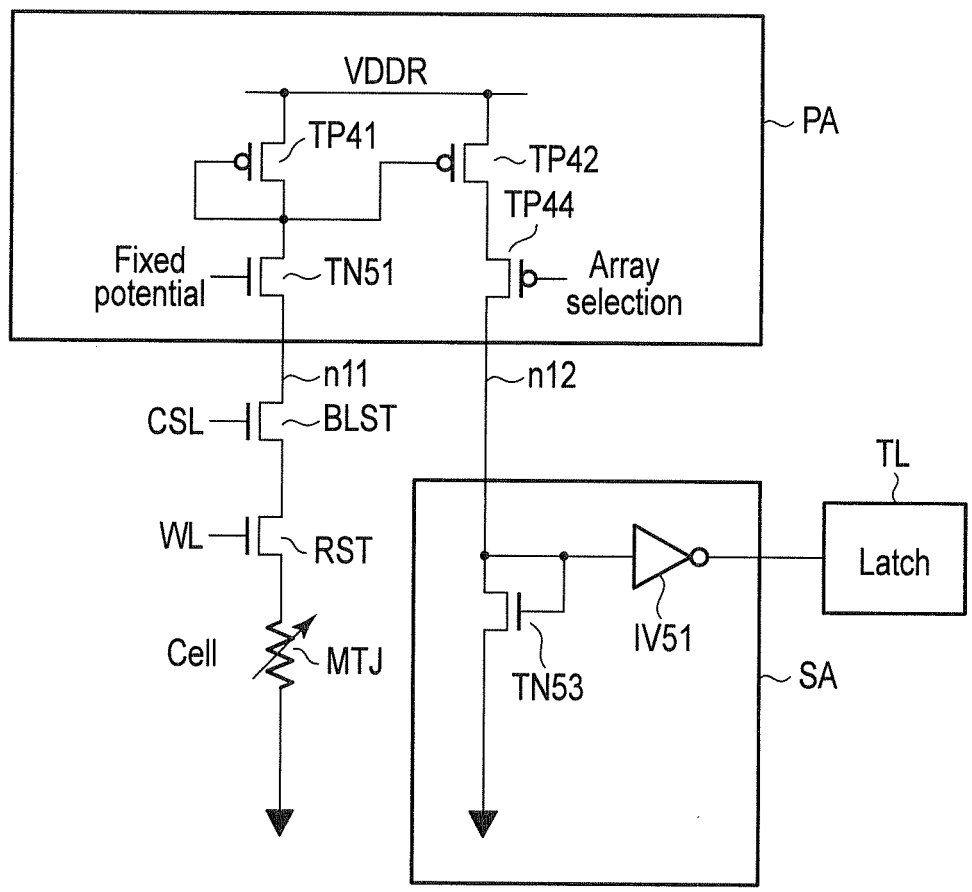
F I G. 54

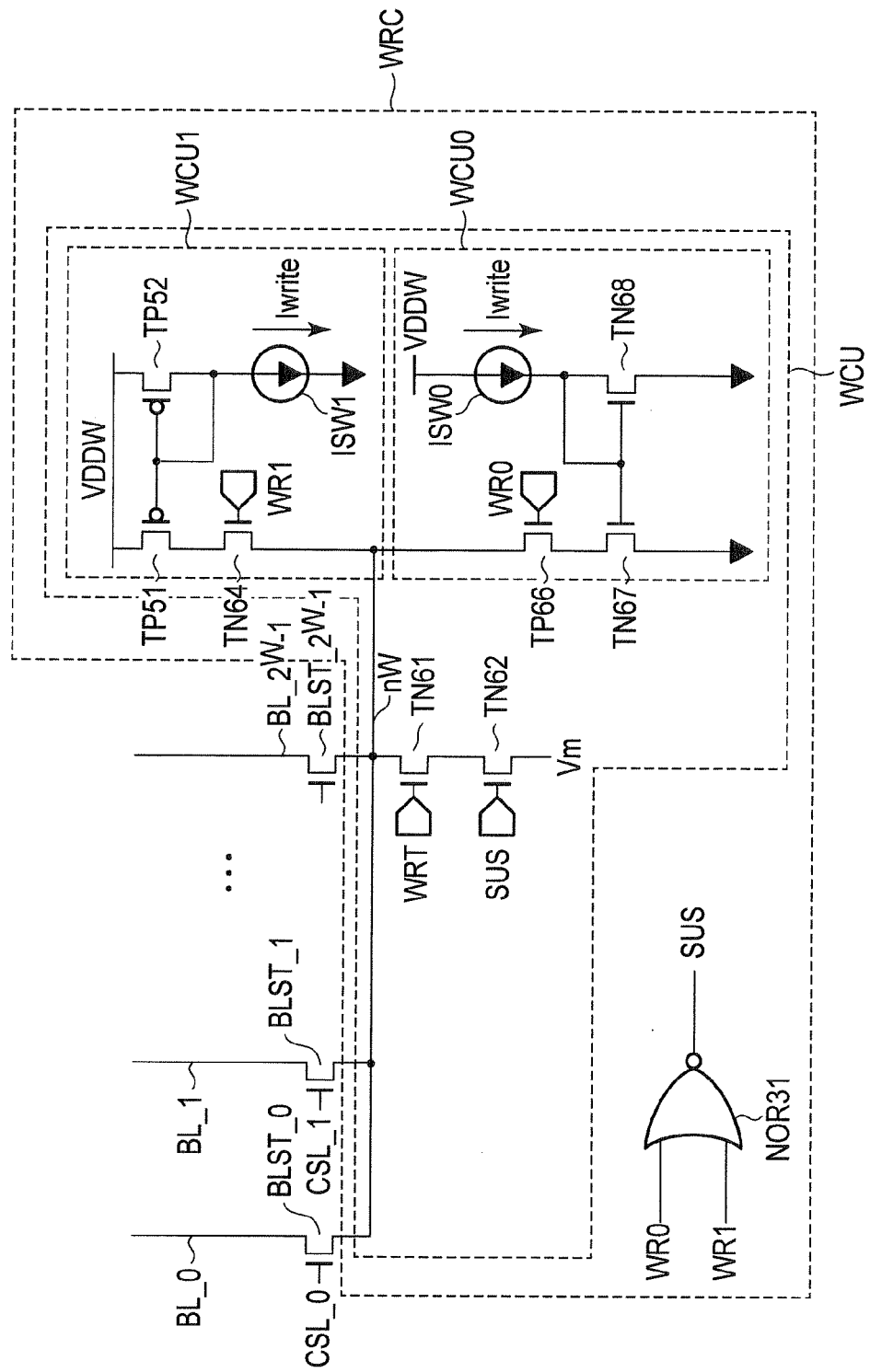
F I G. 56

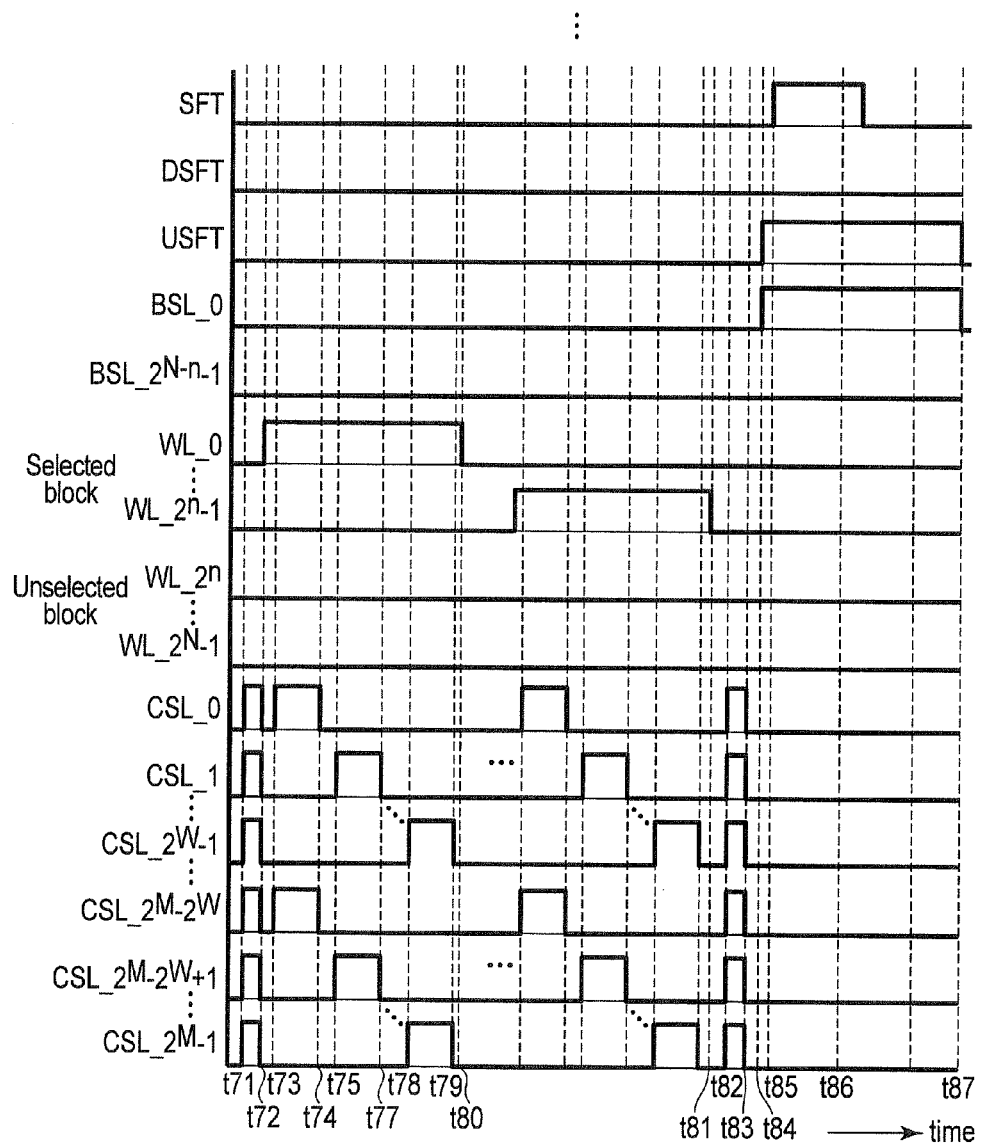
F I G. 57B

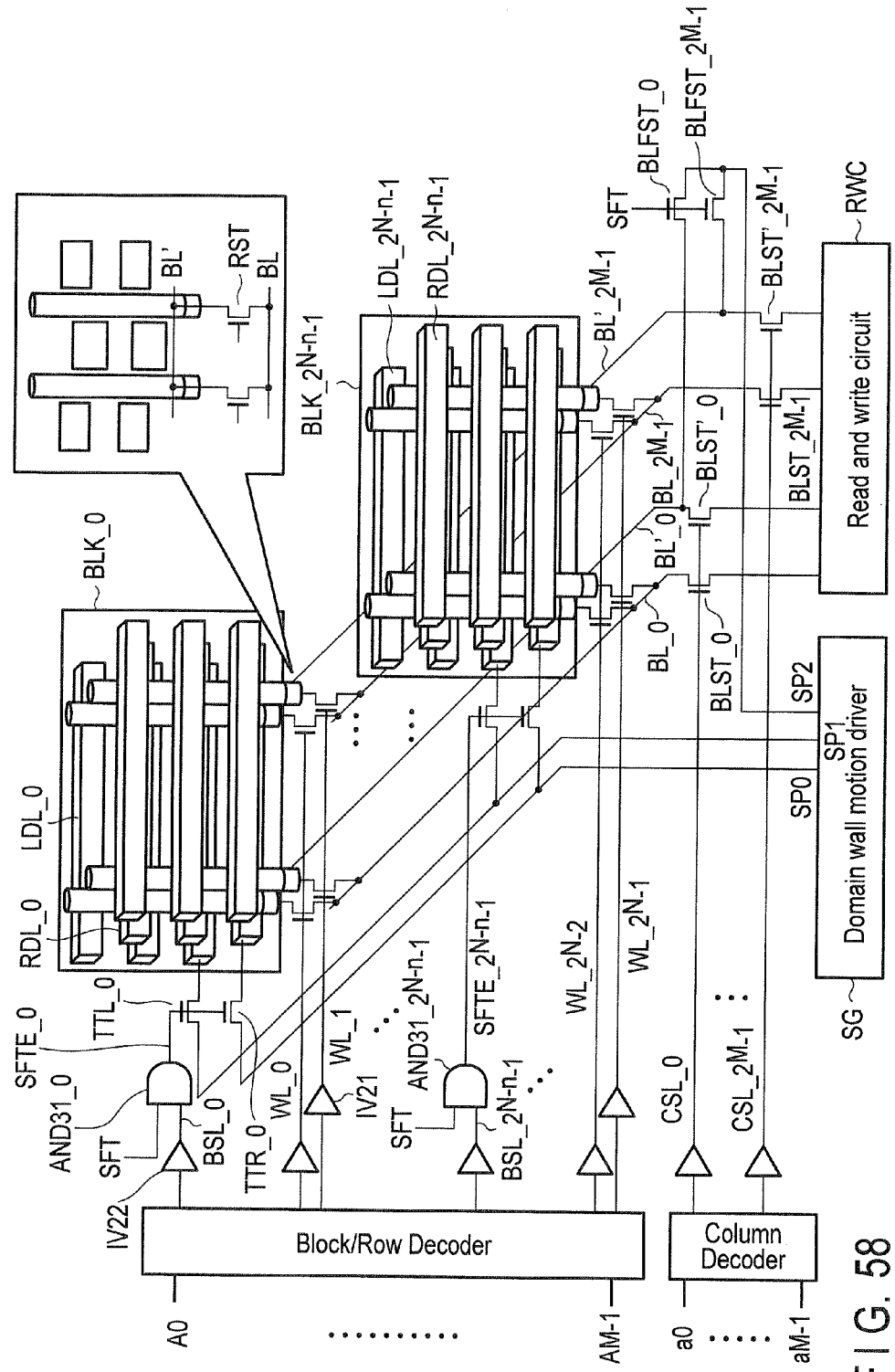
F I G. 58

MAGNETIC MEMORY DEVICE UTILIZING MAGNETIC DOMAIN WALL MOTION

CROSS-REFERENCE TO RELATED APPLICATIONS

This application claims the benefit of U.S. Provisional Application No. 61/875,461, filed Sep. 9, 2013, the entire contents of which are incorporated herein by reference.

FIELD

Embodiments relates to a magnetic memory device utilizing magnetic domain wall motion.

BACKGROUND

Memory devices using magnetic thin wires with multiple magnetic domains along the directions in which the lines extend are known.

BRIEF DESCRIPTION OF THE DRAWINGS

FIGS. 6A and 6B illustrate a fourth example of voltage application for moving magnetic domain walls according to the first embodiment;

FIG. 8 illustrates an example of logical levels of signals according to the first embodiment;

FIG. 9 illustrates a second example of logical levels of signals according to the first embodiment;

FIG. 12 illustrates a second example of a part of the magnetic memory device according to the second embodiment;

FIG. 22 illustrates a manufacturing process of the semiconductor memory device according to the third embodiment;

FIG. 23 illustrates an example of a cross-sectional view of a part of a magnetic memory device utilizing magnetic domain wall motion according to a fourth embodiment;

FIG. 26 illustrates an example of a part of a circuit of a magnetic memory device utilizing magnetic domain wall motion according to a fifth embodiment;

FIG. 27 illustrates a second example of a part of a circuit of the magnetic memory device according to the fifth embodiment;

FIG. 28 illustrates an example of a cross-sectional view of a part of a magnetic memory device utilizing magnetic domain wall motion according to a sixth embodiment;

FIG. 29 illustrates a second example of a cross-sectional view of a part of the magnetic memory device according to a sixth embodiment;

FIG. 30 is illustrates a perspective view of the magnetic memory device according to the sixth embodiment;

FIG. 33 illustrates a related art of a ninth embodiment;

FIG. 34 illustrates changes of currents in time in the related art of the ninth embodiment;

FIG. 35 illustrates a structure of a magnetic thin wire according to the ninth embodiment;

FIG. 38 illustrates types of areas in the magnetic thin wire according to the tenth embodiment;

FIG. 39 illustrates the magnetic thin wire and MTJ structure according to the tenth embodiment;

FIG. 40 illustrates an example of a part of a circuit of the magnetic memory device according to the tenth embodiment;

FIG. 44 illustrates functional blocks and their layout of a magnetic memory device utilizing magnetic domain wall motion according to an eleventh embodiment;

FIG. 45 illustrates a part of a cell array and related components and connections according to the eleventh embodiment;

FIG. 49 illustrates a part of a magnetic domain wall motion driver of the eleventh embodiment;

FIG. 54 illustrates an example of a part of a circuit of the magnetic memory device according to the eleventh embodiment;

FIG. 56 illustrates an example of another part of a circuit of the magnetic memory device according to the eleventh embodiment;

FIGS. 57A and 57B illustrate a timing chart for some signals during a write of the magnetic memory device according to the eleventh embodiment;

FIG. 58 illustrates a part of a cell array and related components and connections according to a twelfth embodiment.

DETAILED DESCRIPTION

According to one embodiment, a magnetic memory device comprises a magnetic thin wire comprising magnetic domains along a direction in which the magnetic thin wire extends. Magnetization directions of the magnetic domains are variable. A magnetic tunnel junction (MTJ) structure comprises a pinned layer with a fixed magnetization direction and an insulator, and make a MTJ comprising the pinned layer, the insulator and a magnetic domain in the magnetic thin wire in a first position to sandwich the insulator with the pinned layer. First and second electrodes are at both ends of the magnetic thin wire. At least one third electrode is coupled to the magnetic thin wire between the first and second electrodes.

Embodiments will now be described with reference to the figures. The embodiments are not exclusive to each other and can be combined unless they are obviously exclusive to each other. Therefore, description for a particular embodiment is applicable to another embodiment.

Components with substantially the same functionalities and configurations will be referred to with the same reference number and duplicate descriptions will be made only when required. The embodiments only used to illustrate devices and methods to implement the technical idea thereof, and the technical idea does not limit materials, dimensions, structures, and arrangements of components to the following ones. The figures are merely schematic, and in order to illustrate a particular feature clearly, the feature may be different in scale among figures.

Relative dimensions of components illustrated in a particular figure may be different from actual ones in order to, for example, emphasize the feature.

First Embodiment

Figure 1:
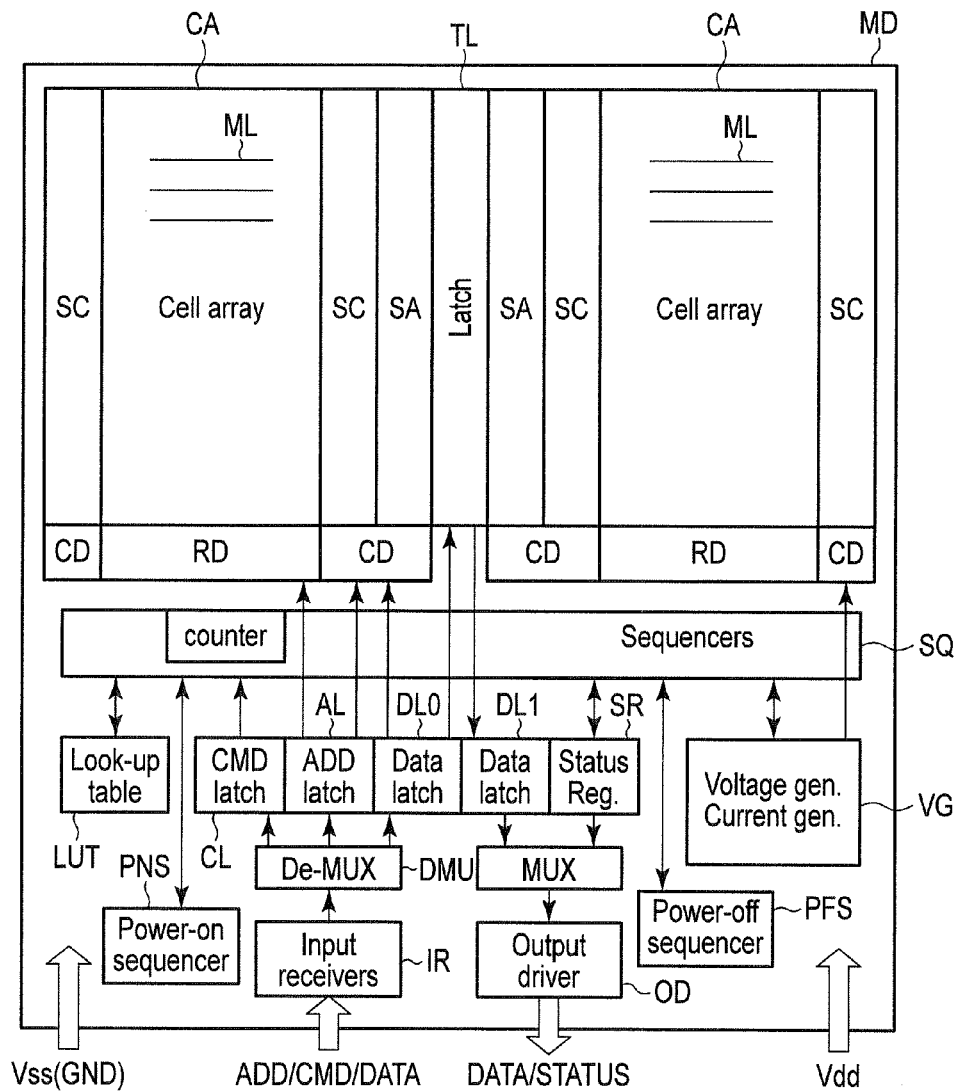
FIG. 1 illustrates example functional blocks of a magnetic memory device utilizing magnetic domain wall motion according to a first embodiment.

FIG. 1 illustrates an example of functional blocks of a magnetic memory device utilizing magnetic domain wall motion according to the first embodiment. A magnetic memory device utilizing magnetic domain wall motion MD includes cell arrays CA. The cell arrays CA include thin lines ML made of ferromagnetic material. The magnetic thin wires ML are arranged in a cell array CA in matrix. A magnetic thin wire ML has magnetic domains, each of which is between magnetic domain walls, along the direction in which the magnetic thin wire extends, and the magnetic moments in each magnetic domain are aligned. In other words, a magnetic domain is magnetized in a particular direction. Each magnetic domain stores one-bit data associated with its magnetization direction. The magnetic memory device MD is configured to write and read data in and from one or more selected magnetic domains. To this end, it includes a mechanism to write data in a particular magnetic domain, and a mechanism to read data from a particular magnetic domain, for example. A mechanism for read and/or write is implemented by a magnetic tunnel junction (MTJ) structure which includes a magnetic thin wire as its storage layer, for example. A single magnetic thin wire ML may be provided with an MTJ structure for reads and another MTJ structure for writes, or a single MTJ structure may serve for both reads and writes. An MTJ structure includes a storage layer with variable magnetization direction, a fixed layer with a fixed magnetization direction, and a tunnel insulator between the storage and fixed layers, as known by a person skilled in the art. The MTJ structure exhibits high or low resistance in accordance with the magnetization direction of the storage layer.

A selected magnetic thin wire ML has its magnetic domain walls moved to a particular direction to have a write or read (or, access) target magnetic domain moved to a position of the write mechanism (or, write position) or a position of a read mechanism (or, read position). For moving the magnetic domain walls, current source/sinks to conduct current are coupled at the both ends of a magnetic thin wire ML, for example. For example, current source/sinks SC are provided in the both sides of a cell array CA, and current source/sinks SC at the both sides of a particular cell array CA make a pair. Each pair of current source/sinks SC cooperates to conduct current through a particular magnetic thin wire ML in a selected one of two directions along the thin line. This current moves the magnetic domain walls and hence the magnetic domains of the magnetic thin wire ML. Alternatively, the magnetic domain walls are moved by an electric field from interconnects around the magnetic thin wires. The motion of the magnetic domains can be performed by any mechanism.

A row decoder (or, word line controller) RD selects a row in accordance with a received address (or, row address) signal. Specifically, it electrically couples specified magnetic thin wires ML to a related component. A column decoder (or, bit line controller) CD selects a column in accordance with a received address (or, column address) signal. Specifically, it electrically couples selected magnetic thin wires ML to a related a component. Each sense amplifier SA senses data from a corresponding cell array CA. A latch TL temporarily stores data to and from the magnetic thin wires ML.

A sequencer SQ manages operation of the whole magnetic memory device MD in accordance with a lookup table LUT, a command latch CL, and an address latch AL. The lookup table LUT stores information including various types of parameters. The command latch CL, address latch AL, and data latch DL0 respectively receive command CMD, address signal ADD, and data DAT from outside the magnetic memory device MD through an input receiver IR and a demultiplexer DMU. The data latch DL0 supplies received data to the column decoders CD and the latch TL. The input receiver IR controls the input of signals. A data latch DL1 receives data from the latch TL. The data latch TL and a status register SR output data DATA and status information STATUS outside the magnetic memory device MD through a multiplexer MUX and an output driver OD, respectively. A power-on sequencer PNS and a power-off sequencer PFS control power on and off of the sequencer SQ, respectively.

The magnetic memory device MD receives power potential Vdd and a common (or, ground) potential Vss (GND) from the outside. A voltage and current generator VG generates various voltages and currents for operation of the magnetic memory device MD in accordance with the power received from the outside and control by the sequencer SQ.

In order to move the magnetic domain walls by current, a voltage is applied to the both ends of a particular magnetic thin wire. The applied voltage V for moving is $V=I\times a\times \rho \times l/a = i\times \rho \times l$, where $\rho$, l, a, and i are the resistivity, length, cross sectional area of a magnetic thin wire, and the current density required for moving the magnetic domain walls. That is, the longer the magnetic thin wire, the larger the required current for moving the magnetic domains and hence the required voltage. The length of the magnetic thin wire is proportional to the number of magnetic domains, or the storage capacity of the magnetic thin wire. Therefore, increasing the storage capacity of the magnetic thin wire requires a larger voltage to be applied to the magnetic thin wire for moving the magnetic domain walls.

Figure 2:
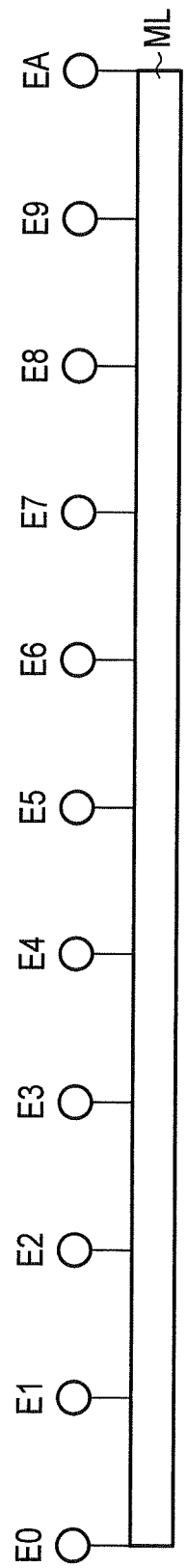
FIG. 2 illustrates a part of the magnetic memory device according to the first embodiment.

FIG. 2 illustrates a part of the magnetic memory device according to the first embodiment. Specifically, FIG. 2 illustrates a part of a single cell array CA, and more specifically a single magnetic thin wire and components associated with the magnetic domain wall motion in this magnetic thin wire. As shown in FIG. 2, multiple (eleven being illustrated) electrodes E0 to EA are coupled to a magnetic thin wire ML. The electrodes E0 to EA are in a line in this order along the direction in which the magnetic thin wire ML extends. The electrodes E0 to EA are located at equal intervals, for example. Suitably applying voltages to the electrodes E0 to EA can move one or more magnetic domains in the magnetic thin wire ML. The electrodes E0 to EA are coupled to the current source/sinks SC such as those of FIG. 1. Alternatively, current source/sinks for at least some of the electrodes E0 to EA may be provided in the cell array CA.

Figure 3A:
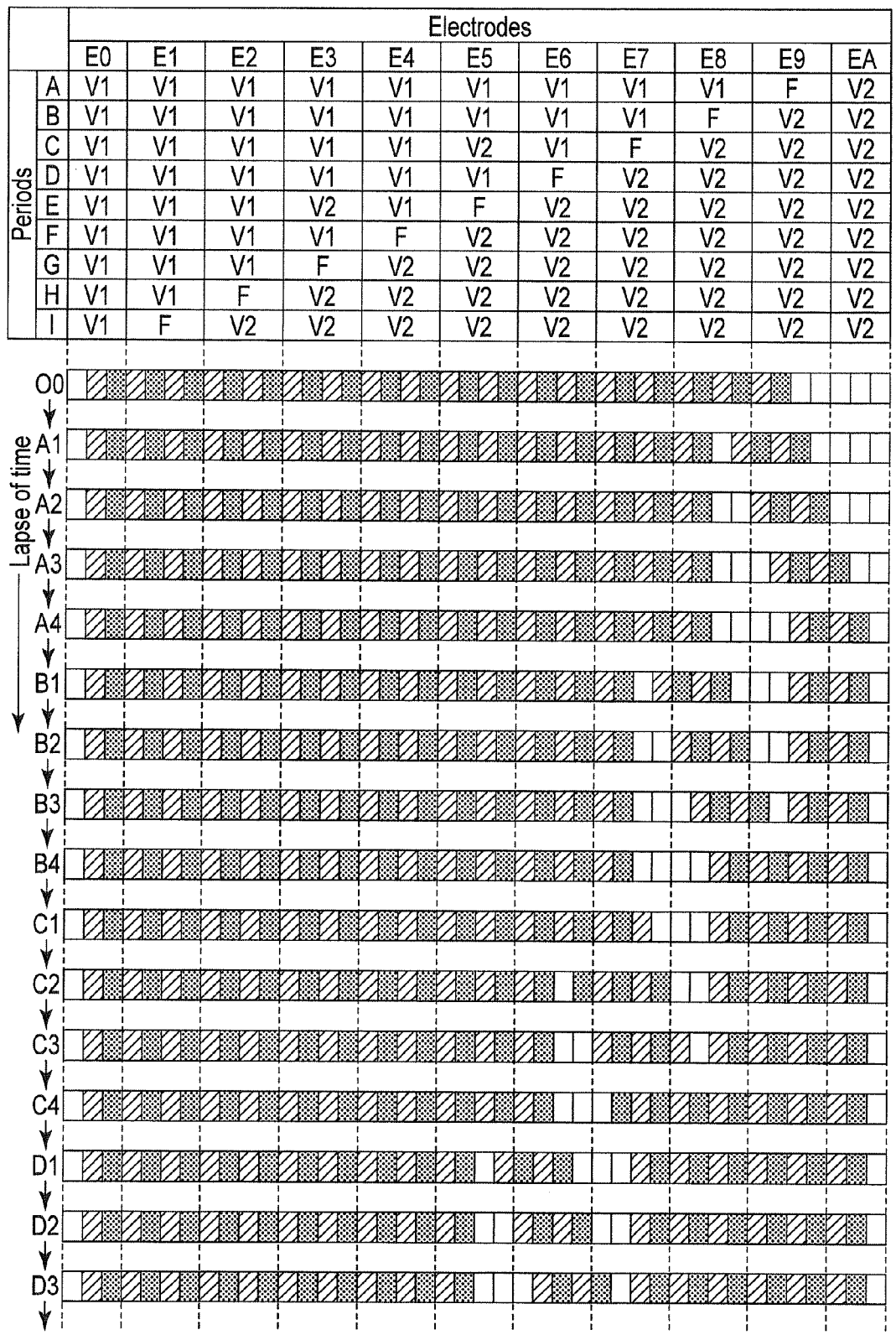
FIGS. 3A and 3B illustrate a first example of voltage application for moving magnetic domain walls according to the first embodiment.
Figure 3B:
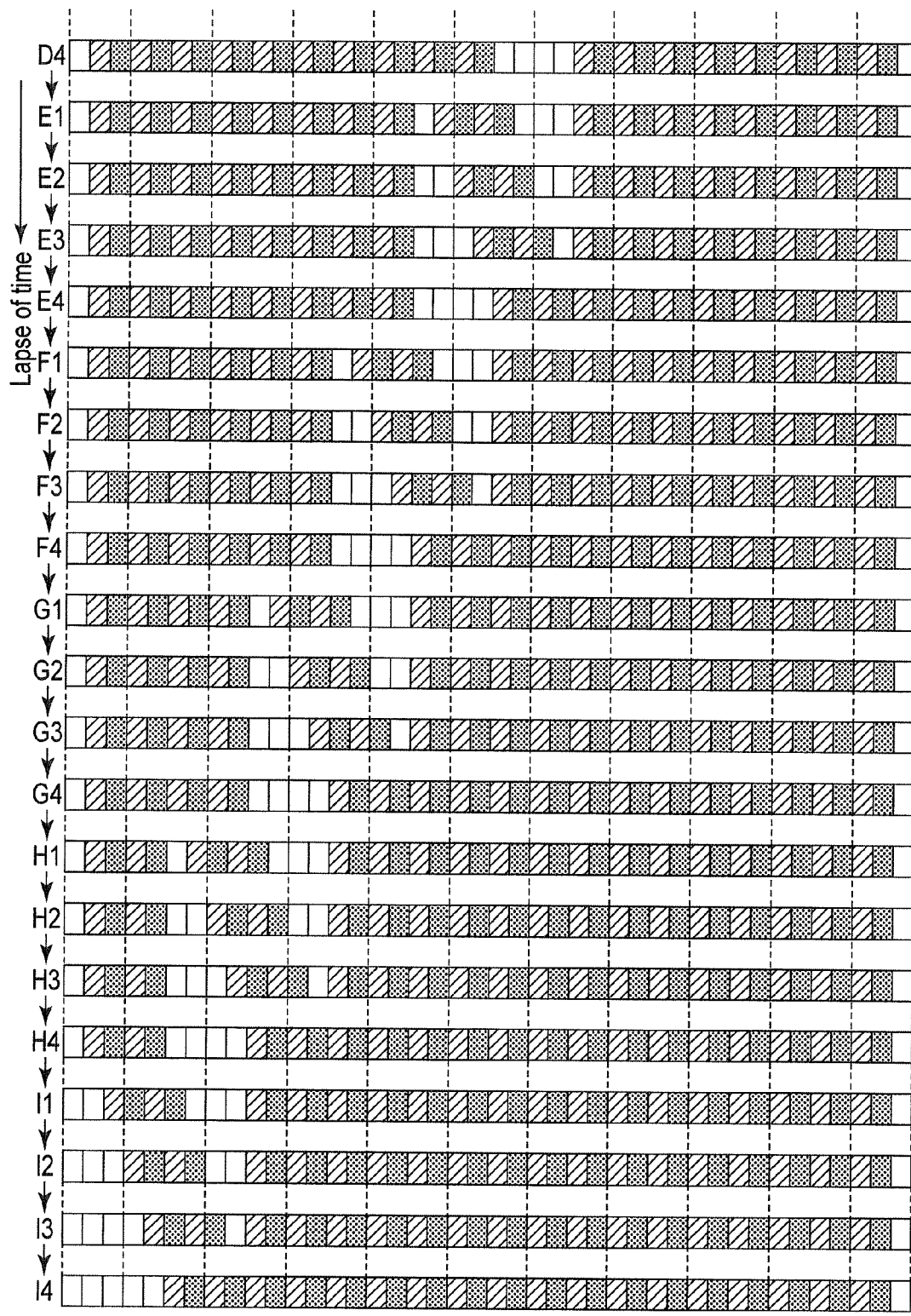

FIGS. 3A and 3B sequentially illustrate an example of voltage application for moving the magnetic domain walls according to the first embodiment, and illustrate an example of voltage application to electrodes sequentially in time. Each square in FIGS. 3A and 3B indicates a magnetic domain. Magnetic domains with shade of any of the two types stores valid data, and blank magnetic domains do not store valid data. The upper part of FIG. 3A illustrates voltages applied to the electrodes E (E0 to EA) during each of periods A to I. The lower part of FIG. 3A and FIG. 3B illustrate states of the magnetic domains during each of periods A to I as well as their transition within each period. In order to move magnetic domain walls rightward in FIGS. 3A and 3B by current, a current is made to flow leftward in the magnetic thin wire ML. To this end, a voltage V2 is applied to the right-hand-side one of two electrodes at both ends of a section whose magnetic domain walls are to be moved, and a voltage V1 to the left-side-one. The voltage V2 is larger than the voltage V1, and has a fixed magnitude independent of the power voltage and temperature. The voltage V1 is VSS, for example, and is 0V. The Voltages V1 and V2 are supplied by current source/sinks such as the current source/sinks SC, for example.

A voltage is generated between two electrodes which sandwich another electrode. For example, during the period A, the electrode EA is set to a potential V2 (or, applied with a voltage V2), and the electrodes E0 to E8 are set to a potential V1 (or, applied with a voltage V1), and the electrode E9 between electrodes E8 and EA is made to electrically float (or, not controlled to a fixed voltage). As a result of such voltage application, all the magnetic domains between electrodes E8 and EA move rightward. The magnetic domains on the left-hand side of the electrode E8 do not move. Also, in other periods B to I, the voltage V2 is applied to the left-hand-side one of an electrode pair with another electrode interposed therebetween as well as all the electrodes at its left-hand side, the voltage V1 is applied to the right-hand-side one of the electrode pair as well as all the electrodes at its right-hand side, and the intervening electrode E is made to electrically float. In other words, a potential difference is generated only between an electrode pair which defines an area targeted for the magnetic domain wall motion, and no potential difference is generated among the remaining electrodes. This moves the magnetic domains between the electrode pair rightward.

Figure 4A:
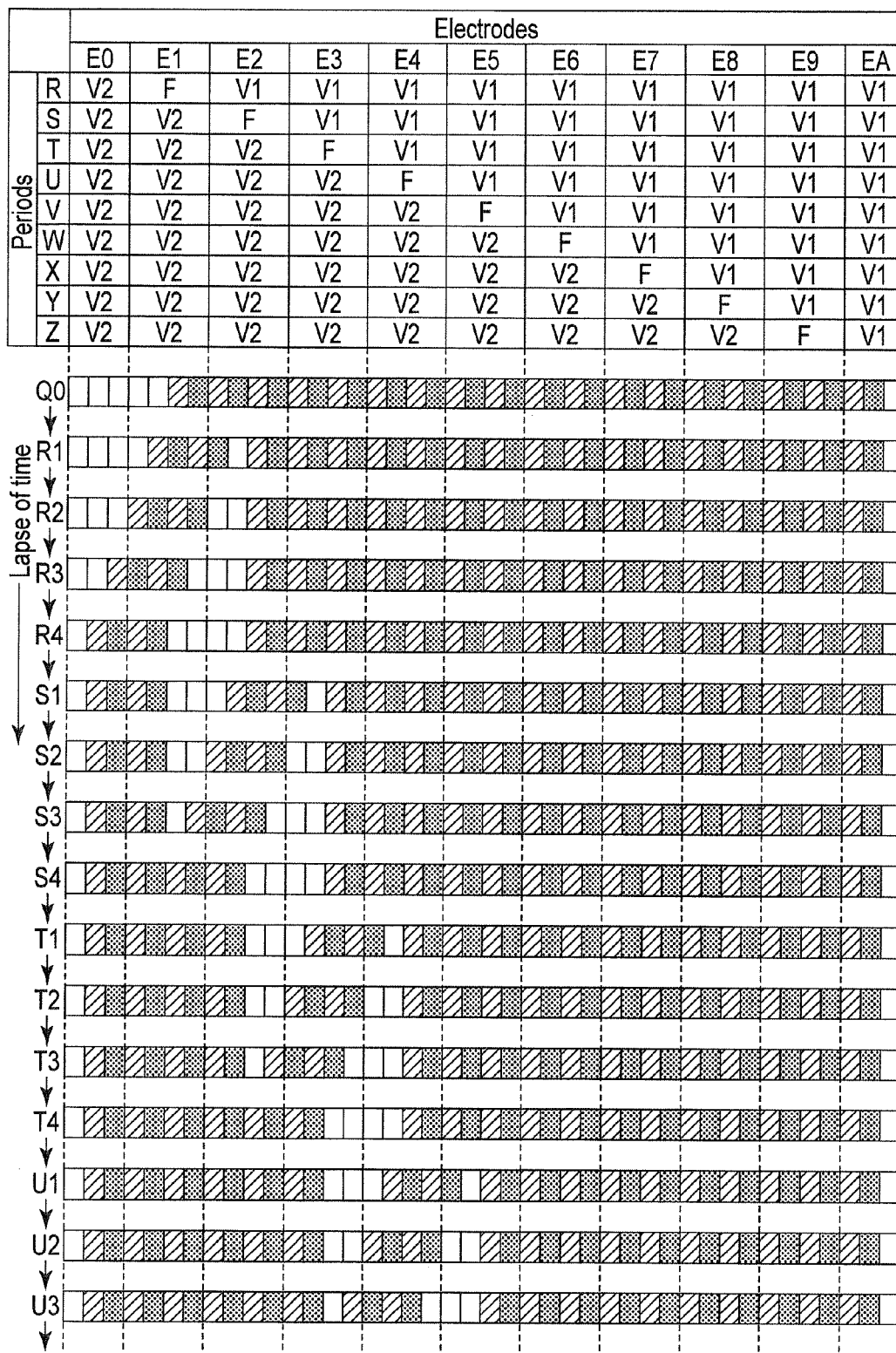
FIGS. 4A and 4B illustrate a second example of voltage application for moving magnetic domain walls according to the first embodiment.
Figure 4B:
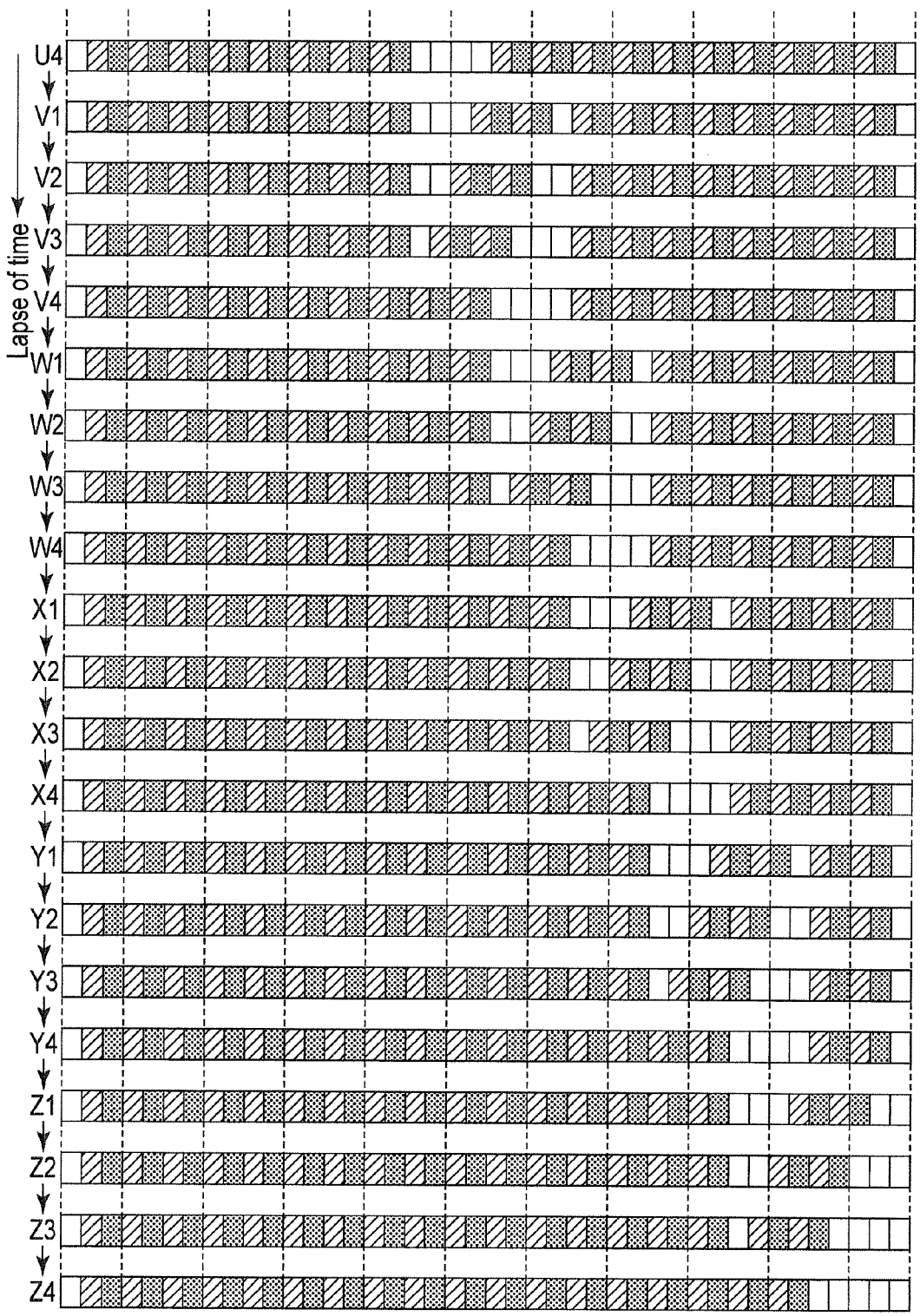

In order to move the magnetic domains leftward, a combination of voltages opposite to the voltages applied as in FIGS. 3A and 3B are applied to the electrodes as illustrated in FIGS. 4A and 4B. The upper part of FIG. 4A illustrates voltages applied to the electrodes E during each of periods R to Z. The lower part of FIG. 4A and FIG. 4B illustrate states of the magnetic domains during each of periods R to Z as well as their transition within each period.

Figure 5A:
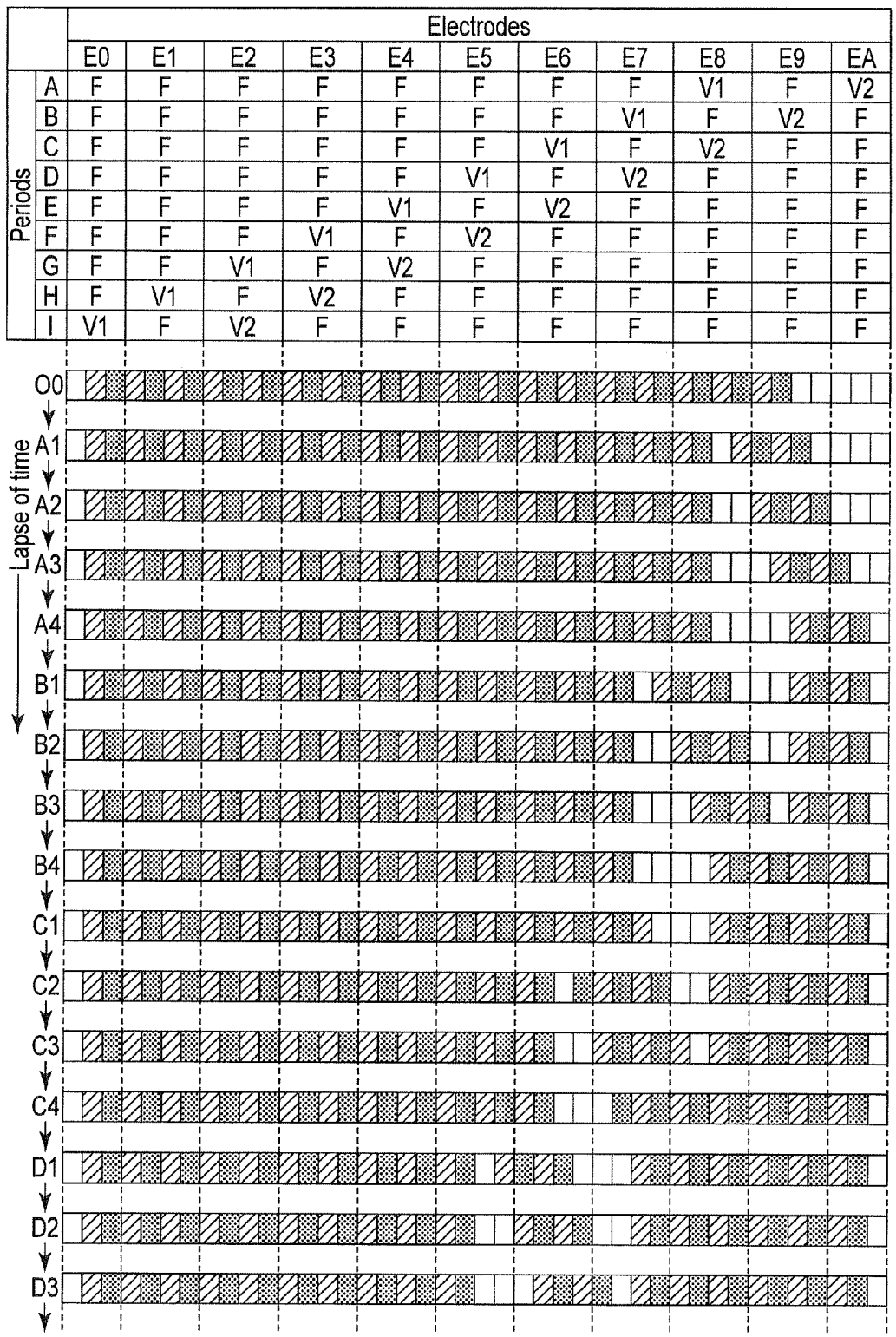
FIGS. 5A and 5B illustrate a third example of voltage application for moving magnetic domain walls according to the first embodiment.
Figure 5B:
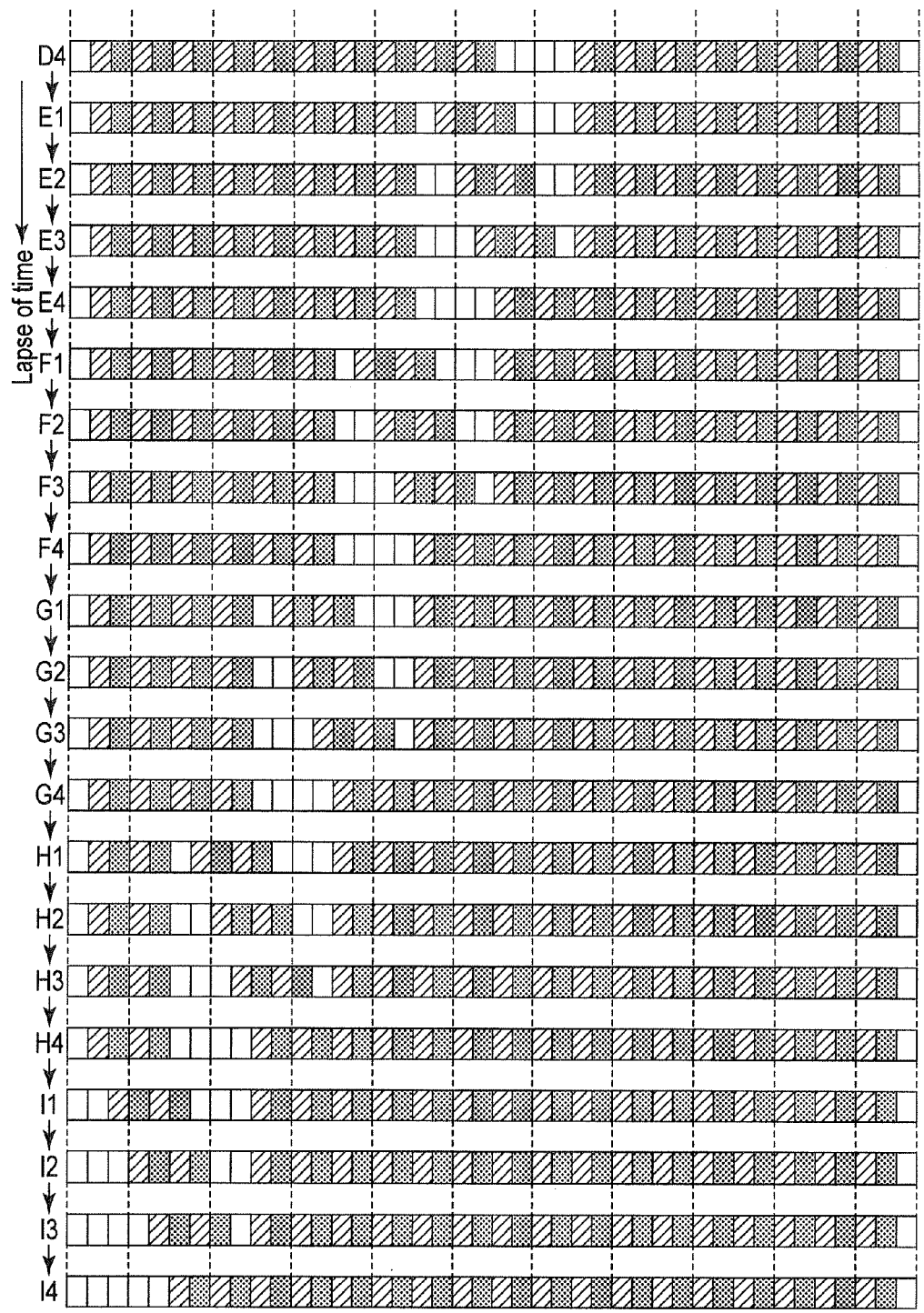
Figure 6B:
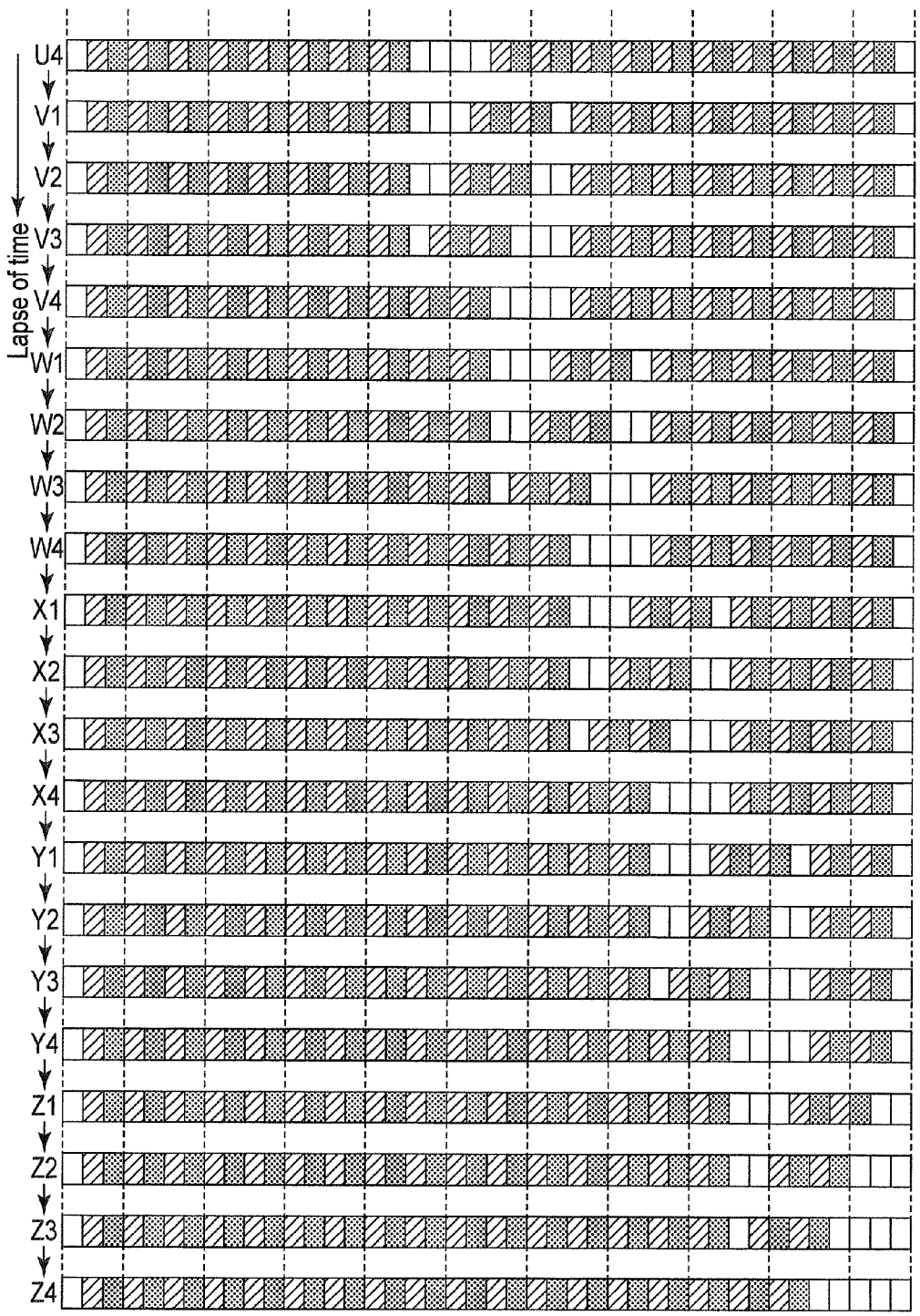

The voltages may be as shown in FIGS. 5A and 5B. FIGS. 5A and 5B illustrate a third example of voltage application for moving the magnetic domain walls according to the first embodiment. The upper part of FIG. 5A illustrates voltages applied to the electrodes E during each of periods A to I. The lower part of FIG. 5A and FIG. 5B illustrate states of the magnetic domains during each of periods A to I as well as their transition within each period. In the example of FIGS. 5A and 5B, electrodes E other than an electrode pair which defines a target area for the magnetic domain wall motion are made to electrically float, unlike FIGS. 3A and 3B. The example of FIGS. 5A and 5B is effective for a case where the magnetic thin wire ML has a small parasitic capacitance and therefore requires a small current to charge the parasitic capacitance upon application of the voltages V1 and V2, which results in no occurrence of domain wall motion in areas other than the target area for domain wall motion by the voltage application. Also, for moving in the opposite direction, the combination of voltages opposite to the voltages applied as in FIGS. 5A and 5B are applied as shown in FIGS. 6A and 6B.

Such voltage application to only a part of the magnetic thin wire ML is contrastive to applying voltages to the both ends of the magnetic thin wire ML to move all the magnetic domains therein. Furthermore, voltages are applied to only a part of the magnetic thin wire ML, and therefore the magnitude thereof is smaller than that applied to the both ends of the magnetic thin wire ML.

Figure 7:
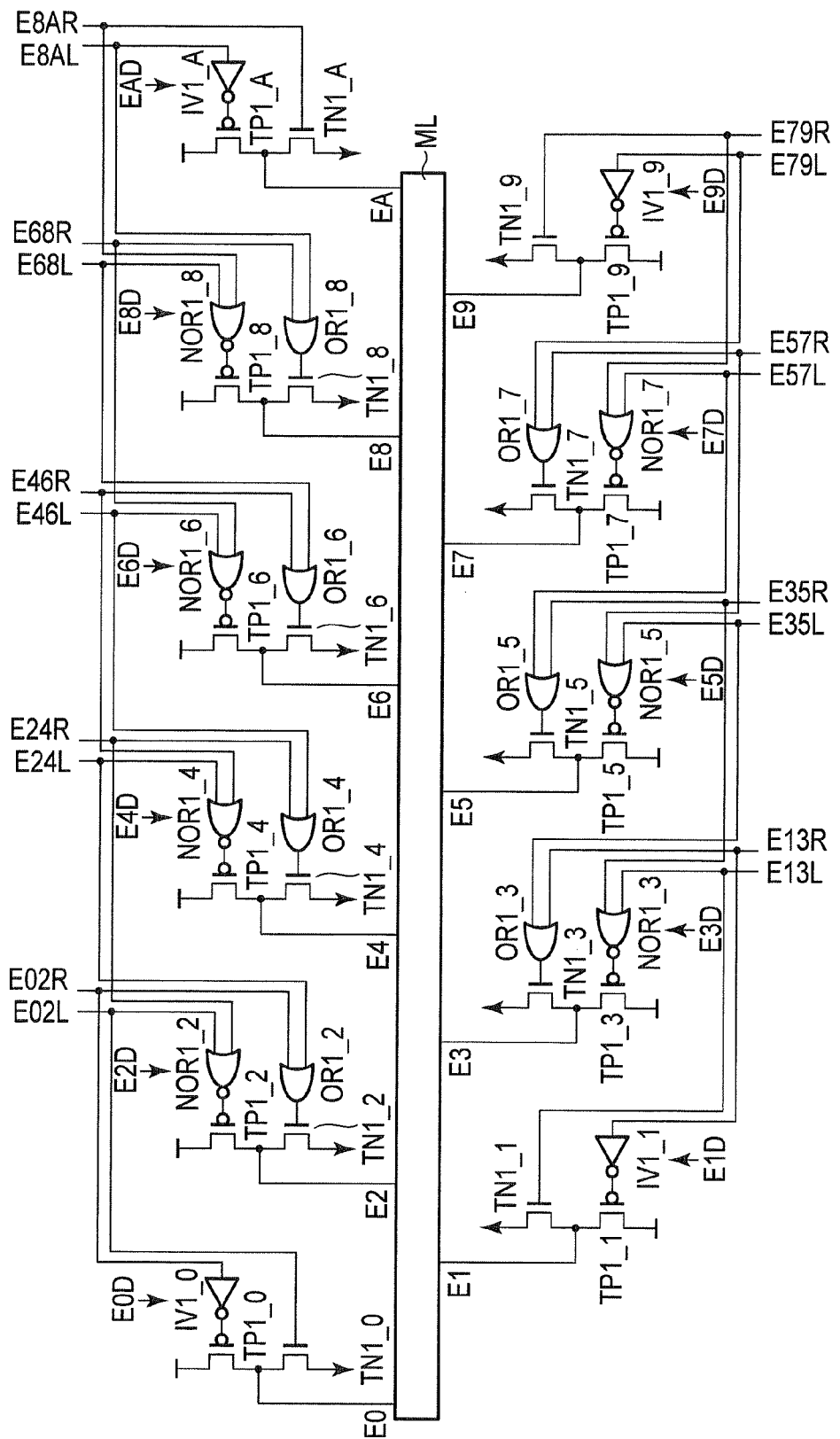
FIG. 7 illustrates an example circuit for applying voltages according to the first embodiment.

The application of voltages as in FIGS. 5A, 5B, 6A and 6B can be implemented with a circuit shown in FIG. 7, for example. FIG. 7 illustrates an example of a circuit for applying voltages according to the first embodiment, and is a part of a single cell array CA or a single current source/sink SC in FIG. 1, for example. As shown in FIG. 7, drivers E0D to EAD for the electrodes E0 to EA are provided. Each of the drivers E (E0D to EAD) includes the same components and similar connections. Specifically, each driver E includes a p-type metal oxide semiconductor field effect transistor (MOSFET) TP1, an n-type MOSFET TN1, a NOR gate NOR1, and an OR gate OR1. The character which follows the underscore at the end of each of symbols TP1, TN1, NOR1, and OR1 indicates the identification (ID), or number of the driver E to which these components belong. However, in the drivers E0D, E1D, E9D, and EAD for electrodes E0, E1, E9, and EA, the NOR gate NOR1 is replaced by an inverter IV1 (IV1_0, IV1_1, IV1_9, or IV1_A), and the OR gate OR1 (OR_0, OR_1, OR_9, or OR_A) is removed. This is because they receive fewer signals than in other drivers. Furthermore, in the drivers E0D, E1D, E9D, and EAD, an input of the NOR gate NOR1 and an input of the OR gate OR1 are fixed to the low or high level. Alternatively, the drivers E0D, E1D, E9D, and EAD may include the same components and connections as other drivers ED and have each input of the NOR gate and OR gate fixed. This can also result in the same operation as in FIG. 7.

In each of the drivers E0D to EAD, the transistor TP1 (TP1_0 to TP1_A) and TN1 (TN1_0 to TN1_A) are coupled in series between the power node and ground node. In the drivers E0D, E1D, E9D, and EAD, the transistor TP1 (TP1_0, TP1_1, TP1_9, or TP1_A) receives the output of the inverter IV1 (IV_0, IV_1, IV_9, or IV_A). In the drivers E2D to E8D, the transistors TP1 and TN1 receive the outputs of NOR gate NOR1 (NOR1_2 to NOR1_8) and OR gate OR1 (OR1_2 to OR1_8), respectively.

A signal E02L is input to the gate of the transistor TN1_0 and the NOR gate NOR1_2. A signal E02R is input to the inverter IV1_0 and OR gate OR1_2. A signal E13L is input to the gate of the transistor TN1_1 and the NOR gate NOR1_3. A signal E13R is input to the inverter IV1_4 and OR gate OR1_3. A signal E24L is input to the OR gate OR1_2 and NOR gate NOR1_4. A signal E24R is input to the NOR gate NOR1_2 and OR gate OR1_4. A signal E35L is input to the OR gate OR1_3 and NOR gate NOR1_5. A signal E35R is input to the NOR gate NOR1_3 and OR gate OR1_5. A signal E46L is input to the OR gate OR1_4 and NOR gate NOR1_6. A signal E46R is input to the NOR gate NOR1_4 and OR gate OR1_6. A signal E57L is input to the OR gate OR1_5 and NOR gate NOR1_7. A signal E57R is input to the NOR gate NOR1_5 and OR gate OR1_7. A signal E68L is input to the OR gate OR1_6 and NOR gate NOR1_8. A signal E68R is input to the NOR gate NOR1_6 and OR gate OR1_8. A signal E79L is input to the OR gate OR1_7 and inverter IV1_9. A signal E79R is input to the NOR gate NOR1_7 and the gate of the transistor TN1_9. A signal E8AL is input to the OR gate OR1_8 and the gate of the inverter IV1_A. A signal E8AR is input to the NOR gate NOR1_8 and the gate of the transistor TN1_A. The signals in FIG. 7 are supplied, for example, from the sequencer SQ.

FIGS. 8 and 9 illustrate an example of logic levels of the signals according to the first embodiment, and illustrate an example of logic levels of the signals in FIG. 7. With the logic levels illustrated in FIG. 8, the voltage-applied state in each of periods A to I of FIGS. 5A and 5B can be formed. With the logic levels illustrated in FIG. 9, the voltage-applied state in each of periods A to I of FIGS. 6A and 6B can be formed. Specifically, during periods A to I, the signals E8AL, E79L, E68L, E57L, E46L, E35L, E24L, E13L, and E02L are made high, respectively, and the remaining signals are made low. During periods R to Z, the signals E02R, E13R, E24R, E35R, E46R, E57R, E68R, E79R, and E8AR are made high, respectively, and the remaining signals are made low.

Figure 10:
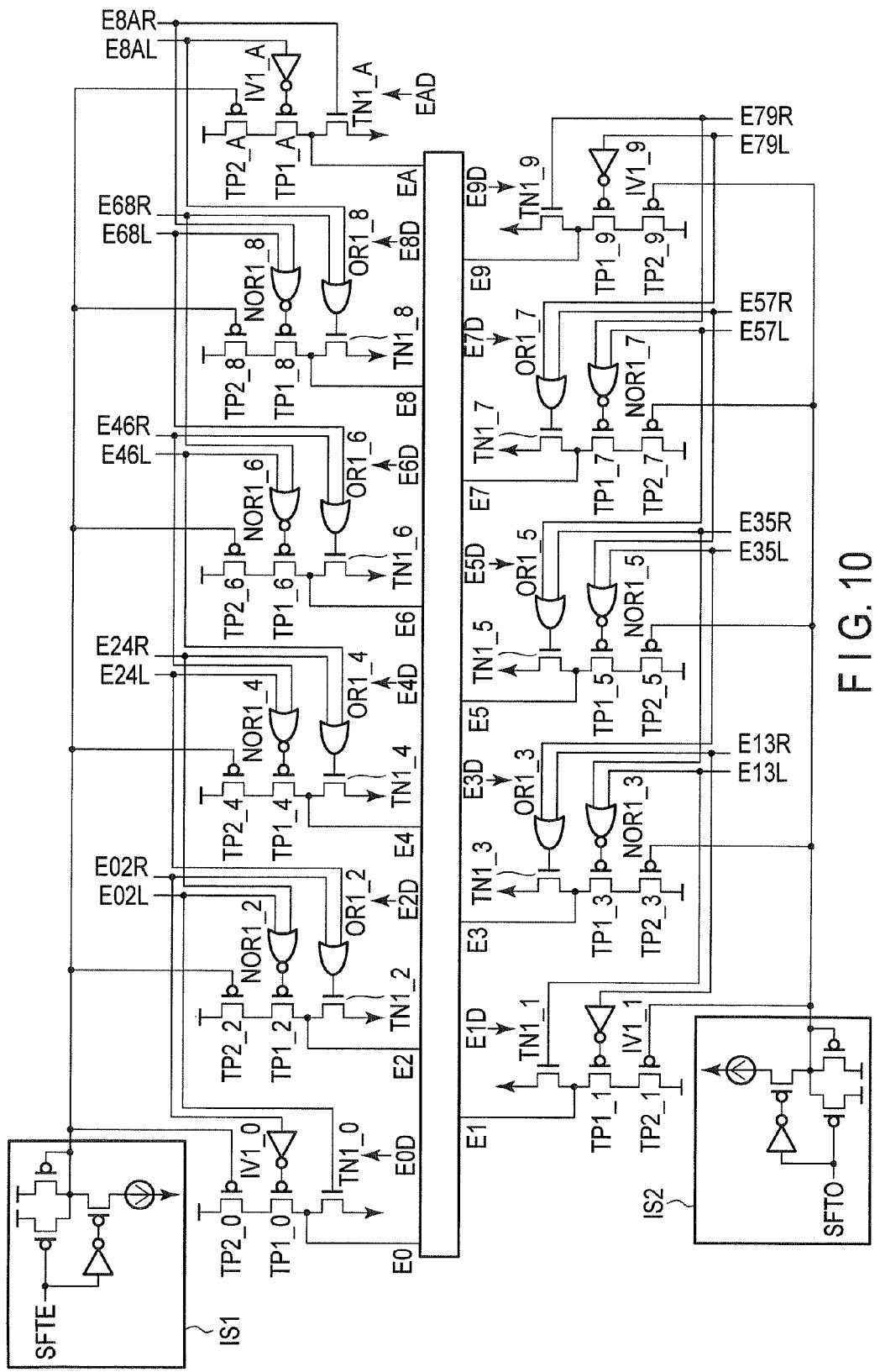
FIG. 10 illustrates a second example of a circuit for applying voltages according to the first embodiment.

The application of voltages as in FIGS. 5A, 5B, 6A and 6B can also be implemented with a circuit shown in FIG. 10. FIG. 10 illustrates a second example of a circuit for applying voltages according to the first embodiment, and is a part of a single cell array CA or a single current source/sink SC in FIG. 1, for example. In the FIG. 10 example, the current flowing through the transistors TN1 and TP1 is controlled by current sources IS1 or IS2, unlike the FIG. 7 example. In each of the drivers E0D to EAD, a p-type MOSFET TP2 (TP2_0 to TP2_A) is provided between the transistor TP1 and power node. The transistors TP2_0, TP2_2, TP2_4, TP2_6, TP2_8 and TP2_A receive a current from the current source IS1 at the gates. The transistors TP2_1, TP2_3, TP2_5, TP2_7, TP2_8, and TP2_A receive a current from the current source IS2 at the gates. Other features are the same as the FIG. 7 example, including the control.

According to the first embodiment, the magnetic thin wire ML is coupled to electrodes E at the both ends, and is also coupled to at least one electrode E between the ends. Forming a potential difference between a pair of electrodes E moves the magnetic domains only between the electrode pair. Such a partial magnetic domain wall motion can make the voltage for the magnetic domain wall motion smaller than that for an example of the voltage application to the ends of the magnetic thin wire ML, and eliminates the necessity of a high voltage for moving the magnetic domain walls even in a long thin line ML. Use of a high voltage is unnecessary, and therefore no circuit for generating and applying a high voltage is necessary. This prevents an increase of the chip area of the magnetic memory device, and eliminates the necessity of a dedicated process for forming transistors for the high voltage.

Moreover, the voltage for moving the magnetic domain walls is not proportional to the length of the magnetic thin wire ML, and therefore a long ferromagnetic thin wire ML can be implemented. Extension of the magnetic thin wires ML can reduce the number of accompanying mechanism for reads or writes for each magnetic thin wire ML, such as the MTJ structure and a selection circuit, and therefore can reduce the chip size of the magnetic memory device MD. Such extension of the magnetic thin wire ML and removal of the necessity for the high voltage can realize a magnetic memory device MD with a high capacity and high density.

Second Embodiment

Figure 11:
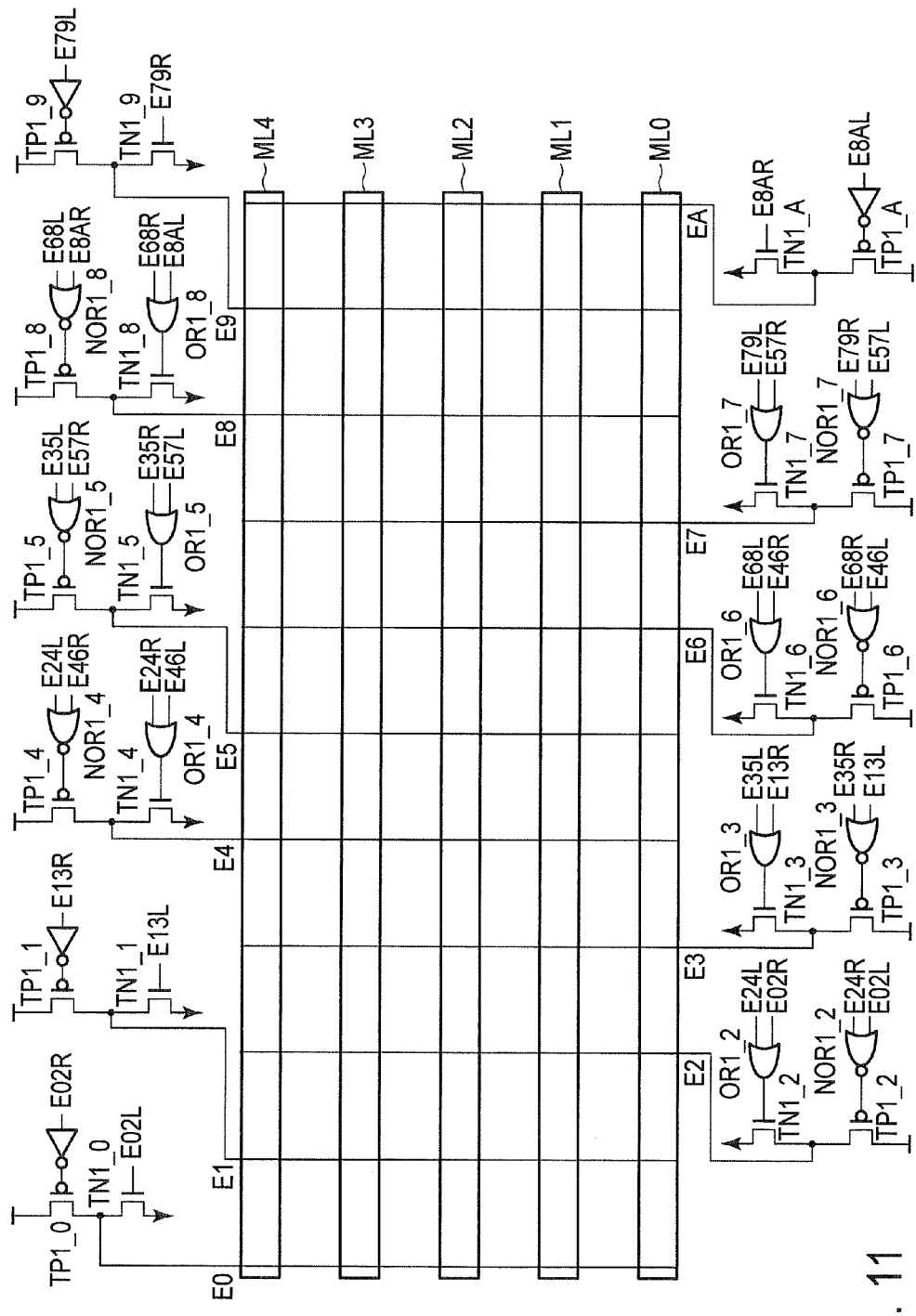
FIG. 11 illustrates an example of a part of a magnetic memory device utilizing magnetic domain wall motion according to a second embodiment.

In the second embodiment, the first embodiment is applied to multiple magnetic thin wires. FIG. 11 illustrates a part of a magnetic memory device utilizing magnetic domain wall motion according to the second embodiment. Specifically, FIG. 11 illustrates a part of a single cell array CA, and illustrates multiple magnetic thin wires and components involved in moving of the magnetic domains in the magnetic thin wires. All the electrodes E0 to EA are coupled to magnetic thin wires ML0 to ML4. Even if multiple magnetic thin wires ML0 to ML4 are electrically coupled to each other, stored information is not lost, because the magnetic thin wires ML (ML0 to ML4) use the state of the magnetic moment of each magnetic domain to store data and what moves by the magnetic domain wall motion is the state of the magnetic moment. Components and connections for applying voltages to the electrodes E0 to EA are the same as those in FIG. 7. Moreover, the components and connections of FIG. 10 can be used to apply voltages to the electrodes E as illustrated in FIG. 12.

Figure 13:
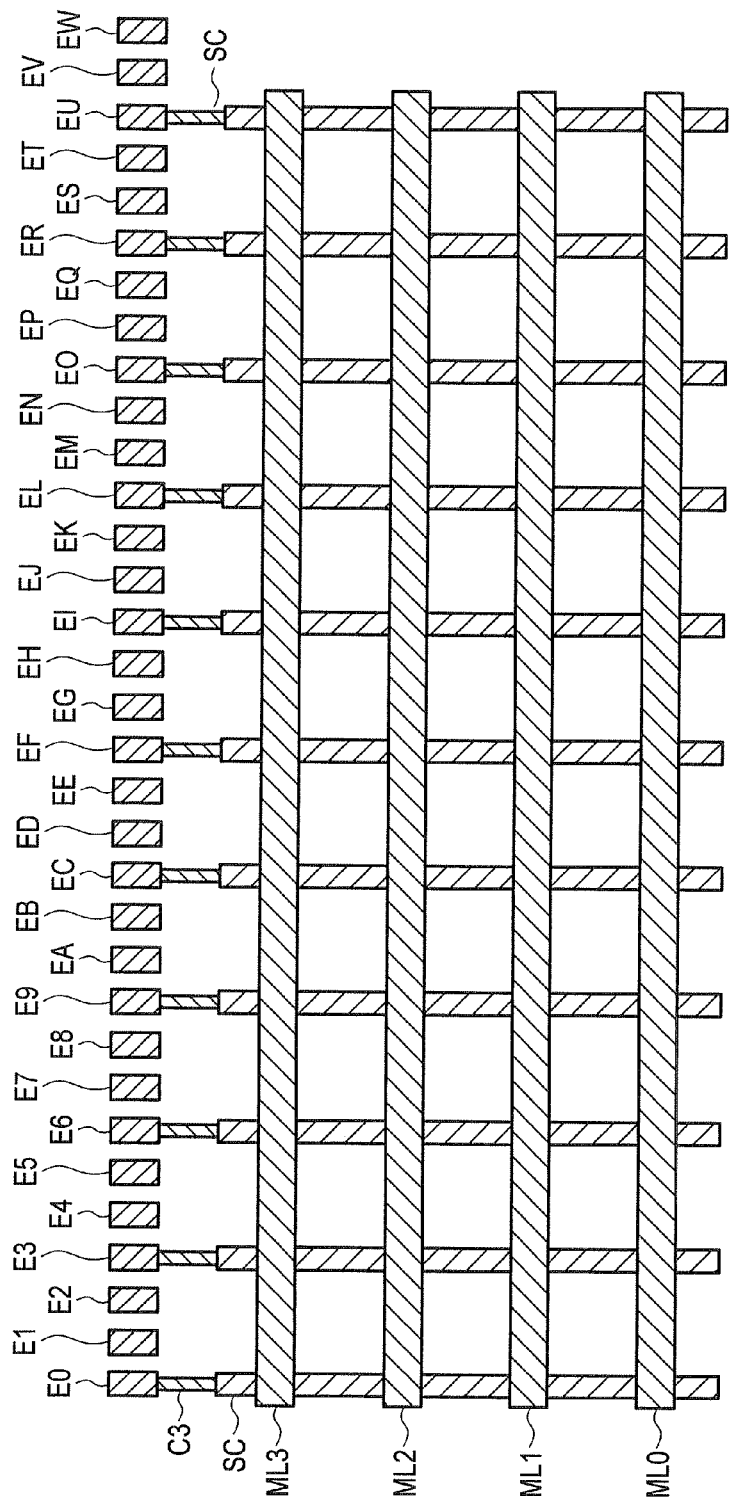
FIG. 13 illustrates an example of a cross-sectional view of a part of the magnetic memory device according to the second embodiment.

The arrangement of the components as shown in FIGS. 11 and 12 can be implemented as shown in FIG. 13. FIG. 13 illustrates an example of a cross-sectional view of a part the magnetic memory device according to the second embodiment. Multiple (example of four being illustrated) magnetic thin wires ML0 to ML3 extend along (or, in parallel with) the surface of a substrate sub such as silicon above the substrate sub. The magnetic thin wires ML0 to ML3 are in a line at intervals along the direction perpendicular to the surface of the substrate sub (or, a direction which intersects with the substrate sub). Above the magnetic thin wire ML3, the electrodes E0 to EW are in a line along a direction in which the magnetic thin wires ML (ML0 to ML3) extend. The electrodes E0 to EW extend along a direction which penetrates FIG. 13. Contacts SC are provided along the direction perpendicular to the surface of the substrate sub. Contacts SC contact a side of the magnetic thin wires ML, or the back of the magnetic thin wires ML in FIG. 13. The contacts SC are formed by forming contact holes which penetrate an insulator (not shown) which buries gaps of the magnetic thin wires ML and burying the contact holes with a conductive material. A particular contact SC is coupled via a contact C3 on its top to the corresponding electrode E (E0 to EW). FIG. 13 illustrates that the electrodes E0, E3, E6, E9, EC, EF, EI, EL, EO, ER and EU are coupled to the magnetic thin wires ML via contacts SC. Other electrodes E are coupled to other magnetic thin wires ML in a section at a position different from that shown in FIG. 13. A current source/sink coupled to at least some of the electrodes E can be formed on the surface of the substrate sub.

Figure 14:
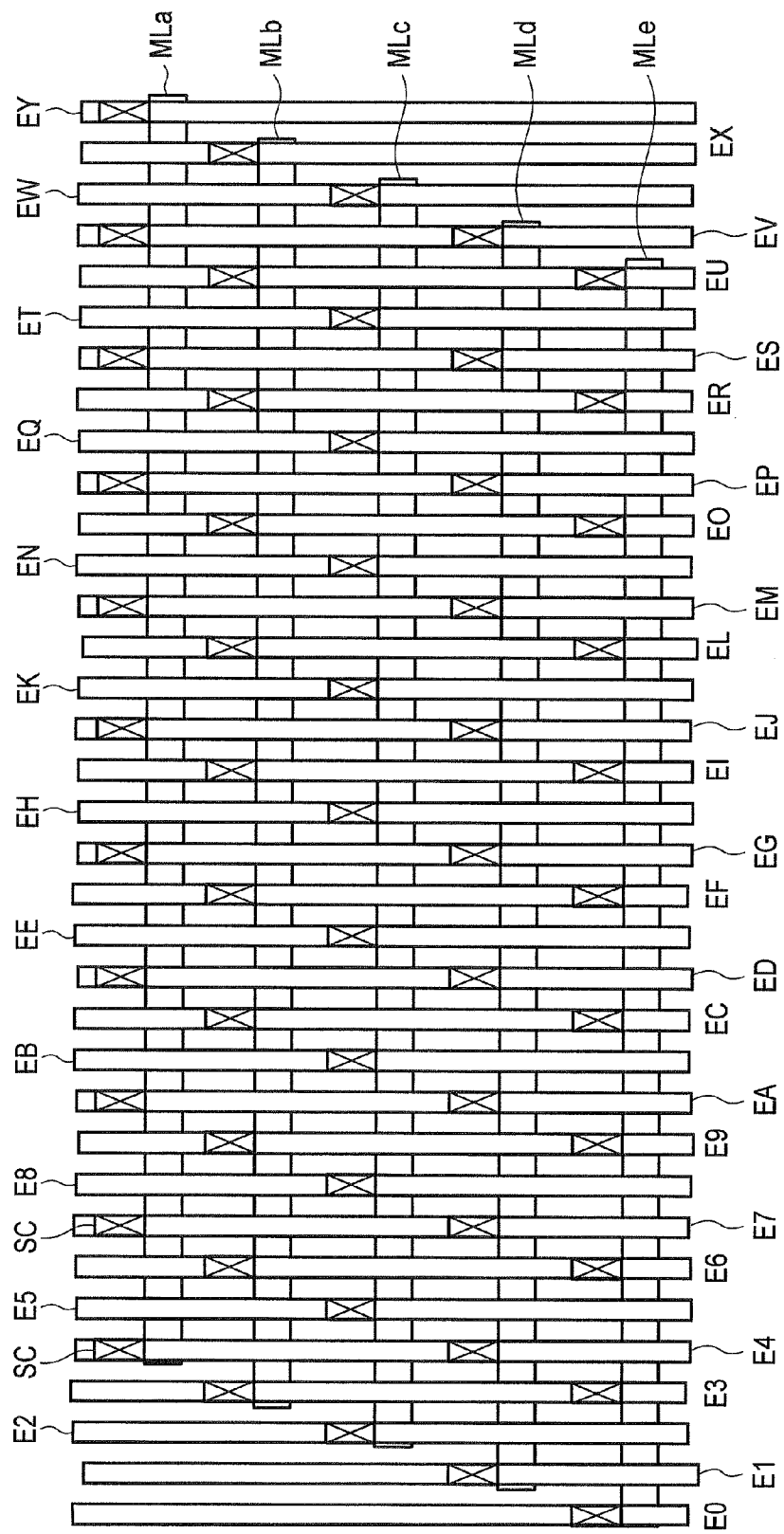
FIG. 14 illustrates an example of a plane view of a part of the magnetic memory device according to the second embodiment.
Figure 15:
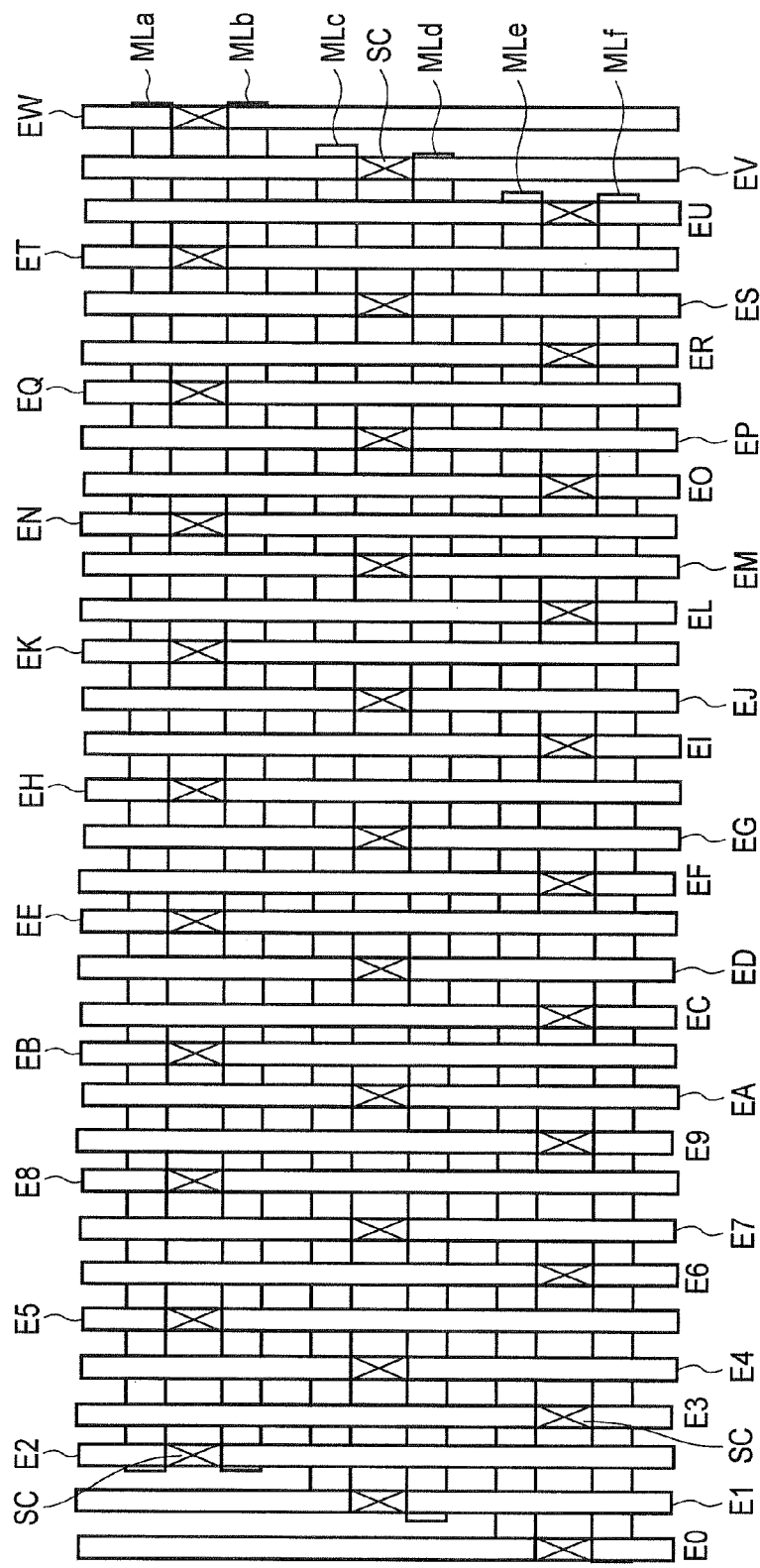
FIG. 15 illustrates a second example of a plane view of a part of the magnetic memory device according to the second embodiment.
Figure 16:
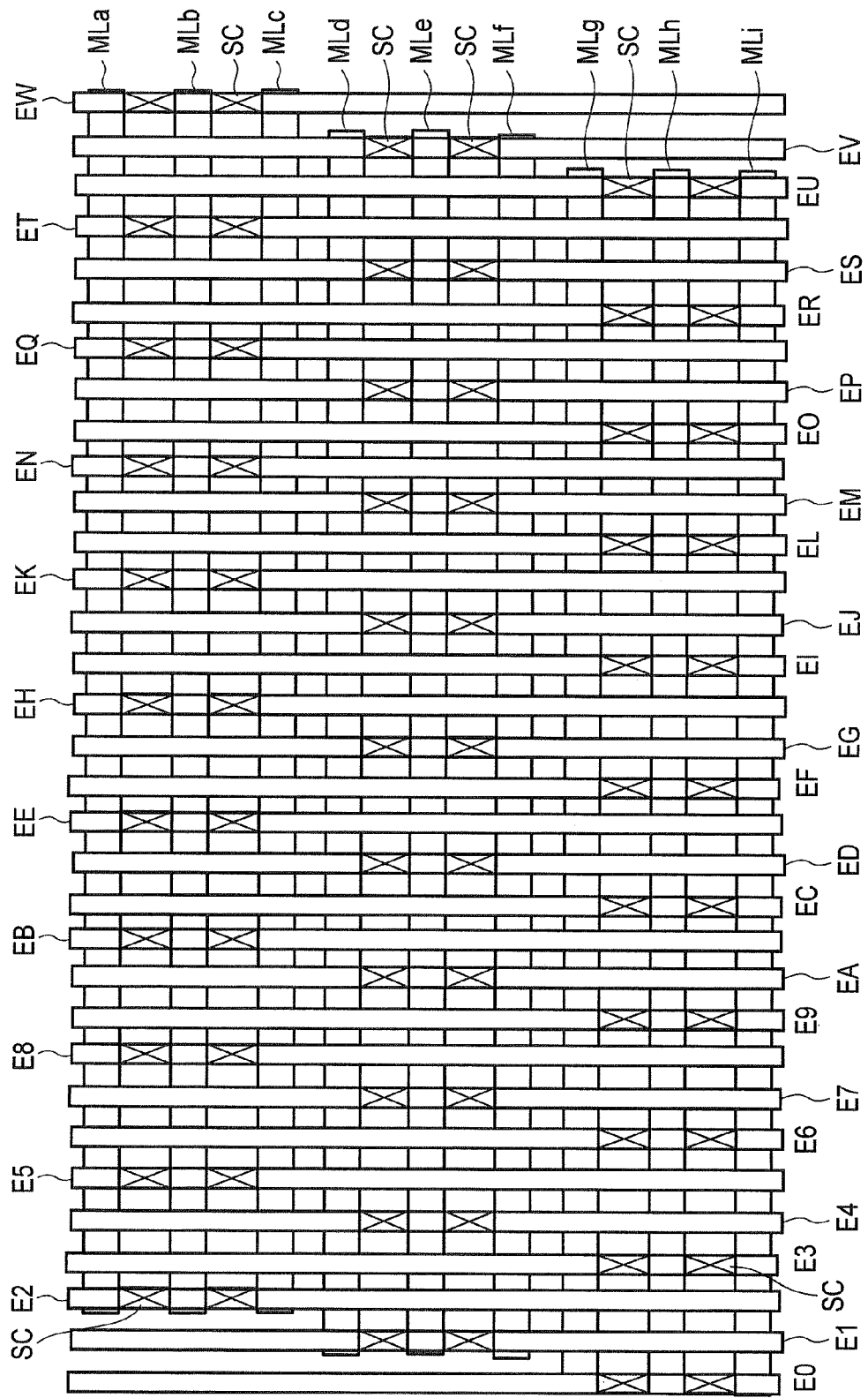
FIG. 16 illustrates a third example of a plane view of a part of the magnetic memory device according to the second embodiment.

FIGS. 14 to 16 illustrate examples of plane views of a part of the magnetic memory device according to the second embodiment, and illustrate views along the substrate sub. Magnetic thin wires MLa to MLi extend horizontally as shown in FIGS. 14 to 16, and are in line perpendicularly. Although not shown in the figures, further magnetic thin wires ML are also in a line along the direction perpendicular to the substrate sub (or, a direction which penetrates FIGS. 14 to 16) as shown in FIG. 13.

Electrodes E0 to EY extend perpendicularly. The electrodes E0 to EY are in a line horizontally. The electrodes E have intervals along the direction in which the electrodes E (E0 to EY) extend, and are in contact with the contacts SC at their sides. Each contact SC extends in a direction which penetrates the figure, and is in contact with a particular magnetic thin wire ML. The combination of coupled electrodes E and magnetic thin wires ML via the contacts SC is different among FIGS. 14 to 16. In the FIG. 14 example, the different magnetic thin wires ML in a line perpendicularly are coupled to different electrodes E. In the FIG. 15 example, each pair of magnetic thin wires ML adjacent perpendicularly is coupled to the set of the same electrodes E via the set of common contacts SC. In the FIG. 16 example, each pair among a set of three magnetic thin wires ML adjacent perpendicularly shares a set of contacts SC, and is coupled to the same set of electrodes E. Each magnetic thin wire ML has the magnetic domains moved by a current from the coupled electrode-set.

Specifically, in the FIG. 14 example, a magnetic thin wire MLa is coupled to a set of electrodes E4, E7, EA, ED, EG, EJ, EM, EP, ES, EV, and EY. A magnetic thin wire MLb is coupled to a set of electrodes E3, E6, E9, EC, EF, EI, EL, EO, ER, EU, and EX. A magnetic thin wire MLc is coupled to a set of electrodes E2, E5, E8, EB, EE, EH, EK, EN, EQ, ET, and EW. A magnetic thin wire MLd is coupled to a set of electrodes E1, E4, E7, EA, ED, EG, EJ, EM, EP, ES, and EV. The magnetic thin wire MLe is coupled to a set of electrodes B0, E3, E6, E9, EC, EF, EI, EL, EO, ER, and EU.

In the FIG. 15 example, magnetic thin wires MLa and MLb are both commonly coupled to a set of the electrodes E2, E5, E8, EB, EE, EH, EK, EN, EQ, ET, and EW. Magnetic thin wires MLc and MLd are both coupled to a set of the electrodes E1, E4, E7, EA, ED, EG, EJ, EM, EP, ES, and EV. Magnetic thin wires MLe and MLf are both coupled to a set of the electrodes E0, E3, E6, E9, EC, EF, EI, EL, EC, ER, and EU.

In the FIG. 16 example, magnetic thin wires MLa, MLb, and MLc are all coupled to a set of the electrodes E2, E5, E8, EB, EE, EH, EK, EN, EQ, ET, and EW. Magnetic thin wires MLd, MLe, and MLf are all coupled to a set of the electrodes E1, E4, E7, EA, ED, EG, EJ, EM, EP, ES, and EV. Magnetic thin wires MLg, MLh, and MLi are all coupled to a set of the electrodes E0, E3, E6, E9, EC, EF, EI, EL, EO, ER, and EU.

Figure 18:
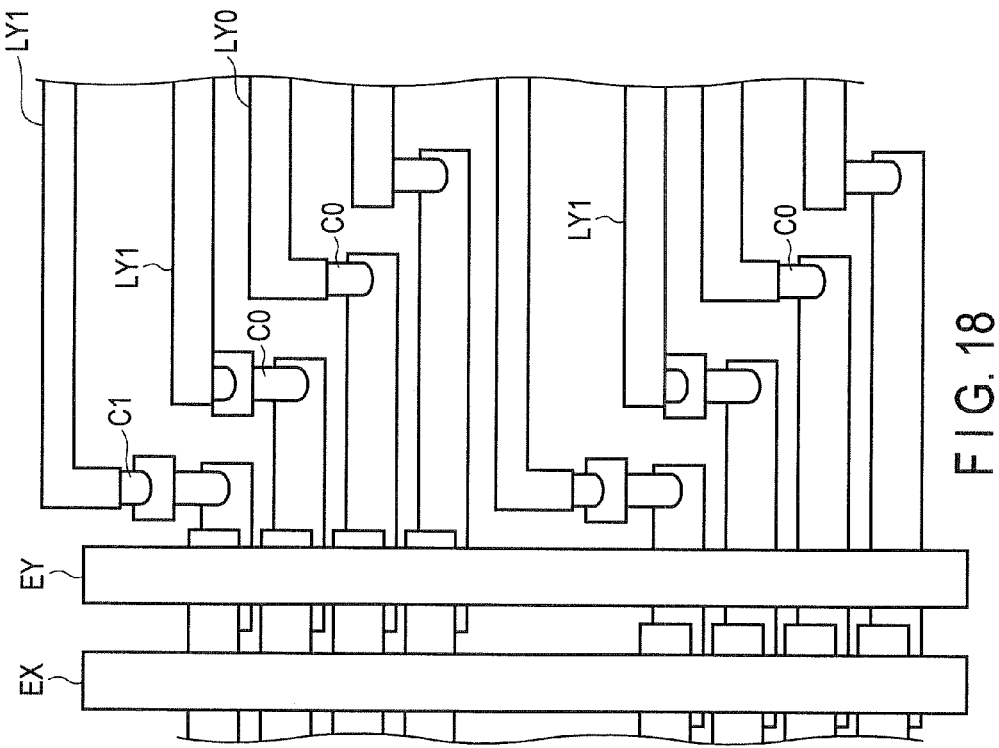
FIG. 18 illustrates a perspective view of a part of the magnetic memory device according to the second embodiment.
Figure 17:
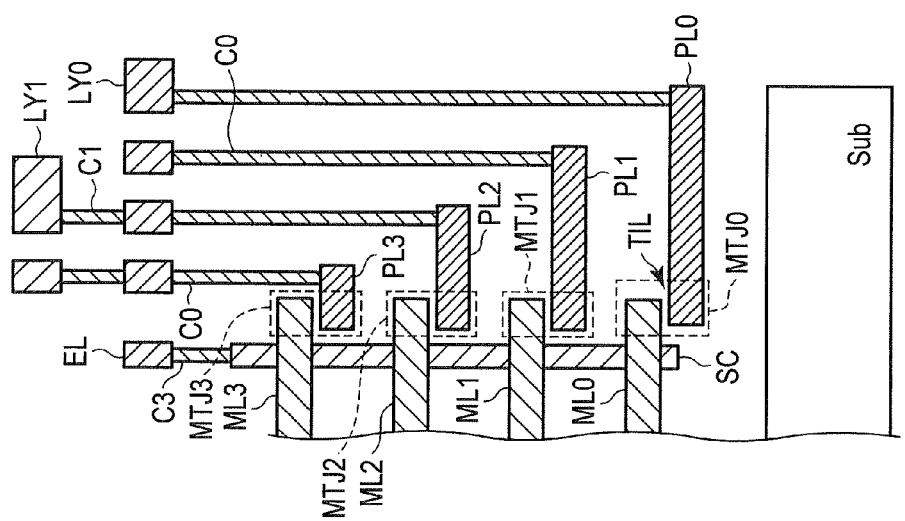
FIG. 17 illustrates a second example of a cross-sectional view of a part of the magnetic memory device according to the second embodiment.

A structure of ends of the magnetic thin wires ML and the vicinity thereof is as shown in FIGS. 17 and 18. FIG. 17 and FIG. 18 illustrate a second example of a cross-sectional view and a perspective view of the magnetic memory device according to the second embodiment. The magnetic thin wires ML0 to ML3 are in a line perpendicular to the substrate sub, and at the ends and bottoms face the tops of the pinned layers PL0 to PL3. The magnetic thin wires ML0 to ML3 sandwich respective tunnel insulating films TIL (for example, MgO) with respective pinned layers PL0 to PL3. Each of the magnetic thin wires ML (ML0 to ML3) forms an MTJ structure MTJ (MTJ0 to MTJ3) with a corresponding pinned layer PL (PL0 to PL3) and the insulating film TIL therebetween. Each MTJ structure MTJ serves to execute data writes and/or reads to and/or from a magnetic domain positioned in the MTJ structure MTJ of the corresponding magnetic thin wire ML. A pinned layer PL at a higher level is shorter than a pinned layer PL at a lower level, and therefore the set of pinned layers PL forms stairs. The pinned layers PL are coupled at the ends to interconnects LY0 via contacts C0. The interconnects LY0 are further coupled to interconnects LY1 via contacts C1.

Figure 19:
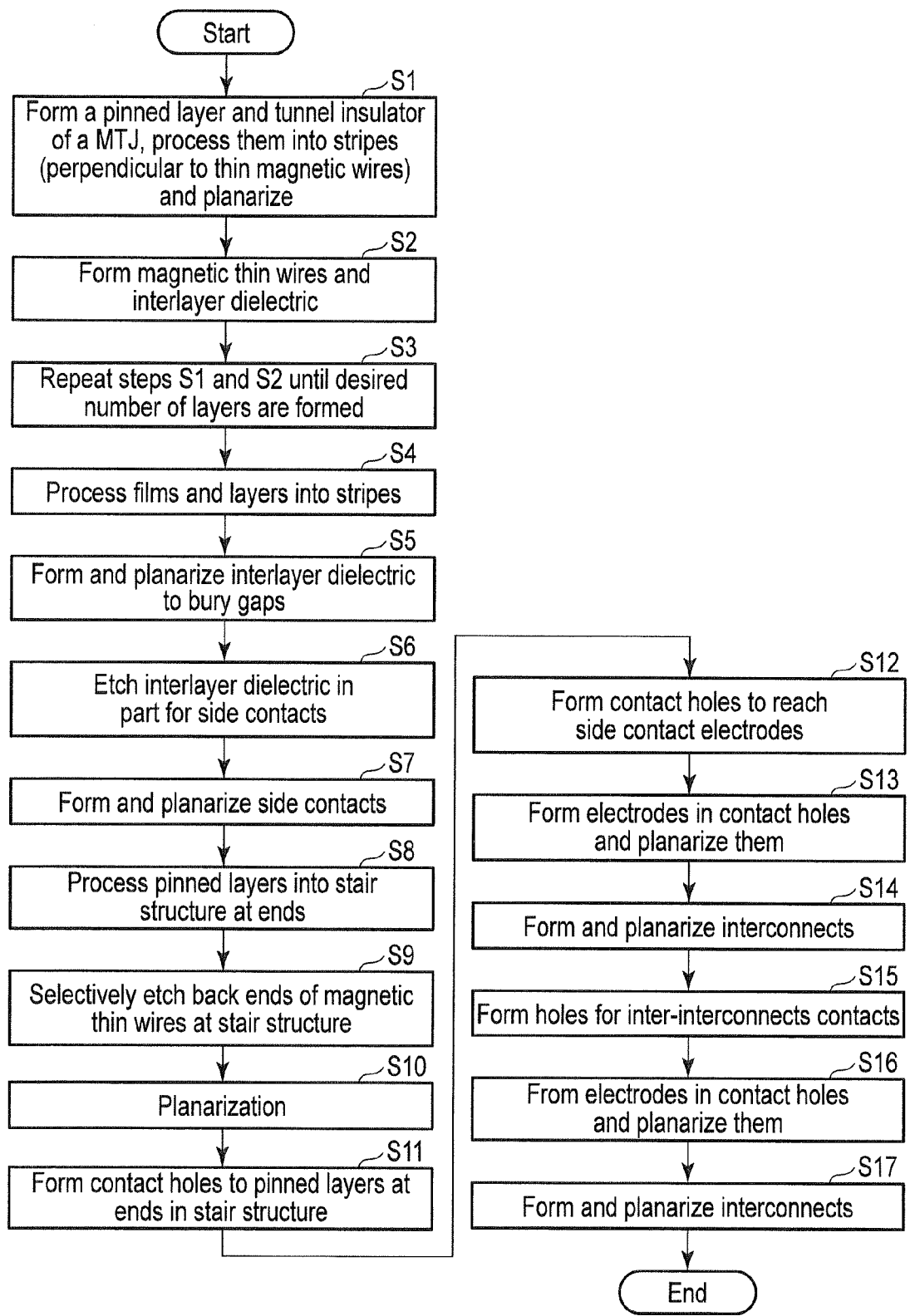
FIG. 19 illustrates a manufacturing process of the semiconductor memory device according to the second embodiment.

FIG. 19 illustrates a manufacturing process of the semiconductor memory device according to the second embodiment. The manufacturing process of FIG. 19 will be described with reference to FIGS. 17 and 18. First, in step S1, the lowest pinned layer PL (the pinned layer PL0 in the FIG. 17 example) is formed on the substrate sub, and the tunnel insulator TIL of an MTJ structure MTJ1 is formed thereon. The layer PL and film TIL are then partly removed at a part above which the magnetic thin wires ML will be formed except for a portion above which the ends of the magnetic thin wires will be positioned, by a lithography step and a reactive ion etching (RIE), etc. In other words, the layer PL and film TIL are patterned to remain, when seen from above, to be projected from areas where the MTJ structures MTJ of the magnetic thin wires ML will be formed. Then, the tops of the tunnel insulating films TIL are planarized by a chemical mechanical etching (CMP), etc.

In step S2, a layer for the lowest magnetic thin wires ML (or, the magnetic thin wires ML0 in the FIG. 17 example) is formed on the insulating film TIL, and an interlayer dielectric (not shown) such as $SiO_2$ is formed in the surroundings thereof. In step S3, the set of steps S1 to S2 are repeated until the desired number of layers of the magnetic thin wires ML are formed. In the FIG. 17 example, the set of steps S1 to S2 are repeated four times in total.

In step S4, the stack of the films and layers obtained by the steps so far is patterned by a lithography step and an etching to be formed into stripes in the plane shape thereof (see, FIGS. 14 to 16). In step S5, an interlayer dielectric (not shown) such as $SiO_2$ is buried among straight-line-features of the stripe-shaped films and layers, and the upper surface of the interlayer dielectric is planarized. In step S6, holes for contacts SC are formed by a lithography step and an etching. The contact holes extend through the interlayer dielectrics toward the substrate sub to contact, at their sides, sides of the corresponding magnetic thin wires ML. In step S7, the contact holes are buried by a conductive material to form the contacts SC, whose tops are then planarized.

In step S8, the interlayer dielectrics and pinned layers PL are repeatedly patterned by a photolithography process and an etching to form a stair structure of the set of pinned layers PL at the ends thereof. Specifically, the end of each pinned layer PL is removed one by one by an etching so that a higher pinned layer PL is shorter than a lower pinned layer PL. In step S9, the ends of the magnetic thin wires ML, where the stair structure of the pinned layers PL are positioned, are selectively etched back. In step S10, an interlayer dielectric (not shown) such as $SiO_2$ is formed over the entire surface of the structure obtained by the steps so far to bury the stair-structure part of the pinned layers PL. The upper surface of this interlayer dielectric is then planarized.

In step S11, holes for the contacts C0 which reach respective tops of pinned layers PL are formed in the interlayer dielectric by a lithography step and an etching. The contact holes are then buried with a conductive material to form the contacts C0, whose tops are then planarized. In step S12, contact holes which reach the contacts SC are formed by a lithography step and an etching in the interlayer dielectric. In step S13, the contact holes are buried by a conductive material to form the contacts C3, whose tops are then planarized. In step S14, interconnects LY0 are formed by a lithography step, an etching, and planarization. In step S15, holes for the contacts C1 are formed by a lithography step and an etching in the interlayer dielectric. In step S16, the contact holes are buried with a conductive material to form the contacts C1, whose tops are then planarized. In step S17, the interconnects LY1 are formed by a lithography step, an etching, and planarization.

Figure 21:
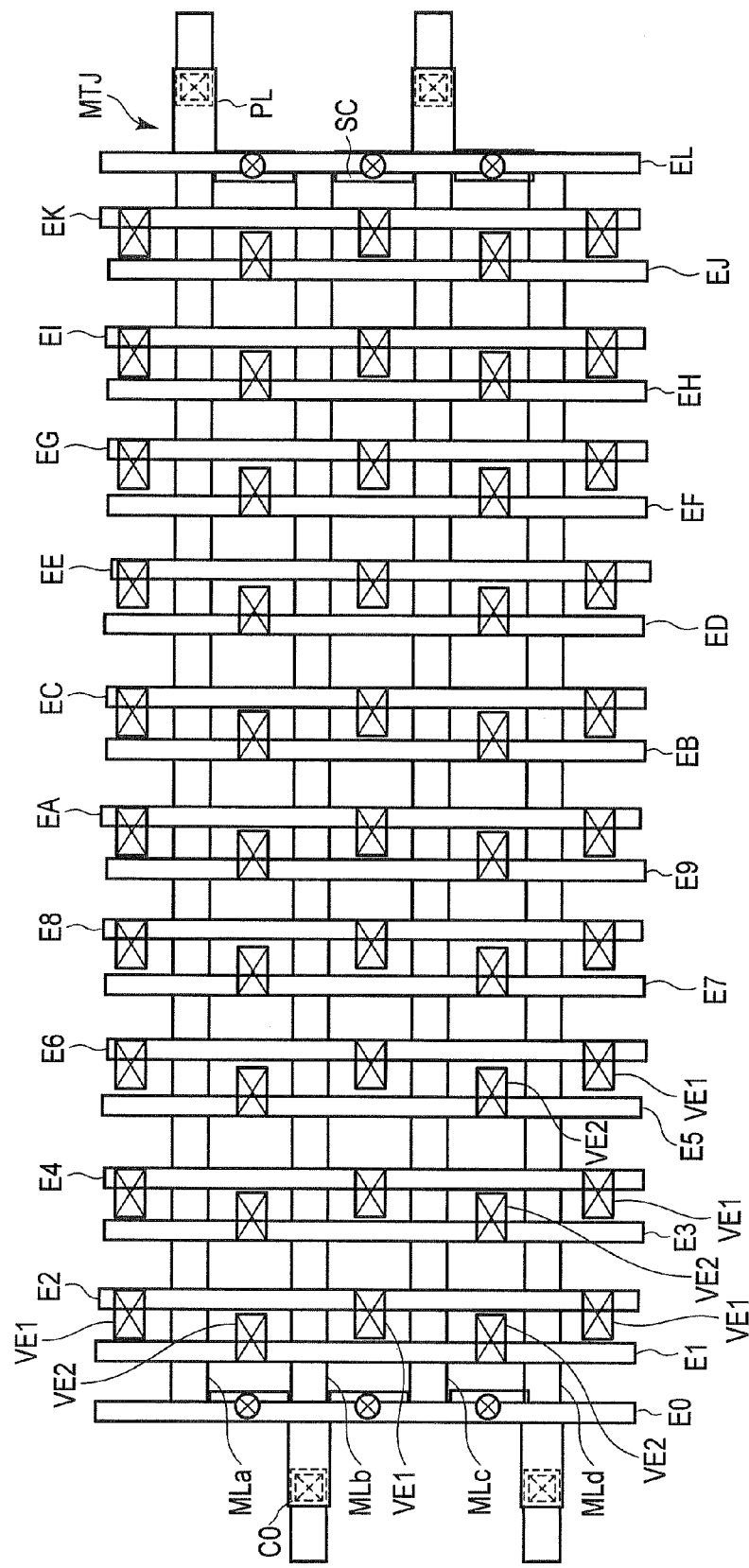
FIG. 21 illustrates an example of a plane view of a part of the magnetic memory device according to a third embodiment.

The MTJ structures MTJ may be formed at different sides of the different magnetic thin wires ML instead of the same side. For example, every two magnetic thin wires ML form the MTJ structures MTJ at a particular end, and every other two magnetic thin wires ML form the MTJ structures MTJ at the other end. This example is illustrated in FIG. 21. Although FIG. 21 is described in connection with the third embodiment described below, the second and third embodiments are the same in regard to the positions of the MTJ structures MTJ.

The second embodiment is based on the first embodiment, and therefore the same advantages as the first embodiment can be obtained according to the second embodiment. Moreover, according to the second embodiment, the magnetic domain walls of multiple magnetic thin wires ML are moved simultaneously. This results in driver circuits fewer than an example of magnetic domain wall motion in units of magnetic thin wire ML, and can reduce the area of the chip of the magnetic memory device MD and the manufacturing cost of the chips. Furthermore, the magnetic thin wires ML are provided along (or, in parallel) with the substrate sub, and therefore complementary MOS (CMOS) circuits (or, their transistors) for various periphery circuits can be formed on the substrate sub below the magnetic thin wires ML. This further reduces the chip area and increase an integration of the magnetic memory device MD.

Third Embodiment

The third embodiment relates to an example of magnetic domain wall motion with an electric field.

Figure 20:
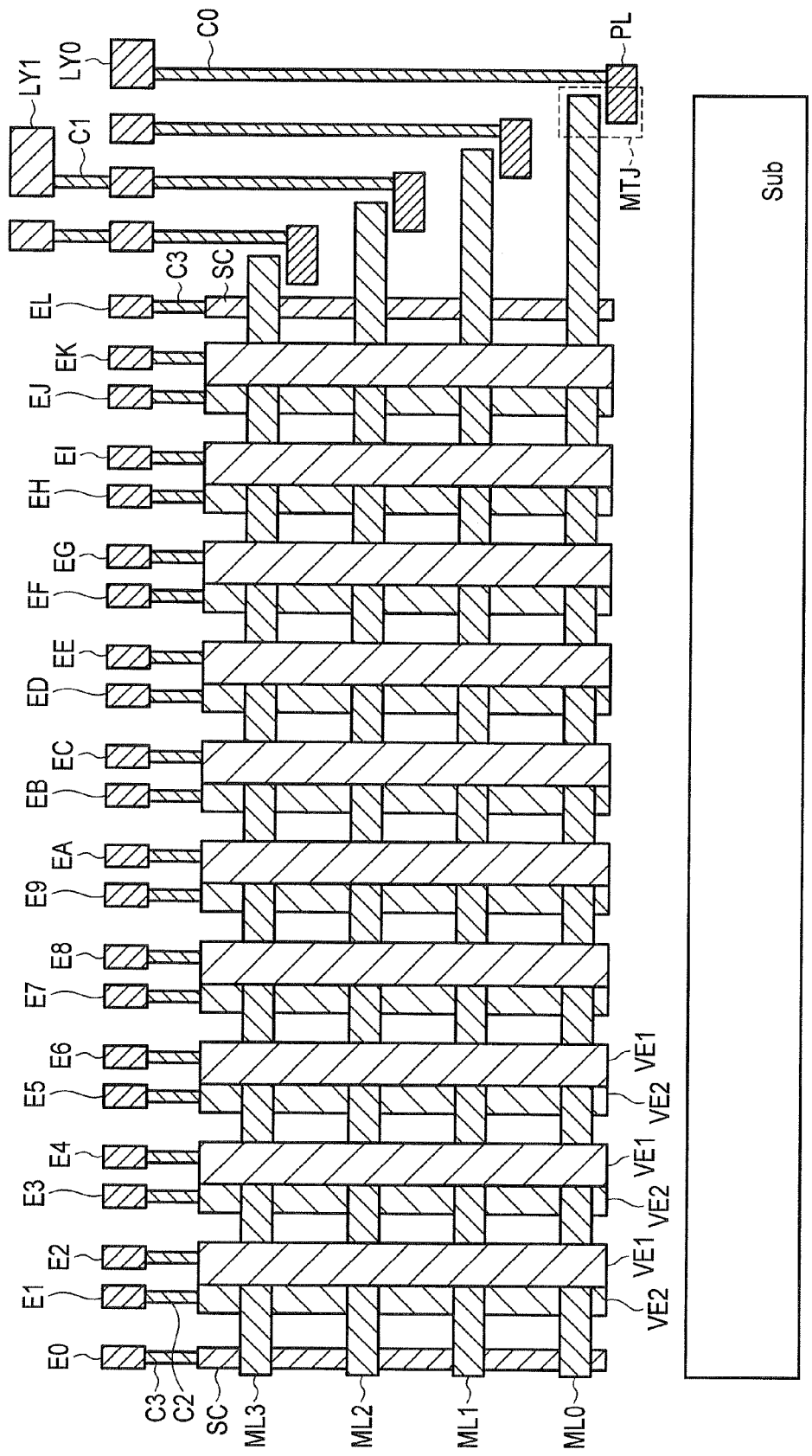
FIG. 20 illustrates an example of a cross-sectional view of a part of the magnetic memory device according to a third embodiment.

FIG. 20 illustrates an example of a cross-sectional view of a part of a magnetic memory device utilizing magnetic domain wall motion according to the third embodiment. FIG. 21 illustrates an example of a plane view of the magnetic memory device according to the third embodiment, and a plane view of the FIG. 20. In the third embodiment, because of the magnetic domain walls moved by an electric field, the magnetic thin wires ML are electrically coupled only to the electrode E0 and EL at both ends thereof, and not to the remaining electrodes. For this reason, contacts SC for electrodes other than electrodes E0 and EL are not provided. Instead, multiple electrodes VE1 for the magnetic domain wall motion are provided along each magnetic thin wire ML at one side thereof. The electrodes VE1 have intervals with each other, extend in the direction perpendicular to the surface of the substrate sub, and have intervals with the magnetic thin wires ML. Furthermore, electrodes VE2 for the magnetic domain wall motion are in a line along each magnetic thin wire ML at the other side thereof. The electrodes VE2 have intervals with each other, extend in the direction perpendicular to the surface of the substrate sub, and have intervals with the magnetic thin wires ML. An electrode VE1 and an electrode VE2 partly face each other in the plane view. For a particular magnetic thin wire ML whose magnetic domain walls are to be moved, electrodes VE1 and VE2 are applied with a voltage in the moving direction one after another to move the magnetic domain walls. The arrangement of the electrodes VE1 and VE2 is determined so that such magnetic domain wall motion can be implemented. For example, arrangement of the magnetic thin wire ML accompanied by only electrodes VE2, both electrodes VE1 and VE2, only electrodes VE1, no electrode is repeatedly provided.

Each of the electrodes VE1 and VE2 is coupled to a corresponding electrode E via a contact C2. For example, the electrodes VE1 from the left side of FIG. 21 are coupled to every two electrodes E, i.e., electrodes E2, E4, E6, E8, EA, EC, EE, EG, EI, and EK, respectively. The electrodes VE2 from the left side of FIG. 21 are coupled to every two electrodes E, i.e., E1, E3, E5, E7, E9, EB, E6, ED, EF, EH, and EJ, respectively.

As described above and shown in FIG. 21, the MTJ structures MTJ may be formed at different sides of the different magnetic thin wires ML instead of the same side thereof. For example, every two magnetic thin wires ML form the respective MTJ structures MTJ at one end, and other every two magnetic thin wires ML form the respective MTJ structures MTJ at the other end.

FIG. 22 illustrates a manufacturing process of the semiconductor memory device according to the third embodiment. Steps S1 to S4 of FIG. 19 are executed first, and step S4 continues at step S21. In step S21, an insulating film (not shown) such as MgO is deposited on sides of straight-line patterns obtained at step S4. In step S22, areas between features are buried with an interlayer dielectric as in step S5. In step S23, holes for the electrodes VE (VE1 and VE2) are formed by a lithography step and an etching in the interlayer dielectric. In step S24, the contact holes are buried with a conductive material to form the electrodes VE, whose tops are then planarized. In step S25, holes for the contacts SC are formed by a lithography step and an etching at the both ends of the magnetic thin wires ML. In step S26, the contact holes are buried with a conductive material to form the contacts SC, whose tops are then planarized.

After step S26, steps S8 to S11 are executed. In step S28 after step S11, holes for the contacts C2 and C3 are formed by a lithography step and an etching. In step S29, the contact holes are buried with a conductive material to form the contacts C2 and C3, whose tops are then planarized. After step S29, steps S14 to S17 are executed.

According to the third embodiment, even with an example of magnetic domain walls being moved with the electric field, the magnetic thin wires ML can be provided along (or, in parallel) with the substrate sub as in the second embodiment, which produces the same advantages as the second embodiment.

Fourth Embodiment

The fourth embodiment relates to an example of the magnetic thin wires being formed along a direction perpendicular to the substrate.

Figure 24:
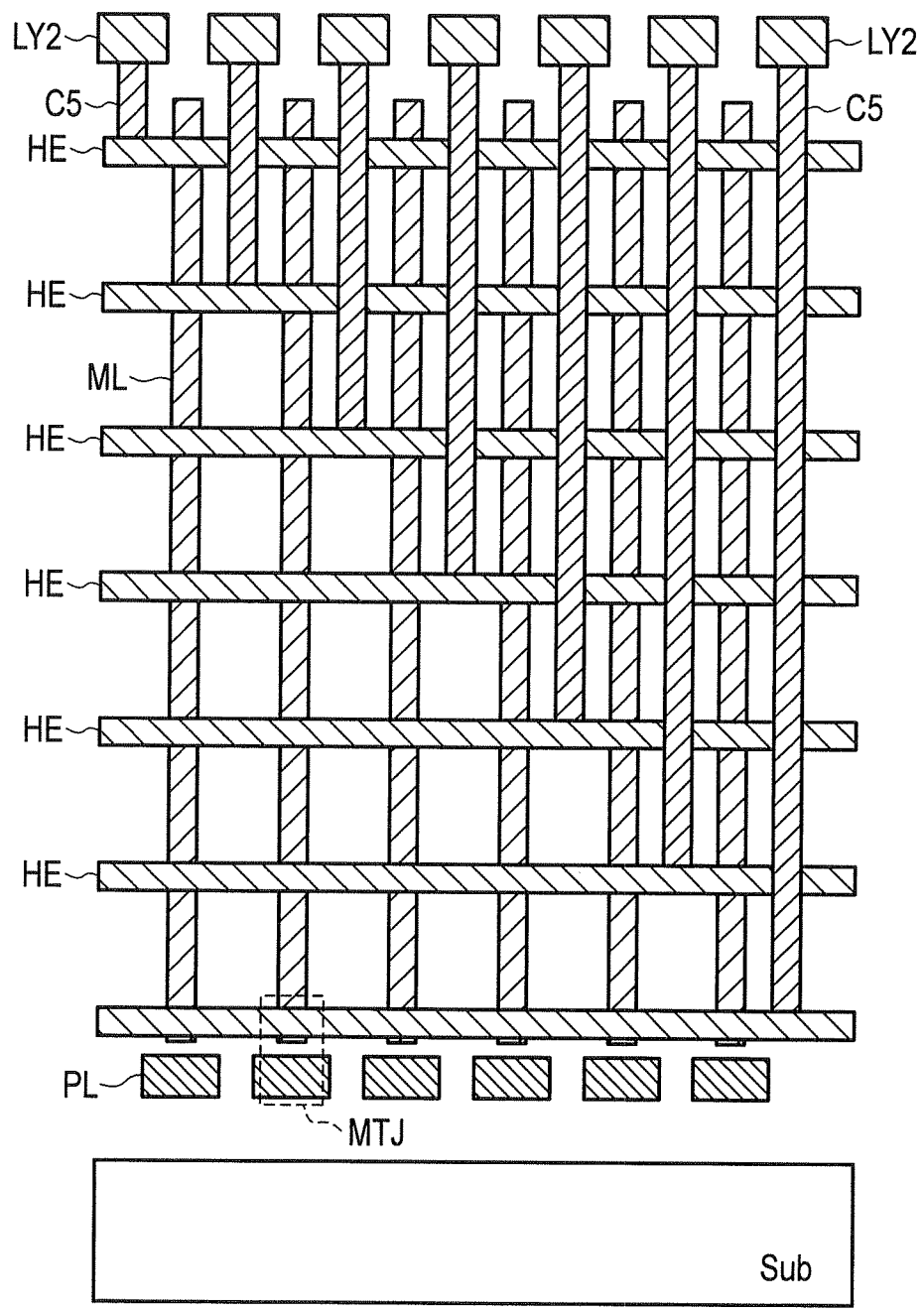
FIG. 24 illustrates an example of a cross-sectional view of another part of the magnetic memory device according to the fourth embodiment.

FIG. 23 illustrates an example of a cross-sectional view of a part of a magnetic memory device utilizing magnetic domain wall motion according to the fourth embodiment. FIG. 24 illustrates a cross-sectional view perpendicular to FIG. 23. The magnetic thin wires ML extend along the direction perpendicular to the substrate sub. The magnetic thin wires ML are in a line horizontally in each of FIGS. 23 and 24, and therefore are arranged in a matrix along with the substrate sub. Each magnetic thin wire ML sandwiches at the bottom a tunnel insulating film TIL with a pinned layer PL to form an MTJ structure MTJ. The MTJ structure MTJ serves to execute data writes and/or reads to and/or from the corresponding magnetic thin wire ML.

Figure 25:
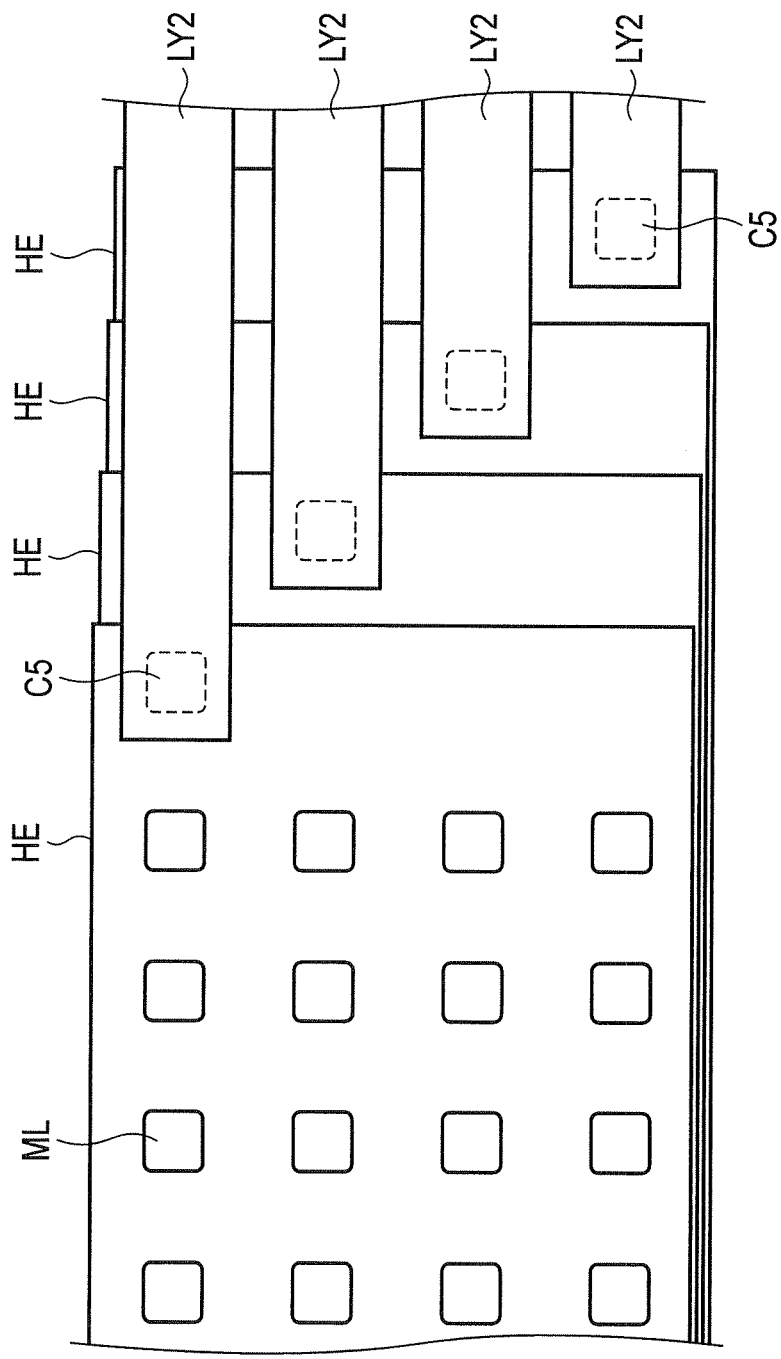
FIG. 25 illustrates an example of a plane view of a part of the magnetic memory device according to the fourth embodiment.

Electrodes HE for magnetic domain wall motion with a plate shape are provided along the surface of the substrate sub. The electrodes HE are in a line along the direction perpendicular to the surface of the substrate sub at intervals. The electrodes HE receive voltages to generate electric fields for moving the magnetic domain walls. An electrode HE at a higher level is shorter than an electrode HE at a lower level, and therefore a set of the electrodes HE form a stair at the end. Each electrode HE is coupled at the end at the top to a contact C5. The contacts C5 are coupled at the tops to the interconnects LY2. A plane view of the ends of the electrodes HE is illustrated in FIG. 25.

Fifth Embodiment

For reads and/or writes, MTJ structures and transistors for selecting such structures are necessary. However, providing structures and elements for respective magnetic thin wires also involves provision of a control and/or drive circuit for the MTJ structures and elements and interconnects. This consumes a large area of a chip of a magnetic memory device utilizing magnetic domain wall motion. The stacked magnetic thin wires ML as in the FIG. 13 example enable MTJ structures to be stacked as shown in FIG. 17. However, MOS transistors of the control and/or drive circuit are formed on the substrate sub, which requires interconnects to be arranged to lead to the transistors. Providing such interconnects may complicate a manufacturing process.

FIG. 26 illustrates an example of a part of a circuit of a magnetic memory device utilizing magnetic domain wall motion according to the fifth embodiment. Specifically, FIG. 26 illustrates some magnetic thin wires ML and components and connections in the periphery thereof. Each of magnetic thin wires ML_1 to ML_5 is coupled at one end to a magnetic thin wire ML_6. In other words, the magnetic thin wires ML_0 to ML_6 form a comb-like shape. The magnetic thin wires ML_0 to ML_5 have the same features as the magnetic thin wire ML of the embodiments described so far, and store data. In contrast, the magnetic thin wire ML_6 serves as a data transfer path as will be described. The magnetic thin wire ML_6 sandwiches a tunnel insulating film TIL (not shown) with a pinned layer PL, and forms an MTJ structure MTJ for reads and/or writes.

Between the power supply node and one end (or, node N_0) of the magnetic thin wire ML_0 which is not commonly coupled, p-type MOSFETs TP11_0 and TP12_0, and an n-type MOSFETs TN11_0 are coupled in series. The transistor TP11_0 is coupled to a node IS20 at the gate. The transistor TP12_0 receives the inverted signal of a signal E0R from the sequencer SQ at the gate. The transistor TN11_0 receives a signal E0L from the sequencer SQ at the gate. Similarly, between the power supply node and one end (or, node N_Z) of the magnetic thin wire ML_Z which is not commonly coupled, p-type MOSFETs TP11_Z and TP12_Z, and an n-type MOSFET TN11_Z are coupled in series, where Z=1, 2, 3, 4, or 5. The transistor TP11_Z is coupled to a node IS20 at the gate. The transistor TP12_Z receives the inverted signal of a signal EZR from the sequencer SQ at the gate. The transistor TN11_Z receives a signal EZL from the sequencer SQ at the gate. The node IS20 is supplied with a constant current from a current source IS2. The current source IS2 is enabled by a signal SFT.

Between the power supply node and ground node, p-type MOSFETs TP14 and TP15, and an n-type MOSFET TN13 are coupled in series. The transistor TP14 is coupled to the node IS20 at the gate. The connection node between the transistors TP15 and TN13 is coupled to one end (node N_6) of the magnetic thin wire ML_6. The transistor TP15 receives the output of a NOR gate NOR11 at the gate. The transistor TP15 receives signals E0L, E1L, E2L, E3L, E4L, and E5L. The transistor TN13 receives the output of an OR gate OR11 at the gate. The transistor TN13 receives signals E0R, E1R, E2R, E3R, E4R, and E5R.

With the signals SFT and E0L made high and remaining signals EXL (X=1, 2, 3, 4, and 5) and signals NYR (Y=0, 1, 2, 3, 4, and 5) made low, a current flows from the node N_6 to the node N_0, and this current moves the magnetic domain walls in the magnetic thin wire ML_0 from the node N_0 to the node N_6. This transfers the data in the moved magnetic domains to the magnetic thin wire ML_6.

With the signals SFT and E2L made high and the remaining signals EXL (X=0, 1, 3, 4, and 5) and signals NYR (Y=0, 1, 2, 3, 4, and 5) made low, a current flows from the node N_6 to the N_2, and this current moves the magnetic domain walls in the magnetic thin wire ML_2 from the node N_2 to the node N_6. This transfers the data in the moved magnetic domains to the magnetic thin wire ML_6.

Similarly, with the signals SFT and EZL made high and the remaining signals EXL (X=0 to 5 excluding Z) and the signal NYR (Y=0, 1, 2, 3, 4, and 5) made low, a current flows from the node N_6 to N_Z, and this current moves the magnetic domain walls in the magnetic thin wire ML_Z from node N_Z to the node N_6. This transfers the data in the moved magnetic domains to the magnetic thin wire ML_6.

Thus, a magnetic thin wire is utilized which has magnetic domain walls moved only in a part between two electrodes between which a potential difference is present, and no current flows (or, is made to flow) in other parts to result in no magnetic domain wall motion. Specifically, a potential difference is generated only between one of the nodes E_0 to E_5 and the node E_6, and the magnetic domains in one of the magnetic thin wires ML_0 to ML_5 move.

Thus, the motion of the magnetic domains are caused in one of the magnetic thin wires ML_0 to ML_5, and the data in the magnetic domains to be accessed is transferred to the magnetic thin wire ML_5. The to-be-accessed magnetic domain is further moved through the magnetic thin wire ML_6 until it enters the MTJ structure MTJ, where a read or write is executed. The motion of the magnetic domains in the magnetic thin wire ML_6 are possible by generating a potential difference between the node N_6 and the other end.

In the FIG. 26 example, the nodes N (N_0 to N_5) of the unselected magnetic thin wires ML (ML_0 to ML_5) are made to electrically float. Alternatively, the unselected node N may be biased to a potential VA as illustrated in FIG. 27. FIG. 27 illustrates a second example of a circuit of a part of a magnetic memory device utilizing magnetic domain wall motion according to the fifth embodiment. FIG. 27 includes magnetic thin wires ML for data storage fewer (i.e., five) than FIG. 26, where the magnetic thin wire ML_5 is used to transmit data instead of the magnetic thin wire ML_6 as in FIG. 26. A p-type MOSFET TP17_0 is coupled between the node of potential VA and node N0. The transistor TP17_0 receives the output of an OR gate OR13_0 at the gate. The OR gate OR13_0 receives, among all the signals E0L, E1L, E2L, E3L, and E4L, the number of which is the same as that of the data-storage-purpose magnetic thin wires ML_0 to ML_4, all signals except for the corresponding signal E0L.

Similarly, a p-type MOSFET TP17_Z is coupled between the node of potential VA and a node N_Z (Z=1, 2, 3, or 4). The transistor TP17_Z receives the output of an OR gate OR13_Z at the gate. The OR gate OR13_Z receives, among all the signals E0L, E1L, E2L, E3L, and E4L, all signals except for the corresponding signal EZL.

According to the fifth embodiment, the magnetic thin wires for data storage ML_0 to ML_5, and magnetic thin wire for data transmission (or, passage) ML_6 are provided. A voltage application to non-ends of a magnetic thin wire is used to carry out motion only in a voltage-applied part to transfer to-be-accessed data in the magnetic thin wires for data storage ML_0 to ML_5 to the magnetic thin wire for transmission ML_6. The to-be-accessed data is further transferred in the magnetic thin wire ML_6 to the MTJ structure MTJ. Such arrangement allows a single MTJ structure MTJ to be shared by multiple magnetic thin wires ML. This can decrease the number of control elements which accompany the MTJ structures MTJ, and reduces the area of the chip of the magnetic memory device.

Sixth Embodiment

The sixth embodiment relates to a structure of the fifth embodiment.

FIG. 28 illustrates an example of a cross-sectional view of a part of a magnetic memory device utilizing magnetic domain wall motion according to the sixth embodiment. MOSFETs T are formed on the surface of the substrate sub. The transistors T serve as transistors which configure various circuits of the magnetic memory device MD, and as transistors described in other embodiments. Each transistor T includes a gate insulating film (not shown) on the substrate sub, a gate electrode G on the insulating film, and source/drain areas SD which sandwich a channel region under the gate electrode in the substrate sub.

Above the transistors T, magnetic thin wires ML 11 to ML1_14 are formed in different layers along (or, in parallel) with the substrate sub. The magnetic thin wires ML_11 to ML14 have the same features as the magnetic thin wire ML of the embodiments described so far, and store data. The magnetic thin wire MLs (ML_11 to ML_14) are coupled at the bottoms to source/drain areas SD via contacts C11 on source/drain areas SD, interconnects LY11 on the contacts C11 and contacts C12 on the interconnects LY11. A section of each magnetic thin wire ML including a section connected to a contact C12 is included in a data transfer area DTA0, and is used to transfer data. A section of each magnetic thin wire ML other than the data transfer area DTA0 is included in the memory area DSA, and is used to store data.

Non-lowest magnetic thin wires ML_12 to ML_14 are coupled, at ends at the side of the data transfer area DTA0, to a magnetic thin wire MLV. The magnetic thin wire MLV has the same features as other magnetic thin wires ML, extends along the direction perpendicular to the surface of the substrate sub, and is included in the data transfer area DTA1. The magnetic thin wire MLV is used to transfer data as the magnetic thin wire ML_6 of the fifth embodiment. The lowest magnetic thin wire MLV is coupled at the bottom to the lowest magnetic thin wire ML_11. The magnetic thin wire ML_11 sandwiches at the bottom a tunnel insulating film (not shown) with a pinned layer PL, and makes an MTJ structure MTJ for reads/writes. The pinned layer PL is also coupled to a source/drain area SD via the contacts C11, C12, and interconnect LY11.

The structure illustrated in FIG. 29 is also possible. The FIG. 29 example differs from the FIG. 28 example in a structure of the interconnection including contacts. In the FIG. 29 example, the magnetic thin wires ML (ML_11 to ML_14) are coupled, at the tops at the ends in the data transfer area DTA0, to respective contacts C13. The contacts C13 are coupled at the tops to the bottom of an interconnect LY13. The interconnect LY13 is coupled at the bottom to contacts C14. The contacts C14 are coupled to interconnects LY11. The lowest magnetic thin wire ML 11 is coupled at the bottom to a contact C15. The contact C15 is coupled at the top to an interconnect LY13. The interconnect LY13 is coupled at the bottom to a contact C14, which is coupled at the bottom to an interconnect LY11.

The section where the magnetic thin wires ML and contacts C13 are connected is illustrated in FIG. 30 in detail. Additional magnetic thin wires ML 11 are provided also in a sectional view different from FIG. 29, and straight-line features of the magnetic thin wire ML_11 are coupled to each other at the end. Thus, magnetic thin wire ML_11 has a comb-like plane shape. Similarly, magnetic thin wires ML_12 to ML_14 have a comb-like form. The magnetic thin wires ML_12 to ML_14, however, have different areas of the connection section where the straight-line features are coupled to each other. Specifically, a higher magnetic thin wire ML has a smaller area of the interconnection section in the comb-like than a lower magnetic thin wire ML. The contacts C13 for different magnetic thin wires ML are provided in different perpendicular positions.

According to the sixth embodiment, the structure of the fifth embodiment can be implemented to obtain the same advantages as the fifth embodiment.

Seventh Embodiment

The seventh embodiment relates to the combination of the second and sixth embodiments.

Figure 31:
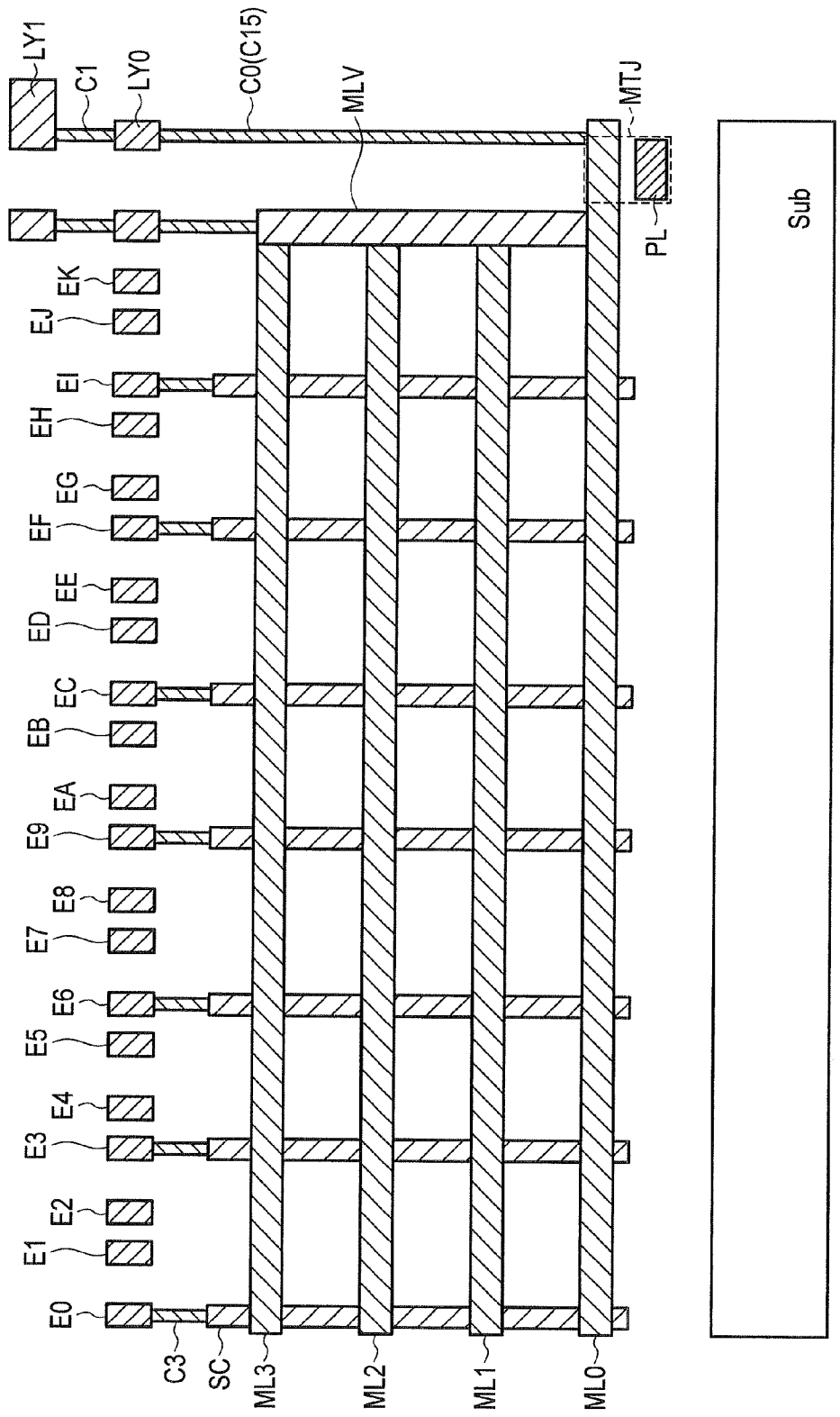
FIG. 31 illustrates an example of a cross-sectional view of a part of a magnetic memory device utilizing magnetic domain wall motion according to a seventh embodiment.

FIG. 31 illustrates an example of a sectional-view of a part of a magnetic memory device utilizing magnetic domain wall motion according to the seventh embodiment. In addition to the structures of the magnetic thin wires ML, electrodes E, and contacts SC and C3 of FIG. 13 of the second embodiment, non-lowest magnetic thin wires ML1 to ML3 are coupled, at the ends at the same side, to the magnetic thin wire MLV. The magnetic thin wire MLV extends along the direction perpendicular to the surface of the substrate sub, and is coupled at the bottom to the magnetic thin wire ML0. The magnetic thin wire ML0 is coupled at the top to the contact C0 (or, C15). The magnetic thin wire MLV is used to transfer data. The magnetic thin wire ML0 sandwiches, at the bottom, a tunnel insulating film (not shown) with a pinned layer PL to make an MTJ structure MTJ for reads/writes. Thus, a single MTJ structure MTJ is formed for the magnetic thin wire ML0 to ML3. This is contrastive to a single MTJ structure MTJ being provided for each magnetic thin wire ML as in the second embodiment (FIG. 13). The magnetic domain walls are moved in the magnetic thin wires MLV by current application.

According to the seventh embodiment, the advantages of the second and sixth embodiments can be obtained.

Eighth Embodiment

The eighth embodiment relates to the combination of the third and sixth embodiments.

Figure 32:
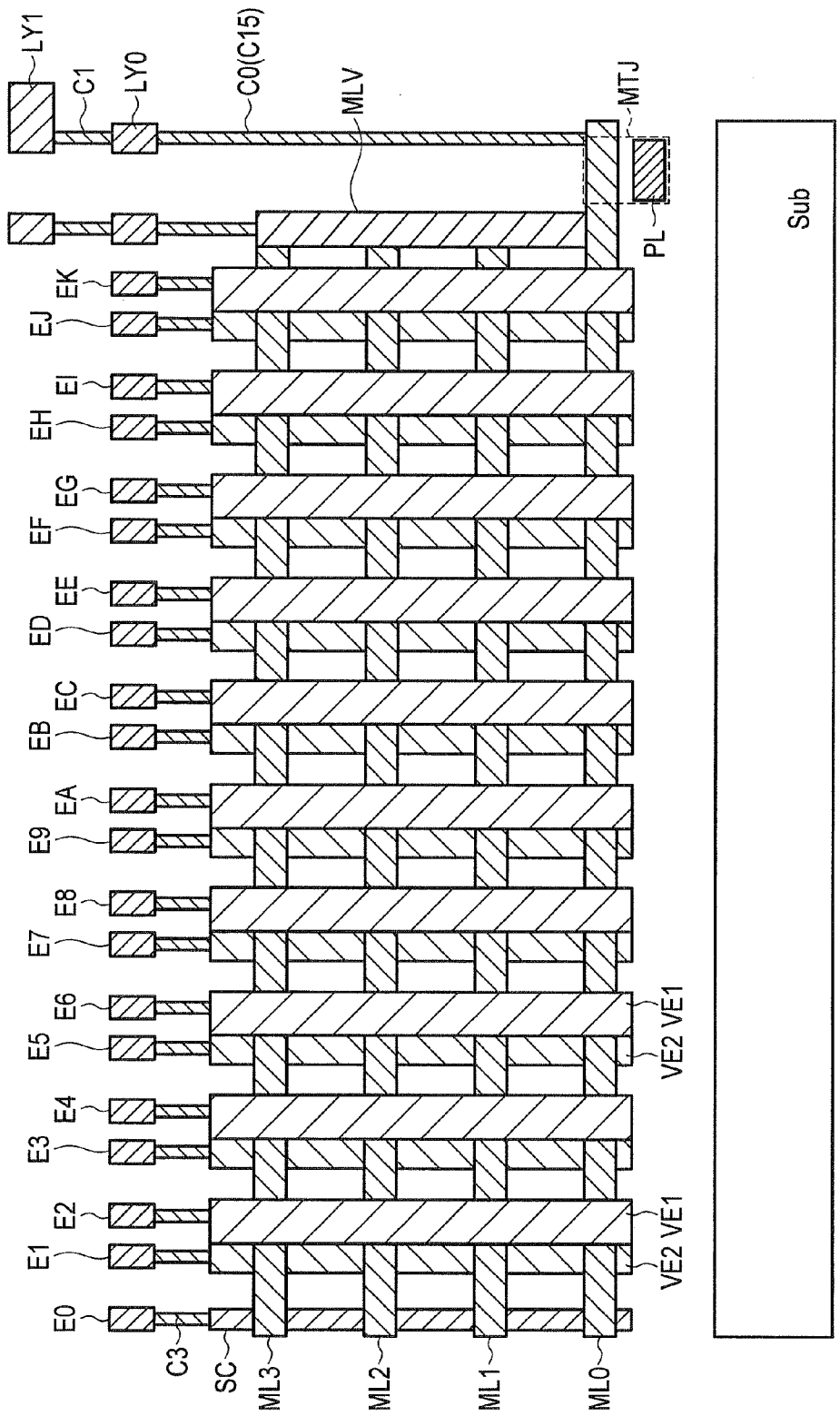
FIG. 32 illustrates an example of a cross-sectional view of a part of the magnetic memory device according to an eighth embodiment.

FIG. 32 illustrates an example of a sectional-view of a part of a magnetic memory device utilizing magnetic domain wall motion according to the eighth embodiment. In addition to the magnetic thin wires ML, electrodes E, VE1 and VE2, and contacts SC and C3 of FIG. 20 of the third embodiment, non-lowest magnetic thin wires ML1 to ML3 are coupled, at the ends at the same side, to a magnetic thin wire MLV. The magnetic thin wire MLV extends along the direction perpendicular to the surface of the substrate sub, and is coupled at the bottom to the lowest magnetic thin wire ML0. The magnetic thin wire ML0 is coupled at the top to the contact C0 (or, C15). The magnetic thin wire MLV is used to transfer data. The magnetic thin wire ML0 sandwiches, at the bottom, a tunnel insulating film (not shown) with a pinned layer PL to make an MTJ structure MTJ for reads/writes. Thus, a single MTJ structure MTJ is formed to the magnetic thin wires ML0 to ML3. This is contrastive to a single MTJ structure MTJ being provided for each magnetic thin wire ML as in the third embodiment (FIG. 20). The magnetic domain walls are moved in the magnetic thin wires MLV by current application.

According to the eighth embodiment, the advantages of the third and sixth embodiments can be obtained.

Ninth Embodiment

The ninth embodiment relates to a structure of a magnetic thin wire.

Magnetic domain walls need to stay stably if there is no external force for moving the magnetic domain walls, such as force by current or voltage, applied to the magnetic thin wire. The magnetic domain walls, however, may vibrate slightly due to, for example, thermal energy to result in unintentional motion. In order to prevent such migration, it is proposed forming a pinning site in a magnetic thin wire (see, for example, U.S. Pat. No. 7,551,469). The pinning site can be implemented by narrowing the magnetic thin wire in a part than other parts, or forming constriction. Therefore, a pinning site has a cross section smaller than other parts. FIG. 33 illustrates a related art of the ninth embodiment, and illustrates a magnetic thin wire with pinning sites and a current source and a current sink for moving the magnetic domain walls. FIG. 33 also illustrates states at time t=t0, t1, and t2 with a current pulse as shown in FIG. 34 (illustrated as potential of a node N101) applied.

The magnetic thin wire 110 has pinning sites PS102, PS103, and PS104 at equally-spaced nodes N102, N103, and N104, respectively. Each area between a pair of the end nodes N101 and N105 and pinning sites PS10 (PS102, PS103, and PS104) of the magnetic thin wire 110 defines a magnetic domain, i.e., has a single magnetization direction, and stores 1-bit information. Specifically, at time t0, magnetic domains A to D are formed between the nodes N101 and N102, nodes N102 and N103, nodes N103 and N104, and nodes N104 and N105, respectively. The boundaries of magnetic domains are located at the pinning sites PS102 to PS104. The node N105 is coupled to the power supply node, and the node N101 is coupled to the current sink ISN11.

At time t0, with a current conducted from the node N105 to the node N101 in the magnetic thin wire 110 while an enable signal EN for the current sink ISN11 is high, magnetic domain walls move in a direction of the current, i.e., to the node N105. In other words, with an electron flow passed from the node N101 to node N105, the magnetic domain walls move to the same direction as the electron flow. If the current larger than a threshold flows, the magnetic domain walls move.

Because of an RC delay of the magnetic thin wire 110, a time for the current to reach the threshold for moving the magnetic domain walls from the start of the flow of the current depends on the position of the nodes as illustrated in FIG. 34. As described above, in order for the magnetic domain walls to move from the node N101 to the node N105, an electron flow is passed from the node N101 to the node N105. FIG. 34 illustrates such an electron flow (shown as a current), and potentials of nodes in the absolute values.

A current pulse illustrated as the potential of the node N101 is applied from time t0 to t1. A delay at the node N102 is small, and therefore after the current pulse rises at time t0, the potential of the node N102 exceeds the threshold promptly. As a result, the magnetic domain walls between the magnetic domains A and B move to the node N105 to reach the next pinning site PS103 at the time t2, and stabilize there.

In contrast, the potential of the node N103 rises slowly, and therefore at time t1 the move has not progress sufficiently yet and the magnetic domain walls between the magnetic domains B and C have not reached the node N104.

For this reason, the magnetic domain walls between the magnetic domains B and C are pushed back to the node N103 by the magnetic domain C by the time t2, and the magnetic domain B disappears.

To address such a phenomenon, the magnetic thin wire ML of the ninth embodiment is configured as shown in FIG. 35. FIG. 35 illustrates a structure of the magnetic thin wire ML according to the ninth embodiment, and related features. FIG. 35 also illustrates states at times t0, t1, and t2 with a current pulse applied, which is illustrated as a potential change of the node N101 of FIG. 34.

The magnetic thin wire ML is coupled to a current sink (or, an electron source) S1, and a power supply node (or, an electron sink) at both end nodes Na and Ne, respectively. The magnetic thin wire ML has nodes Nb, Nc, and Nd in the mentioned order from the end node Na to the node Ne. The nodes Nb, Nc, and Nd are in unequally-spaced positions between the end nodes Na and Ne. Specifically, a further adjacent-node-pair from the current sink ISN11 (or, the node Na) has a shorter distance between the pair. More specifically, the distance becomes smaller in order of the distance between nodes Na and Nb, between the nodes Nb and Nc, between the nodes Nc and Nd, and between the nodes Nd and Ne. The magnetic thin wires ML have pinning sites PSb, PSc, and PSd at the nodes Nb, Nc, and Nd, respectively. Therefore, a pinning-site-pair farther from the current sink has a smaller distance between the pair.

With a current pulse as illustrated in FIG. 34 applied to the magnetic thin wire ML of a structure as illustrated in FIG. 35, magnetic domain walls move as follows.

At time t0, magnetic domains A to D are formed between the nodes Na and Nb, nodes Nb and Nc, nodes Nc and Nd, and nodes Nd and Ne, respectively. The boundaries of the magnetic domains are located in the pinning sites PSb, PSc, and PSd.

When the current pulse rises at time t0, a current at the node Nb exceeds a threshold immediately, and the magnetic domain walls between the magnetic domains A and B move toward the node Ne. The magnetic domain wall between the magnetic domains A and B starts to move earliest from the start of the application of the current pulse, and therefore a time spent for the motion needs to be long. To this end, the interval between the nodes Na and Nb is made longer than that between the nodes Nb and Nc. For this reason, the magnetic domain wall between the magnetic domains A and B has not reached the node C at time T0 yet, and finally reaches it at time t2.

When the value of a current at the node Nc reaches the threshold after the value of the current at the node Nb reaches the threshold, the magnetic domain wall between the magnetic domains B and C moves toward the node Ne. The magnetic domain wall between the magnetic domains B and C starts to move with a delay from the start of the application of the current pulse, and therefore takes longer than the time spent for the magnetic domain wall between the magnetic domains A and B to move. Therefore, the distance between the node Nc and the next node Nd in the moving direction is made shorter than that between the nodes Nb and Nc. This enables the magnetic domain wall between the magnetic domains B and C to reach the node Nd at time t2.

Similarly, when the value of a current at the node Nd reaches the threshold after the value of the current at the node Nc reaches the threshold, the magnetic domain wall between the magnetic domains C and D moves toward the node Ne. The magnetic domain wall between the magnetic domains C and D starts to move with a larger delay from the start of the application of the current pulse, and therefore takes longer than the time spent for the magnetic domain wall between the magnetic domains B and C to move. Therefore, the distance between the node Nd and the next node Ne in the moving direction is made shorter than that between the nodes Nc and Nd. This enables the magnetic domain wall between the magnetic domains C and D to reach the node Ne at time t2.

Thus, a data loss is prevented even with a waveform as in FIG. 34, unlike the FIG. 33 example.

The description so far relates to the example of the magnetic domain wall motion by current application. The present embodiment is, however, also applicable to an example of magnetic domain wall motion by electric field application. Further, in the example of the magnetic domain wall motion by electric field application, the magnitude of field varies depending on the position in the magnetic thin wire ML due to the RC delay. For this reason, the data loss can be prevented also in the example of the magnetic domain wall motion in the magnetic thin wire which has pinning sites at irregular intervals due to electric field application.

The description so far relates to the example of the magnetic thin wire ML with four magnetic domains. A magnetic thin wire ML with less or more magnetic domains can, however, be implemented in accordance with the principle described above.

According to the ninth embodiment, the magnetic thin wire ML has multiple pinning sites PS (PSb to PSd) with intervals which become shorter along the direction in which magnetic domain walls move. For this reason, a pinning-site interval nearer to where the electron flow is applied is longer, and it also takes more time for the magnetic domain wall to reach the next magnetic domain wall position. Therefore, times for the magnetic domain walls to reach the respective next magnetic domain wall positions are substantially the same, and each magnetic domain wall can reach the next magnetic domain wall position successfully. This serves for prevention of a particular magnetic domain wall from failing to reach the next magnetic domain wall position and the resultant loss of the data in the magnetic domain just before the magnetic domain wall along the moving direction. Therefore, even with a long magnetic thin wire ML, stable (or, without no data loss) magnetic domain wall motion is possible, and a magnetic memory device MD with a large capacity can be implemented.

Tenth Embodiment

The tenth embodiment relates to reads of data.

As described above, a magnetic thin wire ML is accompanied by at least one MTJ structure MTJ for reads or for both reads and writes. A bias current for the MTJ structure MTJ is set as the median between a current through the MTJ structure MTJ in the high resistance state, and that in the low resistance state. Upon such bias current application, the MTJ structure MTJ in the high resistance state exhibits a high voltage across the structure, and the MTJ structure MTJ in the low resistance state exhibits a low voltage across the structure. The magnitude of such terminal voltage is detected to determine the data.

The magnetoresistance ratio (MR) of the MTJ structure MTJ is now about 100% in magnitude with MgO used for its tunnel insulating film TIL. However, if the tunnel resistance of the MTJ structure MTJ deviates by 100% due to unintended process variation of the tunnel insulating films TIL, the change in resistance of the MTJ structure MTJ cannot be detected. Specifically, if the resistance of the MTJ structure MTJ is more than twice the intended value, the MTJ structure MTJ always exhibits the high terminal voltage in response to application of a fixed bias current, i.e., the MTJ structure MTJ is always determined to be in the high resistance state. Similarly, if the resistance of the MTJ structure MTJ is less than half the intended value, the MTJ structure MTJ always exhibits the low terminal voltage in response to application of a fixed bias current, i.e., the MTJ structure MTJ is always determined to be in the low resistance state. This results in impossibility of distinguishing values of data.

Figure 36:
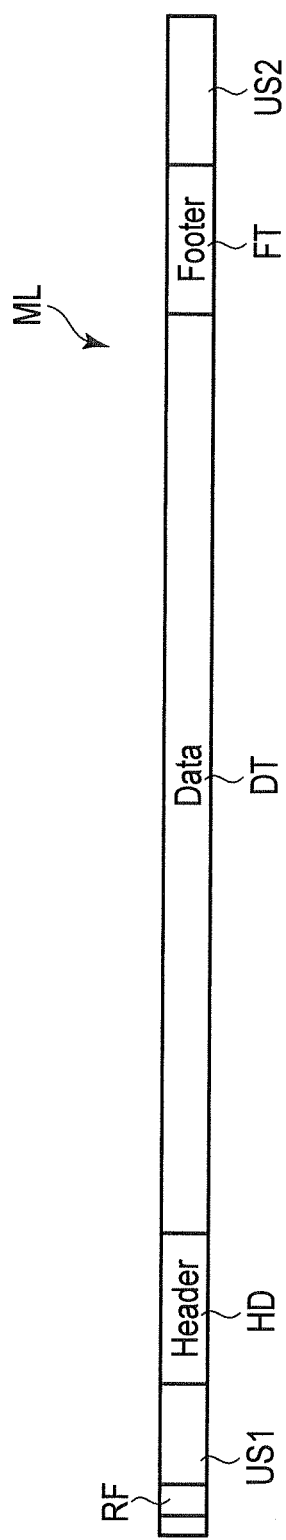
FIG. 36 illustrates types of areas in the magnetic thin wire according to a tenth embodiment.

To address the phenomenon described above, a magnetic memory device MD in the tenth embodiment is configured as follows. FIG. 36 illustrates types of areas in the magnetic thin wire ML according to the tenth embodiment. The magnetic thin wire ML includes an unused area US1, a header (or, preamble) HD, a data area DT, footer (or, postamble) FT, and an unused area US2 in the mentioned order from one end to the other end. The unused areas US1 and US2 are not used for storing data, and positions thereof are recognized by the magnetic memory device MD (or, sequencer SQ). The feature designated by reference number RF will be described later.

Figure 37:
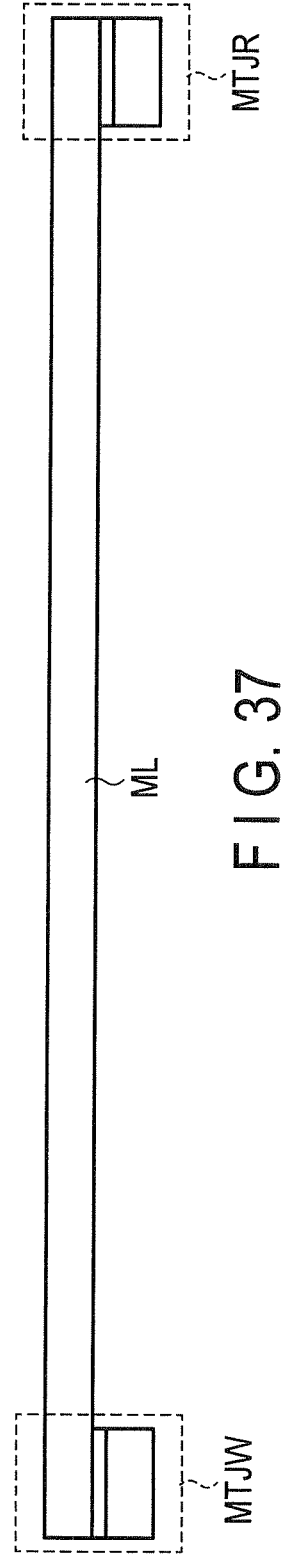
FIG. 37 illustrates a magnetic thin wire and a MTJ structure according to the tenth embodiment.

As illustrated in FIG. 37 and described above, the magnetic thin wire ML sandwiches in its part a tunnel insulating film TIL (not shown) with a pinned layer PL to form an MTJ structure MTJ. FIG. 37 illustrates the magnetic thin wire and the MTJ structure MTJ of the tenth embodiment. In the FIG. 37 example, an MTJ structure MTJW for writes and an MTJ structure MTJR for reads are formed at the both ends of the magnetic thin wire ML, respectively. The MTJ structure MTJR serves for reading data in the magnetic layer ML in the section (or, magnetic domain) in the MTJ structure MTJR.

The MTJ structure MTJW serves for writing data in the magnetic layer ML in the section in the MTJ structure MTJW.

In the tenth embodiment, the magnetic thin wire ML of any form can be used, and a structure of FIG. 39 is also possible. The magnetic thin wire ML has a U-like shape as illustrated in FIG. 39. In the case of the FIG. 39 example, the MTJ structure MTJ is formed at the center of the U-letter of the magnetic thin wire ML. The MTJ structure MTJ serves for reading and writing data in the section (or, magnetic domain) in the MTJ structure MTJ. In this case, areas in the magnetic thin wire ML are defined as shown in FIG. 38. Only half the area of the magnetic thin wire ML is used.

FIG. 40 illustrates an example of a part of a circuit of the magnetic memory device according to the tenth embodiment, and illustrates a part of a cell array CA, row decoder RD, and current source/sink SC. Each magnetic thin wire ML belongs to one of the $0^{th}$ the $m^{th}$ rows, and also to one of the $0^{th}$ to $n^{th}$ columns. The magnetic thin wires ML of the $0^{th}$ column are coupled at first ends to a line (or, an electrode for motion) SFL0, and at second ends to a line (or, an electrode for motion) SFR0. Similarly, the magnetic thin wires ML of the $V^{th}$ (V=0 to n) column are coupled at first ends to a line SFLV, and at second ends to a line SFRV.

Each magnetic thin wire ML is accompanied by an MTJ structure MTJ. Each MTJ structure MTJ is used to read data from a corresponding magnetic thin wire ML, and optionally to write data to that magnetic thin wire ML. Each MTJ structure MTJ is coupled at a first end to a corresponding row select transistor RST. The select transistor RST is made of an n-type MOSFET. Transistors RST of the $0^{th}$ column are coupled to a word line WL0 at the gates. Similarly, transistors RST of the $V^{th}$ column are coupled to a word line WLV at the gates. Transistors RST of the $0^{th}$ row are coupled at the second ends to a bit line BL0. Similarly, transistors RST of the $W^{th}$ (W=0 to m) row are coupled at the second ends to a bit line BLW. The word lines WL (WL0 to WLn) and signal lines SFL (SFL0 to SFLn) and SFR (SFR0 to SFRn) are controlled by a row decoder RD and current source/sink SC.

The row decoder RD and current source/sink SC include OR gates OR21, OR22, OR23, OR24, and OR25, AND gates AND11, AND12, and AND13, and NAND gates NAND11, and NAND12 for a single column. The figure only illustrates features for the word line WL0.

The OR gate OR21 receives signals RD, WR1, and SFTR from the sequencer SQ, and supplies the output to the AND gate AND11. The OR gate OR22 receives signals WR0 and SFTL from the sequencer SQ, and supplies the output to the NAND gate NAND11. The OR gate OR23 receives the signal RD and a signal WR from the sequencer SQ, and supplies the output to the AND gate AND13. The OR gate OR24 receives the signals RD, WR0, and SFTL from the sequencer SQ, and supplies the output to the AND gate AND12. The OR gate OR25 receives the signals WR1 and SFTR from the sequencer SQ, and supplies the output to the NAND gate NAND12.

The AND gates AND11, AND12 and AND13, and the NAND gate NAND11 and NAND12 further receive row adds RowAdd. The output of the AND gate AND13 is supplied to the corresponding word line WL0. The AND gate AND11 and NAND gate NAND11 supply respective outputs to respective gates of an n-type MOSFET TN21 and p-type MOSFET TP21, respectively. The transistors TP21 and TN21 are coupled in series between the power node and ground node, and the connection node is coupled to the signal line SFL0. The AND gate AND12 and NAND gate NAND12 supply respective outputs to respective gates of an n-type MOSFET TN22 and p-type MOSFET TP22, respectively. The transistors TP22 and TN22 are coupled in series between the power node and ground node, and the connection node is coupled to the signal line SFR0.

The signal RowAdd is made high when the corresponding row is selected. The signal RD is made high during a data read. The signal WR is made high during a write, and further, while 0-data and 1-data writes are executed, signals WR0 and WR1 are respectively made high to respectively instruct a write of 0-data and that of 1-data in a write-target cell (or, write-target magnetic domain in the MTJ element MTJ). The signals SFTR and SFTL are made high to move the magnetic domain walls in the magnetic thin wire ML rightward and leftward in FIG. 40, respectively. With the combination of the signals in logics described above, the word line WL of a column selected by the row address signals RowAdd transitions to high during a read. Moreover, a 1-data write current or 0-data write current flows in a column selected by the row address signals RowAdd. Furthermore, the magnetic thin wire ML has its magnetic domains moved rightward or leftward in a column selected by the row address signals RowAdd. The column decoder CS (see, FIG. 1) further selects a single column (or, a bit line BL).

The set of the OR gates OR21, OR22, OR23, OR24, and OR25, AND gates AND11, AND12, and AND13, and NAND gates NAND11, and NAND12 is also provided for word lines WL other than the word line WL0.

Figure 41:
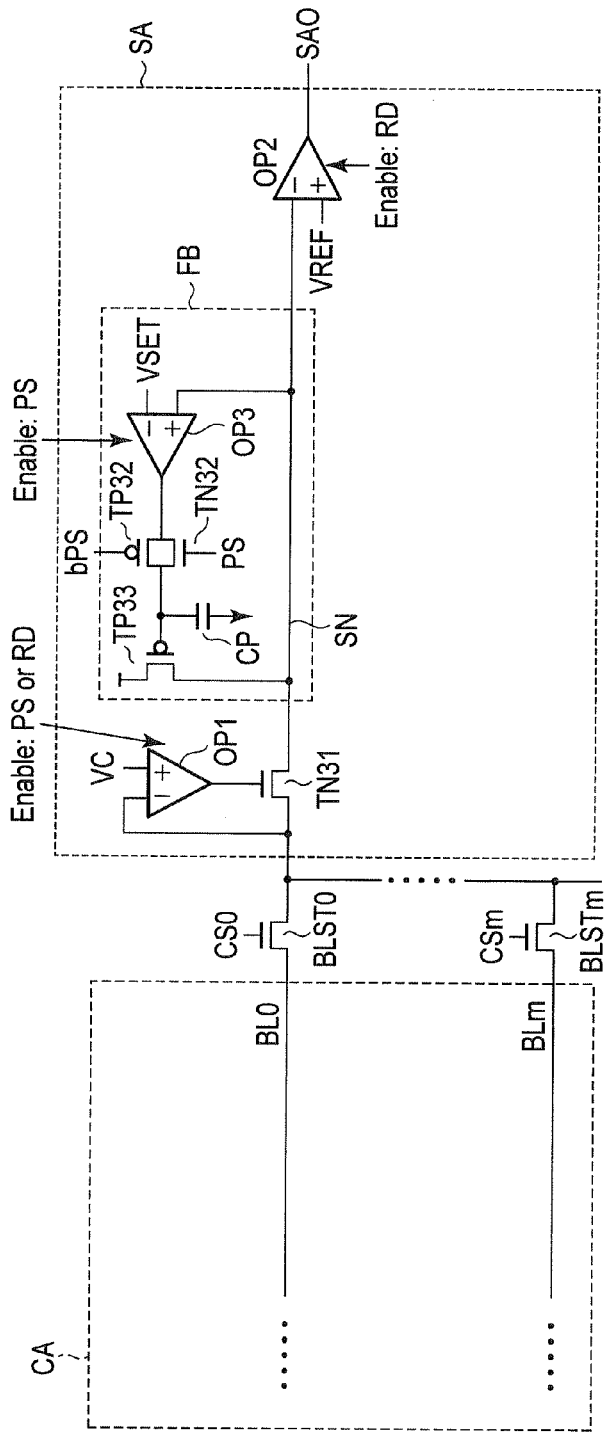
FIG. 41 illustrates an example of another part of the circuit of the magnetic memory device according to the tenth embodiment.

FIG. 41 illustrates an example of another part of a circuit of the magnetic memory device according to the tenth embodiment, and illustrates a part of a cell array CA and sense amplifier SA. The bit lines BL0 to BLm are coupled to one end of each of column select-transistors BLST0 to BLSTm, respectively. The transistors BLST0 to BLSTm are each made of an n-type MOSFET, and receive at respective gates column selection signals CSL0 to CSLm from the column decoder CD, respectively. The other end of each of the transistors BLST0 to BLSTm is coupled to one end of an n-type MOSFET TN31 for a clamp. The transistor TN31 receives the output of an operational amplifier OP1 at the gate. The operational amplifier OP1 is coupled to one end of the transistor TN31 at the inverting input, receives a clamp potential VC at the non-inverting input, and is enabled while it is receiving a signal PS or RD. The transistor TN31 clamps the other end (or, sense node SN) of the transistor SN to a particular potential while the operational amplifier OP1 is enabled.

The sense node SN is coupled to the inverting input end of an operational amplifier OP2. The operational amplifier OP2 is enabled with signal RD received, receives a reference potential VREF at the non-inverting input, and outputs a sense amplifier output SAO. The magnitude of the reference potential VREF is determined in accordance with a principle, which will be described later.

The sense node SN further includes a feedback loop FB. The feedback loop FE includes an operational amplifier OP3, p-type MOSFETs TP32 and TP33, an n-type MOSFET TN32, and a capacitor CP. The sense node SN is coupled to the non-inverting input end of the operational amplifier OP3. The operational amplifier OP3 is enabled while it is receiving the signal PS, and receives a potential VSET of a particular magnitude at the inverting input. The output of the operational amplifier OP3 is coupled to one end of each of transistors TN32 and TP32. The transistors TN32 and TP32 receive at respective gates a signal PS and its inverted signal bPS, respectively. The other end of each of transistors TN32 and TP32 is grounded through the capacitor CP and coupled to the gate of the transistor TP33. The transistor TP33 is coupled between the power node and sense node SN. The transistor TP33 adjusts and supplies a bias current to the sense node SN.

The operation of the magnetic memory device of the tenth embodiment will now be described with reference to FIGS. 41 to 45. Generally, at the stage where a magnetic thin wire and a pinned layer which make an MTJ structure with a part of the magnetic thin wire have been formed, the magnetic moment of the pinned layer may not be aligned as well as small due to unnecessary magnetic domains generated therein. This suppresses the MR of the MTJ structure. In order to increase the MR of the MTJ structure, a magnetic field is applied to the MTJ structure after the MTJ structure or magnetic memory device MD is formed. This process aligns the magnetic moment of the pinned layer, and that of a part of the magnetic thin wire facing the pinned layer, which will be referred to as a storage part, during the magnetic field application. In other words, the magnetization direction of the pinned layer and that of the storage part become parallel. Then, in the tenth embodiment, the storage part, whose magnetization direction is known to be parallel with the pinned layer, is used to adjust a bias current.

Figure 43:
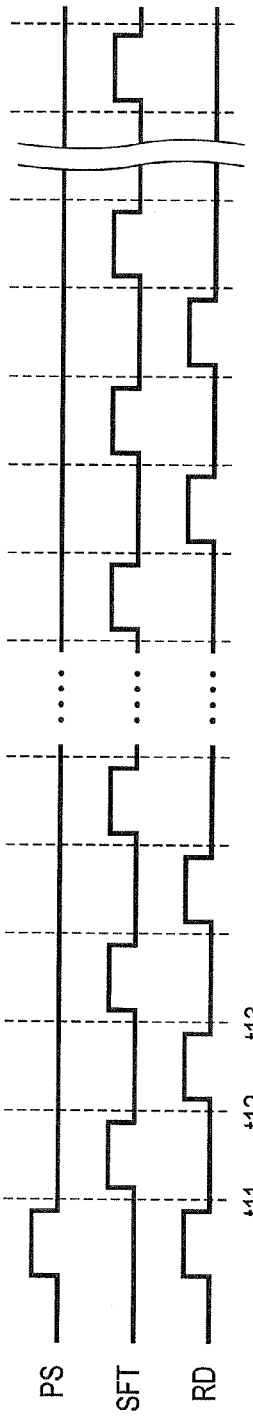
FIG. 43 illustrates a timing chart of potentials of some signals of the magnetic memory device according to the tenth embodiment.
Figure 42:
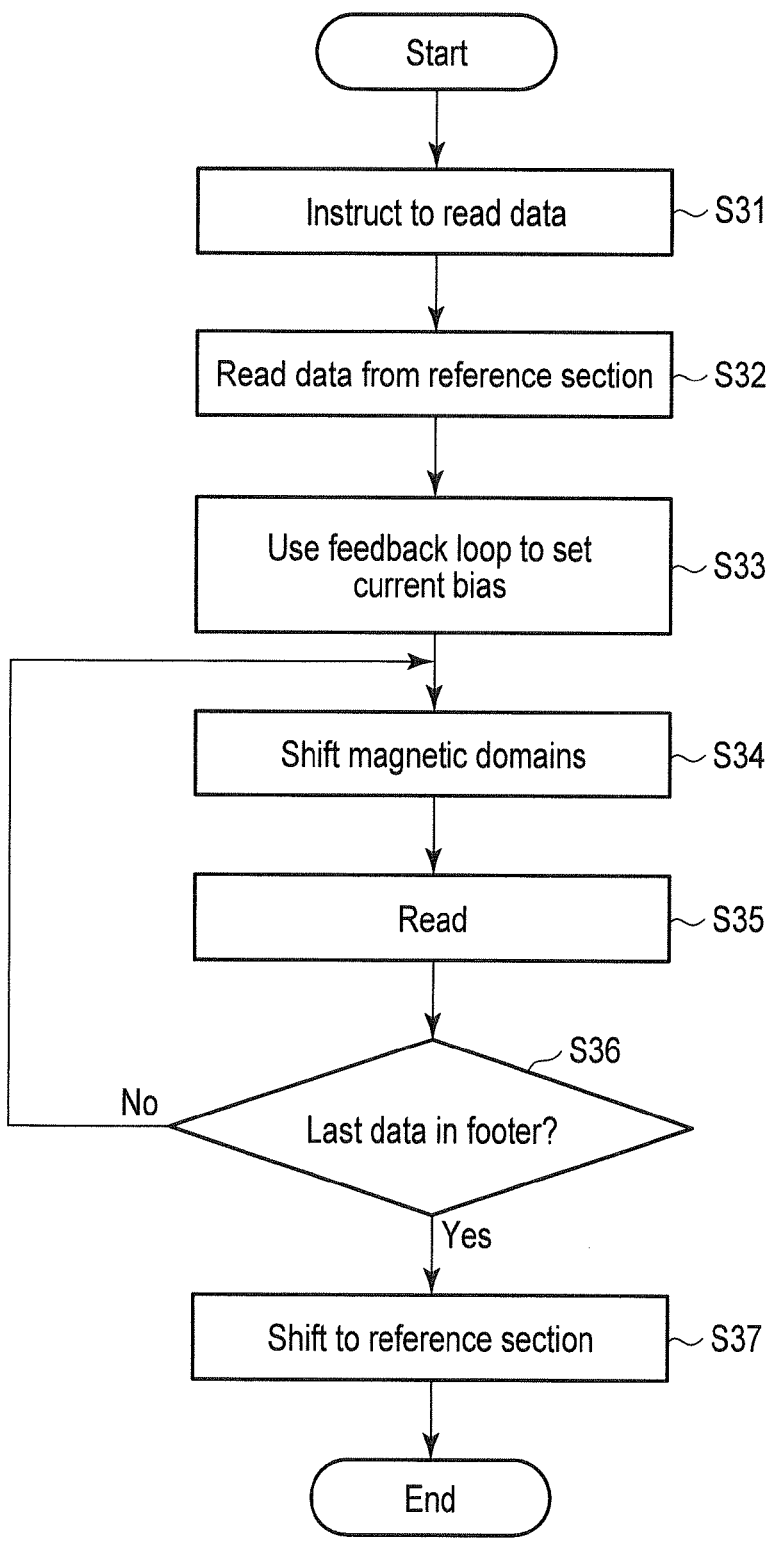
FIG. 42 illustrates an example of a read flow of the magnetic memory device according to the tenth embodiment.

First, a magnetic field is applied to the pinned layer PL as described above to improve the MR ratio while at least one of magnetic domains (to be referred to a reference section RF) in the unused area US1 is located in the MTJ structure MTJ before the shipment. The position of the reference section RF (as illustrated in FIG. 36) is recognized by the magnetic memory device MD. The reference section may include multiple magnetic domains, and may be the whole unused area US1. A magnetic field of an appropriate magnitude can make the magnetization direction of not only the section facing the pinned layer PL but also its peripheral or even all magnetic domains in the magnetic thin wire ML parallel with the magnetization direction of the pinned layer PL. Then, the magnetic memory device MD of the tenth embodiment executes reads in accordance with the flow of FIG. 42 after being shipped. FIG. 42 illustrates an example of a read flow of the magnetic memory device MD according to the tenth embodiment. The magnetic memory device MD, especially the sequencer SQ is configured to execute the FIG. 42 flow. FIG. 43 is a timing chart for some signals of the magnetic memory device according to the tenth embodiment, and is a timing chart of some signals involved in execution of the FIG. 42 flow.

As illustrated in FIG. 42, the magnetic memory device MD receives an instruction to read data in a particular magnetic domain in a particular magnetic thin wire ML (step S31). In response to reception of this instruction, the sequencer SQ controls related features to execute a read in the reference section RF in the read-target magnetic thin wire ML (step S32). Specifically, before time t11, the sequencer SQ first makes the signal PS of FIG. 40 high (and the signal bPS low), and reads the data in the reference section RF as illustrated in FIG. 41. This state corresponds to a state of an MTJ structure MTJ in the low resistance state being read. Formation of this state makes the potential of the gate of the transistor TP33 autonomously settled to a magnitude which equalizes the potential of the sense node SN with the potential VSET by the work of the feedback loop FB.

In step S33, the sequencer SQ determines the current bias. Specifically, the sequencer SQ makes the signals PS and bPS low and high level, respectively, and disconnects the feedback loop FB from the sense node SN (or, disables the feedback loop FB). This results in the voltage at the gate of the transistor TP33 stored in the capacitor CP. This in turn forms a state where the voltage of the automatically-determined magnitude keeps biasing the gate of the transistor TP33.

In step S34, the sequencer SQ makes the signal SFT high from time t11 to t12. The transitioned high signal SFT makes components involved in the magnetic domain wall motion, such as the logical gates in the row decoder RD and current source/sink SC in FIG. 38, operate to move the read-target magnetic domain into the MTJ structure MTJ. After the motion, the sequencer SQ makes signal RD high from time t12 to t13. The transitioned high signal RD makes components involved in the read, such as the logical gates in the row decoder RD and current source/sink SC in FIG. 38, operate to read the data in the read-target magnetic domain (step S35).

With the magnetization direction of the read-target magnetic domain parallel with that of the pinned layer PL, the sense node SN has the same potential as the potential VSET. This is because the bias current by the transistor TP33 is adjusted through the adjusted gate potential of the transistor TP33 to equalize the sense node SN to the potential VSET during the read of the data from the magnetic domain with the magnetization direction parallel to that of the pinned layer PL. In contrast, the magnetization direction of the read-target magnetic domain antiparallel with that of the pinned layer PL results in the high resistance of the MTJ structure MTJ, which in turn results in the higher potential of the sense node SN than the potential VSET. Then, the reference potential VREF is set higher than the potential VSET and lower than the potential of the sense node SN upon the read of the data from a magnetic domain with the magnetization direction antiparallel to that of the pinned layer PL. The potential of the sense node SN upon the read of the data from the magnetic domain with the antiparallel magnetization direction can be calculated from a theoretical value. This is because the resistances of the tunnel insulating films of the MTJ structures may greatly vary by the variation in property whereas the MR ratios of MTJ structures agree well with the theoretical values. Thus determined reference potential VREF can distinguish the parallel state and antiparallel state of the MTJ structure MTJ. Specifically, the reference potential VREF is 0.8 times the potential VSET.

Thus, for each MTJ structure MTJ, the bias current for a read which involves that MTJ structure MTJ is determined. The determined bias current is then used to execute a read. This means that variations in the properties of the MTJ structures MTJ due to variations in the properties of tunnel insulating films TIL are corrected.

In step S36, the sequencer SQ determines whether all read-target data in the magnetic thin wire ML has been read. For example, with the whole of the header HD, data area DT, and footer FT in a particular magnetic thin wire ML to be read, the determination of step S36 corresponds to whether the last piece of data in the footer FT has been read. With unread data, the flow returns to step S34.

When the determination at step S36 is Yes, the flow shifts to step S37. In step S37, the sequencer SQ controls related components to return the read position to the reference section RF in the magnetic thin wire ML. Specifically, the sequencer SQ moves the reference section RF back into the MTJ structure MTJ. The sequencer SQ moves the reference section RF back into the MTJ structure MTJ whenever a read or write in the magnetic thin wire ML is completed.

According to the tenth embodiment, the read from the magnetic domain with known stored-data is used to determine, for each MTJ structure MTJ, a bias current for a read involving that MTJ structure MTJ. The determined bias current is then used to execute the read. This results in correction of property variations in the MTJ structures MTJ due to property variations in the tunnel insulating films TIL during reads. This can in turn implement the magnetic memory device MD in which reads are possible even with property variations among components.

Eleventh Embodiment

The eleventh embodiment relates to the arrangement of a cell array and related components based thereon.

FIG. 44 illustrates functional blocks as well as a layout of a magnetic memory device utilizing magnetic domain wall motion according to the eleventh embodiment. The magnetic memory device MD includes multiple sets of a cell array CA, a row controller RC (or, row decoder RD), a column controller CC (or, column decoder CD), and a domain wall motion driver SG, which will be referred to as circuit sets. A cell array CA includes blocks BLK, word lines WL, and bit lines BL. The cell array CA will be described in detail later.

A row controller RC and a column controller CC operates for a cell array CA in the same circuit set. The row controller RC controls and selects one or more rows in the corresponding cell array CA in accordance with an address signal. The column controller CC controls and selects columns in the corresponding cell array CA in accordance with the address signal, outputs read data from the cell array CA, and supplies write data to the cell array CA. The circuit sets including the row controller RC, column controller CC, and domain wall motion driver SG are arranged in a matrix.

Each pair of circuit sets adjacent in the same column is provided with a single preamplifier and write circuit PAW. A preamplifier and write circuit PAW is located between two corresponding circuit sets, and is coupled to the column controllers CC of these two circuit sets. The preamplifier and write circuit PAW receives from the coupled column controllers CC read current (or, data) from the corresponding cell arrays CA, and amplifies the received the read current with a preamplifier (or, preamplifier unit). In the illustrated example, each preamplifier and write circuit PAW is coupled to a single data line DTL through a cell array select transistor CST. The preamplifier and write circuits PAW of the same column are coupled to the same data line DTL via respective cell array select transistors CST. However, different preamplifier units and write circuit units in a preamplifier and write circuit PAW may be coupled to different data lines DTL through respective cell array select transistors CST. The data lines DTL are coupled to a sense amplifier SA and latch TL. The magnetic memory device MD includes components (or, functional blocks) illustrated in FIG. 1 in addition to the components illustrated in FIG. 44.

FIG. 45 illustrates a part of the cell array and related components and connections according to the eleventh embodiment. FIG. 45 illustrates a single cell array and related components. The magnetic memory device MD of the eleventh embodiment uses electric fields to move magnetic domain walls. The cell array CA includes magnetic thin wires ML extending along the direction (or, z direction) perpendicular to the surface of a substrate (not shown). Specific magnetic thin wires ML make, or are included in, a single block BLK. Each magnetic thin wire ML is accompanied by a single MTJ structure MTJ for reads and writes as described in other embodiments. Each magnetic thin wire ML is coupled to a row select transistor RST. Each row select transistor RST is used to select the accompanying magnetic thin wire ML, and is made of an n-type MOSFET. A magnetic thin wire ML, an MTJ structure MTJ, and a row select transistor RST are coupled in series.

Figure 46:
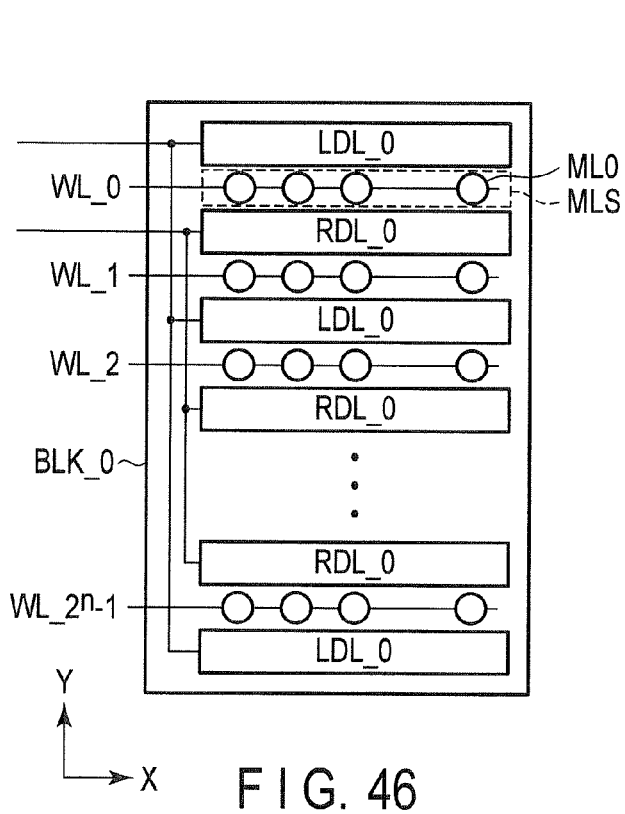
FIGS. 46 to 48 illustrate parts of the magnetic memory device of the eleventh embodiment.
Figure 48:
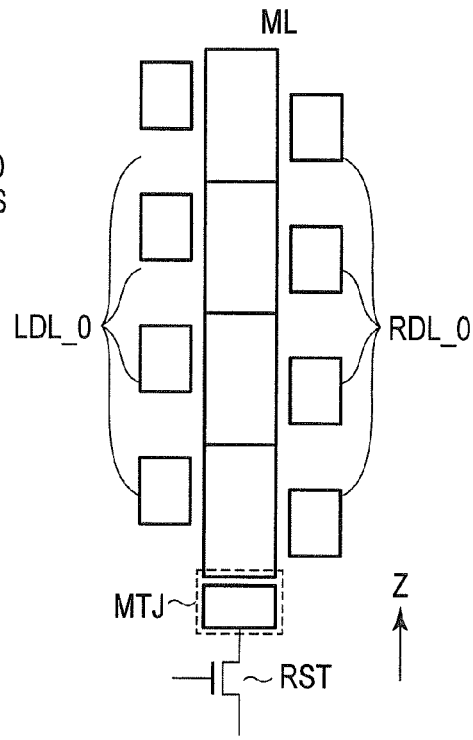
Figure 47:
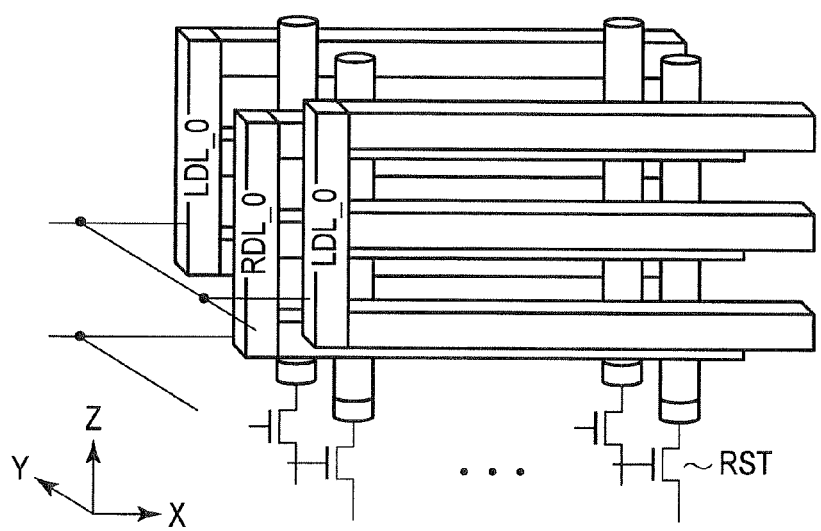

The cell array CA further includes two kinds of electrodes RDL and LDL for moving the magnetic domain walls. Receiving voltage alternately, the electrodes RDL and LDL move the magnetic domains of the magnetic thin wire ML therebetween as described for other embodiments. The structure and arrangement of the magnetic thin wires ML and electrodes RDL and LDL are illustrated in FIGS. 46 to 48 in more detail. FIGS. 46 to 48 illustrate a part of the magnetic memory device of the eleventh embodiment. Specifically, FIG. 46 is a view of a single block when seen from above. FIG. 47 is a perspective view of a single block. FIG. 48 illustrates electrodes associated with a single magnetic thin wire.

As illustrated in FIGS. 46 to 48, the magnetic thin wires ML are arranged in $2^N$ rows and $2^M$ columns in the plane made of x and y directions. The magnetic thin wires ML extend along the z direction, and are located above the substrate (not shown). Magnetic thin wires ML belonging to the same row make a set, and are referred to as a magnetic thin wire set MLS herein. Each block ELK includes multiple, for example $2^n$ ($0 \le n \le N$) magnetic thin wire sets MLS. Therefore, a cell array CA includes $2^{N-n}$ blocks of BLK_0 to BLK_$2^{N-n}$−1.

A set of (or, all) the row select transistors RST belonging to the $0^{th}$ column are coupled to a bit line BL_0 at the side opposite the MTJ structure MTJ. Similarly, a set of (or, all) the row select transistors RST belonging to the $Q^{th}$ ($0 \le Q \le 2^M-1$) column are coupled to a bit line BL_Q at the side opposite the MTJ structure MTJ.

A set of (or, all) the magnetic thin wires ML belonging to the $0^{th}$ column is also coupled to a bit line BL'_0 at the tops (or, the side opposite the MTJ structure MTJ). Similarly, the set of (or, all) the magnetic thin wires ML belonging to the $Q^{th}$ row are also coupled to a bit line BL'_Q at the side opposite the MTJ structure MTJ. The bit lines BL_0 and BL'_0 make a pair. Similarly, the bit line BL_Q and BL'_Q make a pair.

A set of (or, all) the row select transistors RST belonging to the $0^{th}$ row is coupled to a word line WL_0 at the gates. Similarly, a set of (or, all) select-transistors MLST belonging to the $R^{th}$ ($0 \le R \le Q^N-1$) row is coupled to a word line WL_R at the gates.

The block BLK_0 is provided with two types of electrode sets, i.e., a set of electrodes LDL_0, and a set of electrodes RDL_0. Similarly, a block MB_S ($0 \le S \le 2^{N-n}-1$) is provided with two types of electrode sets, i.e., a set of electrodes RDL_S and a set of electrodes LDL_S.

The electrodes LDL (LDL_0 to LDL_$2^{N-n}$−1) extend along the x-axis, and are in a line along the z-axis direction. All electrodes LDL belonging to the same block BLK are mutually coupled at a position, such as an end of that block BLK in the x-axis direction, by a connection pattern extending in the z-direction. Therefore, all electrodes LDL belonging to the same block BLK are driven to the same potential.

Similarly, electrodes RDL (RDL_0 to RDL_$2^{N-n}$−1) extend along the x-axis, and are in a line along the z-axis direction. All electrodes RDL belonging to the same block BLK are mutually coupled at a position, such as an end of that block ELK in the x-axis direction, by a connection pattern extending in the z-direction. Therefore, all electrodes RDL belonging to the same block BLK are driven to the same potential.

Furthermore, each interval between magnetic-thin-wire sets MLS is provided with a set of electrodes LDL along the z-axis or a set of electrodes RDL along z-axis. The sets of electrodes LDL in a line along the z-axis and the sets of electrodes RDL in a line along the z-axis are alternately located in a line along the y-axis. Therefore, any magnetic thin wire set MLS is provided with a set of electrodes RDL at a side along the y-axis and a set of electrodes LDL at the other side. Therefore, each magnetic thin wire ML is provided with an array of the electrodes LDL at a side, and an array of the electrodes RDL at the other side as described in other embodiments. However, the positions of the electrodes RDL on the z-axis and those of the electrode LDL on the z-axis do not match, and only a part of an electrode RDL and a part of an electrode LDL which face overlap along the z-axis.

With such arrangement of the magnetic thin wires ML and electrodes LDL and RDL, for any magnetic thin wire ML, an associated set of the electrodes LDL and an associated set of the electrodes LDL have the same relative positions to that magnetic thin wire ML as illustrated in FIG. 48.

The row controller RC includes a block-decoder/row-decoder BRD. The row controller RC selects a single block BLK and a single word line WL in a cell array CA in accordance with the received row address signals Specifically, for example, the row controller RC includes buffers IV21 coupled to respective word lines WL_0 to WL_$2^N$-1. The block-decoder/row-decoder BRD supplies a high-level signal to a particular word line WL selected in accordance with the row address signals via the corresponding buffer IV21.

The block-decoder/row-decoder BRD also outputs block select signals BSL_0 to BSL_$2^{N-n}$-1. In order to select a block BLK specified by the row address signals, the block-decoder/row-decoder BRD supplies a selected one of the block BLK_0 to BLK_$2^{N-n}$-1 with a corresponding one of block select signals BSL_0 to BSL_$2^{N-n}$-1 via the corresponding buffer IV22. The block select signals BSL_0 to BSL_$2^{N-n}$-1 are supplied to AND gates AND 31_0 to AND31_$2^{N-n}$-1, respectively. The AND gates AND31_0 to AND31_$2^{N-n}$-1 further receive the signal SFT, and output signals SFTE_0 to SFTE_$2^{N-n}$ 1, respectively. The signal SFTE_0 is supplied to respective gates of gate transistors TTL_0 and TTR_0. Similarly, the signal SFTE_S is supplied to respective gates of gate transistors TTL_S and TTR_S. The gate transistors TTL_0 to TTL_$2^{N-n}$-1, and TTR_0 to TTR_$2^{N-n}$-1 are each made of an n-type MOSFET, for example.

The signal SFT is supplied from the domain wall motion driver SG, and is generated from signals DSFT and USFT supplied from the sequencer SQ as will be described. The signals DSFT and USFT are supplied from the sequencer SQ. The signal DSFT instructs moving of the magnetic domain walls of the magnetic thin wires ML to the direction toward the substrate (or, downward along the z-axis), and the signal USFT to the direction away from the substrate (or, upward along the z-axis). Therefore, when the AND gate AND31_0 receives the block select signal BSL_0 and signal SFT, the transistors TTL_0 and TTR_0 turn on, which respectively couples the nodes SP0 and SP1 to the electrodes LDL_0 and RDL_0, which enables the magnetic domain walls to be moved in the block BLK_0. Similarly, when the AND gate AND31_S receives the block select signal BSL_S and signal SFT, the transistors TTL_S and TTR_S turn on, which respectively couples the nodes SP0 and SP1 to the electrodes LDL_S and RDL_S, which enables the magnetic domain walls to be moved in the block BLKS.

The bit lines BL__0 to BL__$2^M$-1 are coupled to a read and write circuit RWC via column select transistors BLST_0 to BLST_$2^M$-1, respectively. The bit lines BL'_0 to BL'_$2^M$-1 are coupled to the read and write circuit RWC via column select transistors BLST'_0 to BLST'_$2^M$-1, respectively. The transistors BLST_0 to BLST_$2^M$-1, and BLST'_0 to BLST'_$2^M$-1 are included in the column controller CC, for example, and each made of an n-type MOSFET. The transistors BLST_0 and BLST'_0 receive a column select signals CSL_0 at the gates. Similarly, the transistors BLST_Q and BLST'_Q receive a column select signal CSL_Q at the gates. The column select signals CSL_0 to CSL_$2^M$-1 are supplied from a column decoder CD via inverters IV23_0 to IV23_$2^M$-1, respectively. The column decoder CD is included in the column controller CC.

The bit lines BL'_0 to BL'_$2^M$-1 are also coupled to an output node SP2 of the domain wall motion driver SG via transistors BLFST_0 to BLFST_$2^M$-1, respectively. The transistors BLFST_0 to BLFST_$2^M$-1 are each made of an n-type MOSFETs, for example, and receive the signal SFT at the gates.

Magnetic domain wall motion (or, data shifts) will now be described with reference to FIG. 49. FIG. 49 illustrates a part of a circuit of the domain wall motion driver of the eleventh embodiment. A NOR gate NOR21 receives the signals DSFT and USFT from, for example the sequencer SQ. The output of the NOR gate NOR21 is supplied to a NAND gate NAND21 via an inverter IV31, a delay element 4DE, and an inverter IV32. The delay element 4DE delays the input signal by four times a unit delay time td. The output of the inverter IV31 is also directly supplied to a NAND gate NAND21. The output of the NAND gate NAND21 serves as the signal SFT via an inverter IV33.

The signal SFT is also supplied to the inverter IV41 via a delay element DE1. The delay element DE1 delays the input signal by the unit delay time td. The output n0 of the inverter IV41 is supplied to a NAND gate NAND22. The NAND gate NAND22 further receives the signal SFT directly and supplies the output to an inverter IV42. The output node of the inverter IV42 is coupled to the node SP0 via an n-type MOSFET TN41 and to the node SP1 via an n-type MOSFET TN42. The nodes SP0 and SP1 output signal SP0 and SP1 described above. The transistors TN41 and TN42 receive the signals DSFT and USFT at the gates, respectively.

The output of the inverter IV41 is also supplied to a NAND gate NAND23 via a delay element DE2 and an inverter IV43. The delay element DE2 delays the input signal by the unit delay time td. The output n1 of the inverter IV43 is supplied to a NAND gate NAND23. The output of the inverter IV43 is further supplied to a NAND gate NAND23 via a delay element DE3 and an inverter IV44. The NAND gate NAND23 supplies the output to an inverter IV45. The output of the inverter IV45 is supplied to the node SP1 via an n-type MOSFET TN43 and to the node SP0 via an n-type MOSFET TN44. The transistors TN43 and TN44 receive the signals DSFT and USFT at the gates, respectively.

The output n2 of the inverter IV44 is also supplied to a NAND gate NAND24. The NAND gate NAND24 further receives the signal SFT. The output of the NAND gate NAND24 is supplied to an inverter IV46. The output node of the inverter IV46 outputs a signal SP2.

Figure 50:
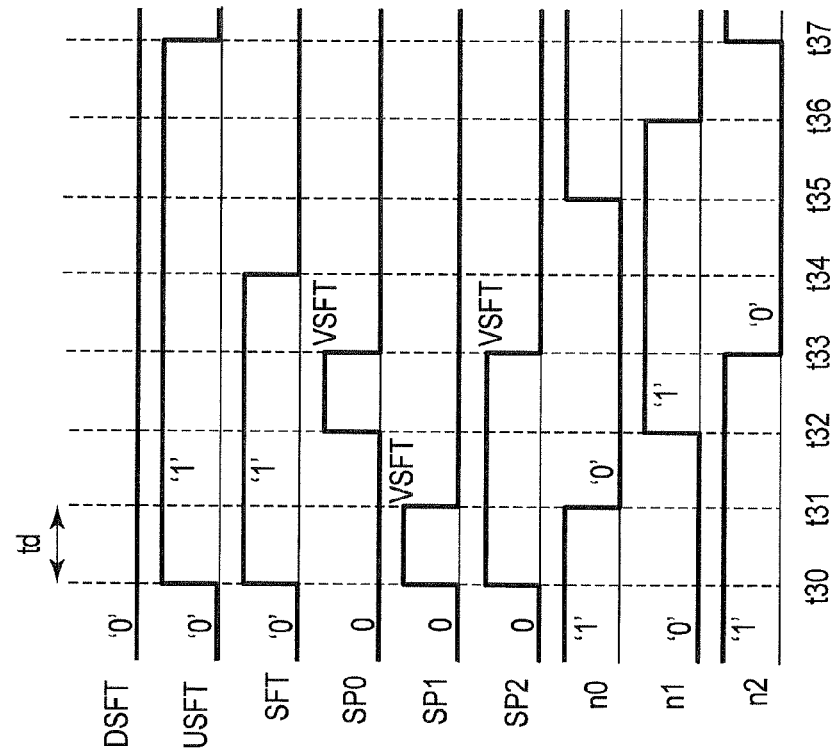
FIG. 50 illustrates a timing chart for some nodes in the magnetic domain wall motion driver of the eleventh embodiment.
Figure 51:
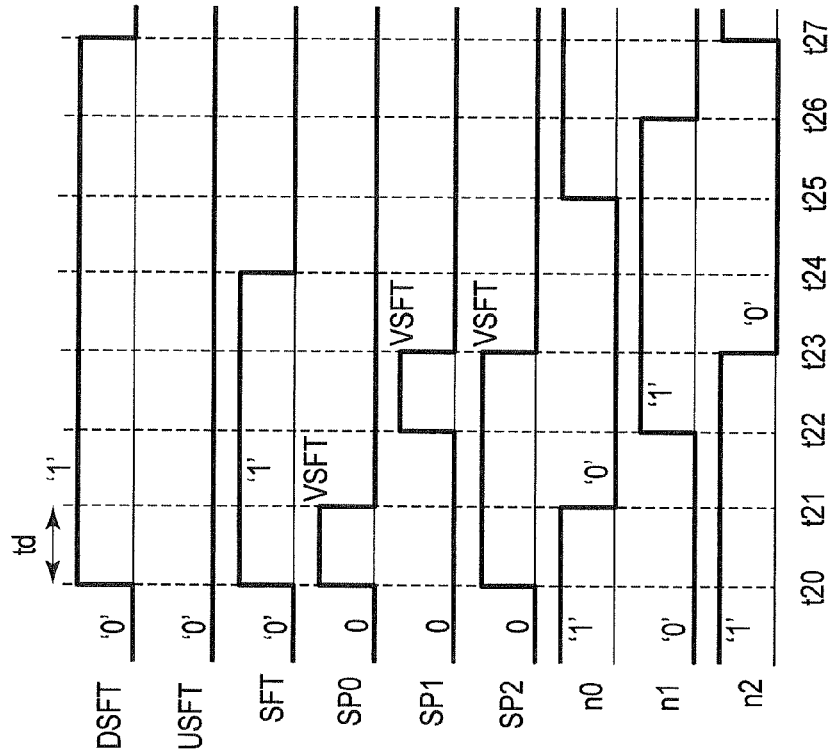
FIG. 51 illustrates another timing chart for some nodes in the magnetic domain wall motion driver of the eleventh embodiment.

The domain wall motion driver of FIG. 49 operates as shown in FIGS. 50 and 51. FIGS. 50 and 51 are timing charts for some nodes (or, signals) in the domain wall motion driver of the eleventh embodiment. Specifically, FIG. 50 illustrates the operation to move the magnetic domain walls in one or more selected magnetic thin wires ML to the direction toward the substrate, and FIG. 51 illustrates the operation to move the magnetic domain walls in one or more selected magnetic thin wires ML to the direction away from the substrate. Each time instant in FIGS. 50 and 51 has an interval with the previous one by the unit delay time td.

The signals DSFT and USFT are low before the operation as illustrated in FIG. 50. Therefore, the signals SFT, SP0, SP1, SP2, and n2 are low, and the signals n0 and n2 are high. With the magnetic thin wire ML selected, the signal DSFT is made high at time t20. The signal DSFT maintains high until time t27. The signal USFT maintains low from beginning to end. When the signal DSFT transitions to high at time t20, the signal SFT remains high from time t20 over a period defined by the delay element 4DE, i.e., over four unit-delay-times in the current context. As a result, the signal n0 remains low from time t21, which comes after the high transition of the signal SFT, over four unit-delay-times, which is equal to the duration of the high-level signal SFT, until time t25. Similarly, the signal n1 remains high from time t22, which comes after the low transition of the signal n0, over four unit-delay-times, which is equal to the duration of the high-level signal SFT, until time t26. Furthermore, the signal n2 remains low from time t23, which comes after the high transition of the signal n1, over four unit-delay-times, which is equal to the duration of the high-level signal SFT, until time t27.

With the signals SFT, n0, n1, and n2 thus transitioning, the signal SP0 remains high (or, voltage VSFT) from time t20 to t21, the signal SP1 remains high (or, voltage VSFT) from time t22 to t23, and the signal SP2 remains high (or, voltage VSFT) from time t20 to t23. In other words, the signal SP1 remains high after the maintaining of high by the signal SP0. With such voltage changes, the magnetic domain walls of the selected magnetic thin wire ML move in the direction toward the substrate by a single magnetic domain.

In contrast, with the magnetic thin wire ML selected, the signal USFT is made high at time t30 as illustrated in FIG. 51. The signal USFT remains high until time t37. The signal DSFT remains low from beginning to end. When the signal USFT transitions to high at time t30, the signal SFT remains high from time t30 over a period defined by the delay time of the delay element 4DE until time t34. The signals n0, n1, and n2 behave as in FIG. 50; as a result, the signal SP1 remains high (or, voltage VSFT) from time t30 to t31, the signal SP0 remains high (or, voltage VSFT) from time t32 to time t33, and the signal SP2 remains high (or, voltage VSFT) from time t30 to time t33. In other words, the signal SP0 remains high after maintaining of high by the signal SP1. With such voltage changes, the magnetic domain walls of the selected magnetic thin wire ML move in the direction away from the substrate by a single magnetic domain.

Reads and writes in the magnetic memory device MD of the eleventh embodiment will now be described. The magnetic thin wires ML belonging to the same row make a magnetic thin wire set MLS as described above. Moreover, electrodes LDL for motion are shared by multiple columns in a block BLK, and the electrodes RDL are also shared by columns. For this reason, the motion of magnetic domain walls is executed in units of blocks. In accordance with this, reads and writes are executed as in FIG. 52.

Figure 52:
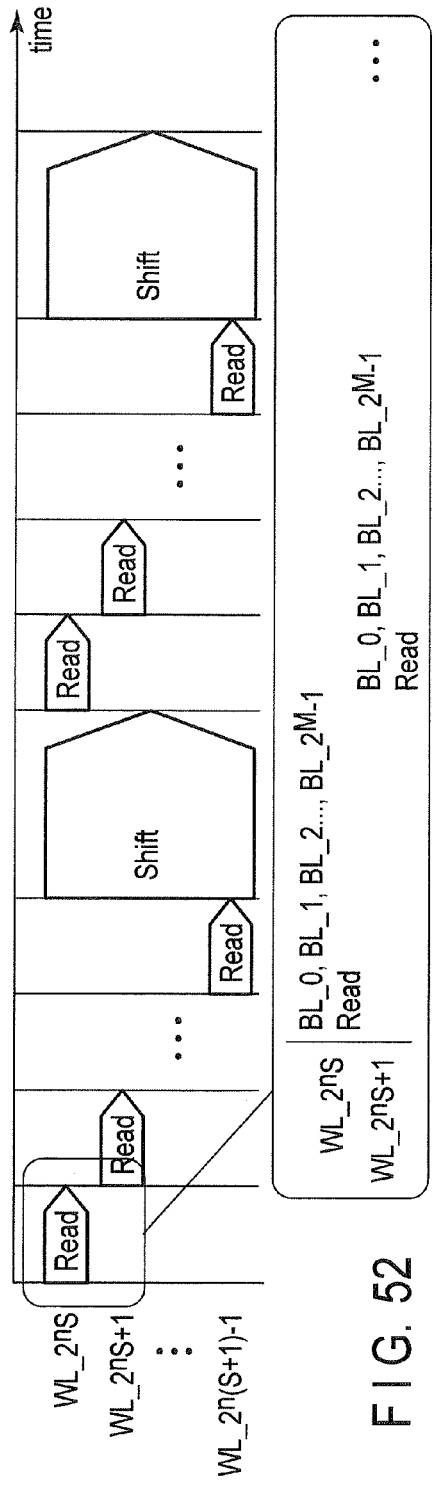
FIG. 52 roughly illustrates a read or write sequence of the eleventh embodiment.
Figure 53:
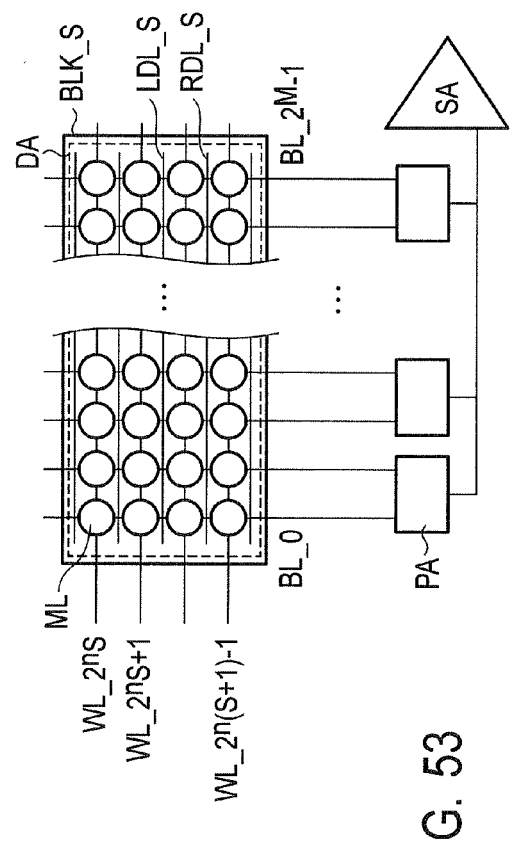
FIG. 53 illustrates an example of a selected block and components relevant to the read of the eleventh embodiment.

FIG. 52 illustrates an outline of a sequence of a read or a write of the eleventh embodiment. FIG. 52 illustrates a state with a particular block BLK_S selected. The following description is for a read; however the description is also applicable to a write with the only difference in an operation at a read step. Moreover, FIG. 53 illustrates an example of a selected block BLK_S and components involved in reads of the eleventh embodiment. FIG. 53 relates to an example of two adjacent bit lines BL sharing a preamplifier unit PA as an example.

One or three or more bit lines BL, however, may share a preamplifier unit PA. The preamplifier unit PA is included in the preamplifier and write circuit PAW, and is further coupled to the sense amplifier SA.

A set of magnetic domains on the same xy-plane in the selected block BLKS, which will be referred to as a magnetic domain array DA, is located in the MTJ structures MTJ, and this magnetic domain array DA is the current target for the read. A read-target magnetic domain array DA will be referred to as a selected magnetic domain array DA. First, the sequencer SQ selects the first word line WL_$2^nS$ in the selected block BLK_S. This results in the magnetic thin wires ML in the magnetic thin wire set MLS of the $2^nS$ row coupled to the bit lines BL_0 to BL_$2^M$-1, respectively. In this state, the sequencer SQ selects the column select signals CSL_0 to CSL_$2^M$-1 one after another (see, FIG. 45) to select the bit lines BL_0 to BL_$2^M$-1 one after another. The order of the selection may be in ascending order of the addresses of the bit lines BL, or another order. As a result of the sequential selection, within a selected magnetic domain array DA, the data from the magnetic domains in the magnetic thin wire set MLS of the selected $2^nS$ row is sequentially read to corresponding preamplifier units PA.

The sequencer SQ selects the next word line WL in the selected block BLK_S. The order of selection of word lines WL in the selected block BLK_S is arbitrary. FIG. 52 illustrates a selection of the addresses of the word lines WL in ascending order as an example. The sequencer SQ selects the word line WL_$2^nS$+1. This results in a magnetic thin wire set MLS in the $2^nS$+1 row coupled to the bit lines BL. In this state, the sequencer SQ selects the column select signals CSL_0 to CSL_$2^M$-1 one after another to select the bit lines BL_0 to BL_$2^M$-1 one after another as is described for the first word line WL_$2^nS$+1. As a result of the sequential selection, within a selected magnetic domain array DA, the data from the magnetic domains in the magnetic thin wire set MLS of the selected $2^nS$+1 row is sequentially read to corresponding preamplifier units PA. The sequencer SQ repeats the operation described for a single word line WL for the remaining word lines WL in the selected block BLK_S. Specifically, when the example of the ascending order of the word lines WL is followed, the sequencer SQ repeats the aforementioned read for all word lines WL_$2^nS$ to WL_$2^n(S+1)$-1 in total. Thus, the read from the selected magnetic domain array DA completes.

The above description is for an operation for an example with a single preamplifier unit PA provided for bit lines BL_0 to BL_$2^M$-1. With the bit lines BL_0 to BL_$2^M$-1 divided into groups, the magnetic memory device MD can be configured to read or write in parallel in units of groups. In such an example, preamplifier units PA in the preamplifier and write circuit PAW are coupled to respective data lines DTL via respective cell array select transistors CST, and the preamplifier units PA operate in parallel. For example, the bit lines BL_0 to BL_$2^M$-1 are divided into a group of bit lines BL_0 to BL_$2^P$-1, and a group of bit lines BL_$2^M$-$2^P$ to BL_$2^M$-1, and reads and writes are executed in parallel in units of groups. The parallel reads and writes will be described in the description of read and write sequences in detail later.

The sequencer SQ then moves the magnetic domain walls to locate the next magnetic domain array DA in the corresponding MTJ structures MTJ, or moves them to the position for read. Then, the sequencer repeats the same operation as that described above for selected magnetic domain array DA for the currently-selected magnetic domain array DA, and completes the read of the currently-selected magnetic domain array DA.

The sequencer SQ executes the operation for a single magnetic domain array DA to all the read-target magnetic domain arrays DA in the selected block BLK. For example, the sequencer SQ executes reads from all magnetic domain arrays DA in the selected block BLK_S. Thus, the read from the selected block BLK_S completes.

Referring to FIGS. 54 to 55A and 55B, a read sequence will be further described. FIG. 54 illustrates an example of a part of the circuit of the magnetic memory device according to the eleventh embodiment. A memory cell, i.e., an MTJ structure MTJ with a read-target magnetic domain therein, is coupled to the node n11 of a preamplifier unit PA via a row select transistor RST and a column select transistor BLST coupled in series. A preamplifier unit PA is based on the current mirror circuit, and is provided for $2^P$ columns. In the preamplifier unit PA, a p-type MOSFET TP41 and an n-type MOSFET TN51 are coupled in series between the node of the potential VDDR and node n12. The gate of the transistor TP41 is coupled to the connection node between the transistors TP41 and TN51. The potential VDDR is high enough to allow the transistor TP41 and a below-mentioned p-type MOSFET TP42 to execute the pentode operation. The transistor TN51 clamps the voltage applied to the cell MTJ, and receives a fixed potential according to the to-be-clamped potential at the gate.

The transistor TP42 and p-type MOSFET TP44 are coupled in series between the node of the potential VDDR and node n12. The gate of the transistor TP42 is coupled to the connection node between the transistors TP41 and TN51. The transistor TP44 receives an array select signal at the gate. With the cell array CA for which the preamplifier unit PA serves selected, that preamplifier unit PA receives a low-level array select signal, which turns on the transistor TP44.

Current through the cell MTJ, i.e., the node n11, is mirrored by the preamplifier unit PA, and the mirrored current flows into the sense amplifier SA from the node n12. In the sense amplifier, the node n12 is grounded via an n-type MOSFET TN53, coupled to the gate of a transistor TN53, and coupled to an inverter IV51. The output of the inverter IV51 is the output of the sense amplifier SA, and is supplied to the latch TL. With the current through the node n11, i.e., the current based on the current through the node n12, the potential of the node n12 varies. This potential is translated into the digital value of "0" or "1" by the inverter IV51, and then taken into the latch TL.

Figure 55A:
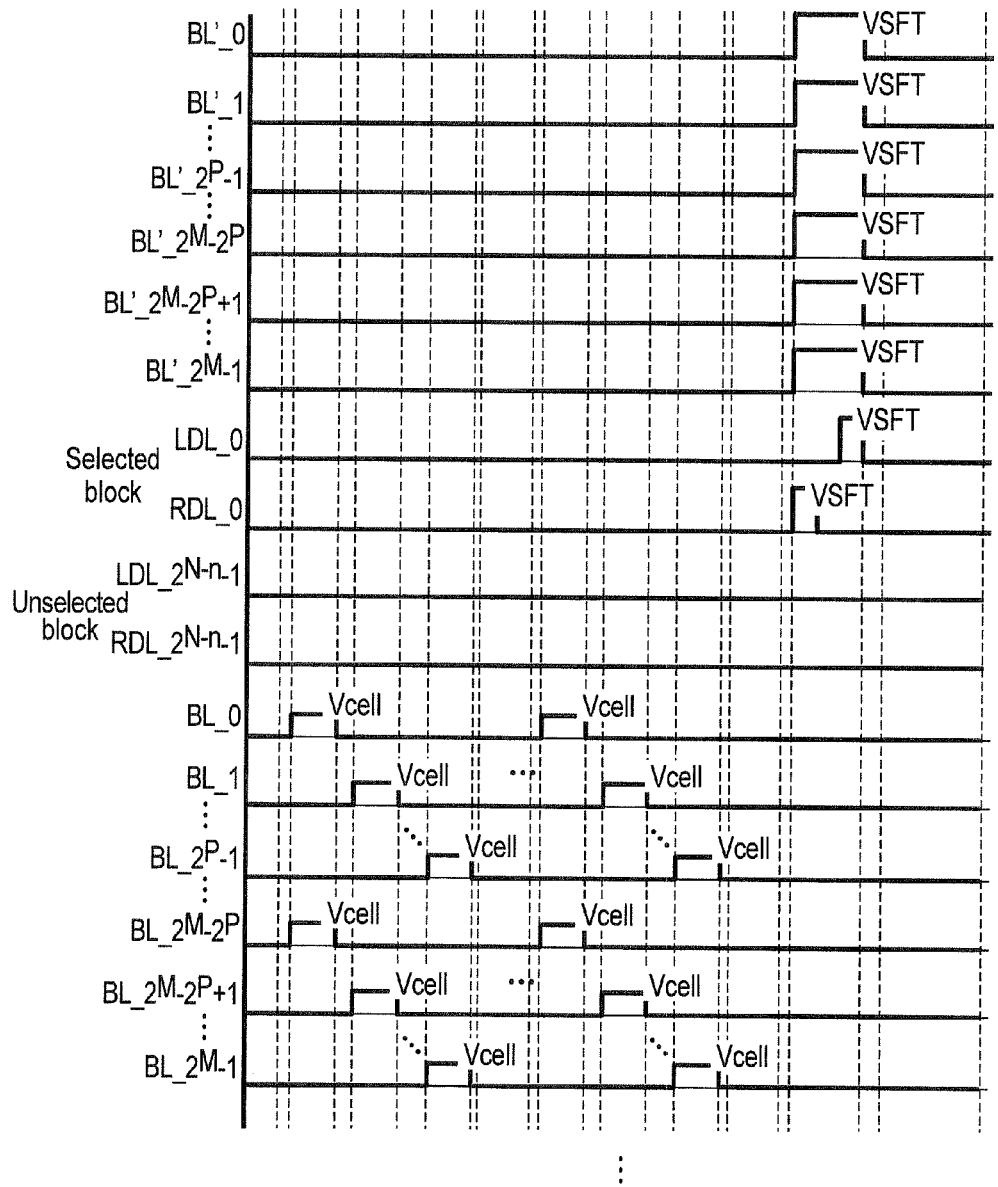
FIGS. 55A and 55B illustrate a timing chart for some signals during a read of the magnetic memory device according to the eleventh embodiment.
Figure 55B:
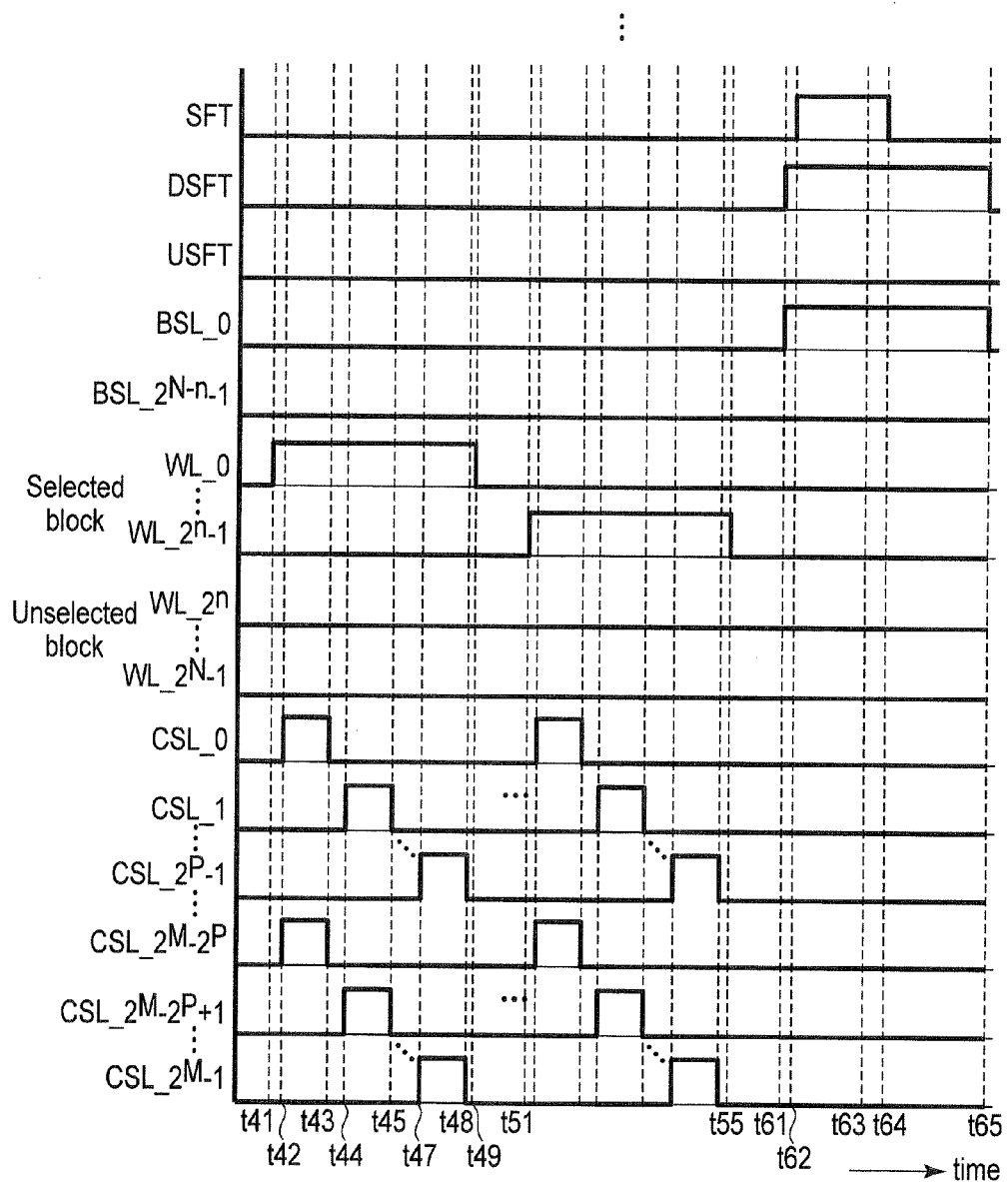

FIGS. 55A and 55B are an illustrative timing chart for some signals during a read of the magnetic memory device according to the eleventh embodiment. A read-target magnetic domain array DA is already located in the read position at the start of FIGS. 55A and 55B, i.e., the read-target magnetic domain array DA is already selected. FIGS. 55A and 55B illustrate a read for a single selected magnetic domain array DA and the following motion to another selected magnetic domain array DA, and illustrate an example of the block BLK_0 selected. Moreover, FIGS. 55A and 55B illustrate the block $BLK\_2^{N-n}-1$ as a representative of unselected blocks, and word lines $WL\_2^n$ and $WL\_2^N-1$ as a representative of the word lines in an unselected block.

As described above, the magnetic memory device MD can have the bit lines BL_0 to $BL\_2^M-1$ divided into groups and be configured to read in parallel in units of groups. FIGS. 55A and 55B illustrate an example of a parallel read of a group of bit lines BL_0 to $BL\_2^P-1$ and a group of bit lines $BL\_2^M-2^P$ to $BL\_2^M-1$ as an example.

At time t41, the sequencer SQ makes the first word line WL_0 high for selection thereof. While the word line WL_0 is selected, the sequencer SQ makes the column select signals CSL_0 to $CSL\_2^P-1$ high one after another in order to select columns. In parallel to this, the sequencer SQ makes column select signals $CSL\_2^M-2^P$ to $CSL\_2^M-1$ high one after another. FIGS. 55A and 55B illustrate selection of the column select signals CSL_0 to $CSL\_2^P-1$ in ascending order, and selection of the column select signals $CSL\_2^M-2^P$ to $CSL\_2^M-1$ in ascending order. Specifically, the sequencer SQ keeps the column select signals CSL_0 and $CSL\_2^M-2^P$ high from time t42 to t43. This makes a state where the corresponding row select transistor RST and column select transistor BLST are on as can be seen from FIG. 54. In turn, the selected bit lines BL_0 and $BL\_2^M-2^P$ are applied with a voltage Vcell from time t42 to t43. The voltage Vcell is a fixed voltage applied to the read-target cell, i.e., the MTJ structure MTJ including the magnetic domain at the intersection of the selected word line WL and the selected bit line, during the read. As a result of the application of the voltage Vcell, currents based on the selected read target cells, i.e., the MTJ structure MTJ including the magnetic domain at the intersection of the word line WL_0 and bit line BL_0 within the selected magnetic domain array DA and MTJ structure MTJ including the magnetic domain at the intersection of the word line WL_0 and bit line $BL\_2^M-2^P$ within the selected magnetic domain array DA are supplied to a preamplifier unit PA coupled to the bit line BL_0 and to a preamplifier unit PA coupled to the bit line $BL\_2^M-2^P$, respectively. Thus, the data of the select cells are read.

The sequencer SQ then maintains the column select signals CSL_1 and $CSL\_2^M-2^P+1$ high from time t44 to t45 as in from time t42 to t43. As a result, the bit lines BL_1 and $BL\_2^P+1$ are applied with the voltage Vcell from time t44 to time t45 by the same operation as described for the column select signals CSL_0 and $CSL\_2^M-2^P$. Thus, a current based on the MTJ structure MTJ including the magnetic domain at the intersection of the word line WL_0 and bit line BL_1 within the selected magnetic domain array DA is supplied to the preamplifier unit PA coupled to the bit line BL_1. Moreover, a current based on the MTJ structure MTJ including the magnetic domain at the intersection of the word line WL_0 and bit line $BL\_2^M-2^P+1$ within the selected magnetic domain array DA is supplied to the preamplifier unit PA coupled to the bit line $BL\_2^M-2^P+1$. Similarly, the sequencer SQ makes multiple or, for example, all column select signals CSL in a single block BLK high at least once by time t48 while the word line WL_0 is high. Specifically, the sequencer SQ makes the column select signals CSL_0 to $CSL\_2^P-1$ high one after another, and column select signals $CSL\_2^M-2^P$ to $CSL\_2^M-1$ high one after another. As a result, the data of the magnetic domain at each intersection between the word line WL_0 and bit lines BL_0 to $BL\_2^M-1$ within the selected magnetic domain array DA in total is read sequentially.

A parallel read from three or more groups can also be implemented by executing the two-group parallel read described so far to the three or more groups. In contrast, in an example with the magnetic memory device MD not supporting parallel reads of bit-line groups, the column select signals CSL_0 to $CSL\_2^M-1$ in a single block BLK are made high one after another while the word line WL_0 is high.

After time t48, the sequencer SQ makes the word line WL_0 low at time t49.

The sequencer SQ repeats the operation for a single word line WL from time t41 to t49 for the remaining word lines WL in the block BLK_0 from time t51 to t55. Thus, the read from a single selected magnetic domain array completes. FIGS. 55A and 55B illustrate the word line $WL\_2^n-1$ as the last word line WL in the selected block BLK_0.

The sequencer SQ maintains all bit lines BL'_0 to $BL'\_2^M-1$, all electrodes LDL_0 to $LDL\_2^{N-n}-1$, all electrodes RDL_0 to $RDL\_2^{N-n}-1$, the signals DSFT and USFT, all word lines WL in unselected blocks, and all block select signals BSL_0 to $BSL\_2^{N-n}-1$ low from time t41 to t55.

The sequencer SQ then selects the next magnetic domain array DA in the selected block. FIGS. 55A and 55B illustrate an example of selection of the magnetic domain array adjacent the previously-selected magnetic domain array at the side away from the substrate. For such a selection of the next magnetic domain array, the sequencer SQ makes the block select signal BSL_0, which selects the read target block BLK_0, high at time t61. During high block select signal BSL_0, the sequencer SQ also maintains the signal DSFT high from time t61 to time t65. The signal USFT is maintained to be low. The signal SFT remains high over a fixed period from the high transition of the signal DSFT to time t64 as described with reference to FIGS. 50 and 51. As a result, as described with reference to FIGS. 50 and 51, from time t62 to t63, the electrode RDLO of the selected block BLK_0 is applied with the voltage VSFT over a fixed period, and then the electrode LDL_0 of the selected block BLK_0 is applied with the voltage VSFT over a fixed period. This moves the magnetic domains of all magnetic thin wires ML in the selected block BLK_0 to the substrate by a single magnetic domain to result in the next magnetic domain array DA selected. From the start of the application of the voltage VSFT to the electrodes RDL_0 to the end of the application of the voltage VSFT to the electrodes LDL_0, i.e., from time t62 to t63, all bit lines BL'_0 to BL'_$2^M$−1 are also applied with the voltage VSFT. The sequencer SQ then repeats the operation from time t41 to t55 to the next magnetic domain array DA.

The column select signals CSL_0 to CSL_$2^M$−1 are low due to wall motion, and therefore the column select transistors BLST'_0 to BLST'_$2^M$−1 are off. Because of the high signal SFT, the transistors BLFST_0 to BLFST_$2^M$−1 are on to result in the voltage VSFT applied to the bit lines BL'_0 to BL'_$2^M$−1 via the transistors BLFST_0 to BLFST_$2^M$−1. The purpose of such application is to accommodate a case where application of a negative electric field to the magnetic thin wires ML of the selected block BLK_0 from the electrodes LDL_0 and RDL_0 moves the magnetic domain wall to allow a negative electric field to be applied to the magnetic thin wire ML from the electrodes LDL and RDL without generating a negative voltage lower than the voltage VSS.

Referring to FIGS. 56 to 57A and 57B, a write sequence will be further described. FIG. 56 illustrates an example of a part of the circuit of the magnetic memory device according to the eleventh embodiment, a part of the read and write circuit RWC, and a single write circuit unit WCU. A write circuit unit WCU as shown in FIG. 56 is provided for each of the sets of the $2^W$ bit lines BL. A node nW is coupled to one end of respective gate transistors of the columns to which the write circuit unit WCU provides the write function. FIG. 56 illustrates bit lines BL_0 to BL_$2^W$−1 as columns which are served by the write circuit unit WCU for the write function. The node nW is coupled to a node from which the potential Vm is supplied via n-type MOSFETs TN61 and TN62 coupled in series. The potential Vm is the middle potential between the potential applied to the bit lines BL for a 0-data write, and that for a 1-data write. The transistors TN61 and TN62 receive signals WRT and SUS at respective gates, for example. The signal WRT is output from the sequencer SQ and maintained to be high during a write. The signal SUS is supplied from a NOR gate NOR31. The NOR gate NOR31 receives signals WR0 and WR1 from the sequencer SQ.

The write circuit unit WCU has a section WCU0 for 0-data write, and a section WCU1 for 1-data write. These sections each include a current mirror circuit, and conduct respective currents for the 0-data write and 1-data write to the node nW. The 1-data write section WCU1 includes a p-type MOSFET TP51 and an n-type MOSFET TN64 coupled in series between the supply node of a potential VDDW and the node nW, and a p-type MOSFET TP52 and a current source ISW1. The potential VDDW is higher than the intermediate potential Vm and high enough to allow the transistors TP51, TP52, TN67, and TN68 to execute the pentode operation. The transistor TN64 receives the signal WR1 at the gate. The transistor TP52 and current source ISW1 are coupled in series between the supply node of potential VDDW and ground node. The transistor TP52 has the gate coupled to its own drain and the gate of the transistor TP51. The current source ISW1 conducts the current for writing 1-data. A high signal WR1 enables the 1-data-write section WCU1, and the signal WR1 is maintained to be high while the 1-data-write current is being supplied to the bit lines BL.

The 0-data-write section WCU0 includes n-type MOSFETs TN66 and TN67 coupled in series between the node nW and ground node, an n-type MOSFET TN68, and a current source ISW0. The transistor TN66 receives the signal WR0 at the gate. The current source ISW1 and transistor TN68 is coupled in series between the supply node of potential VDDW and the ground node. The transistor TN68 has the gate coupled to its own drain and the gate of the transistor TN67. The current source ISW0 conducts the current for writing 0-data. A high signal WR0 enables the 0-data-write section WCU0, and the signal WR0 is maintained to be high while the 0-data-write current is being supplied to the bit lines BL.

Figure 57A:
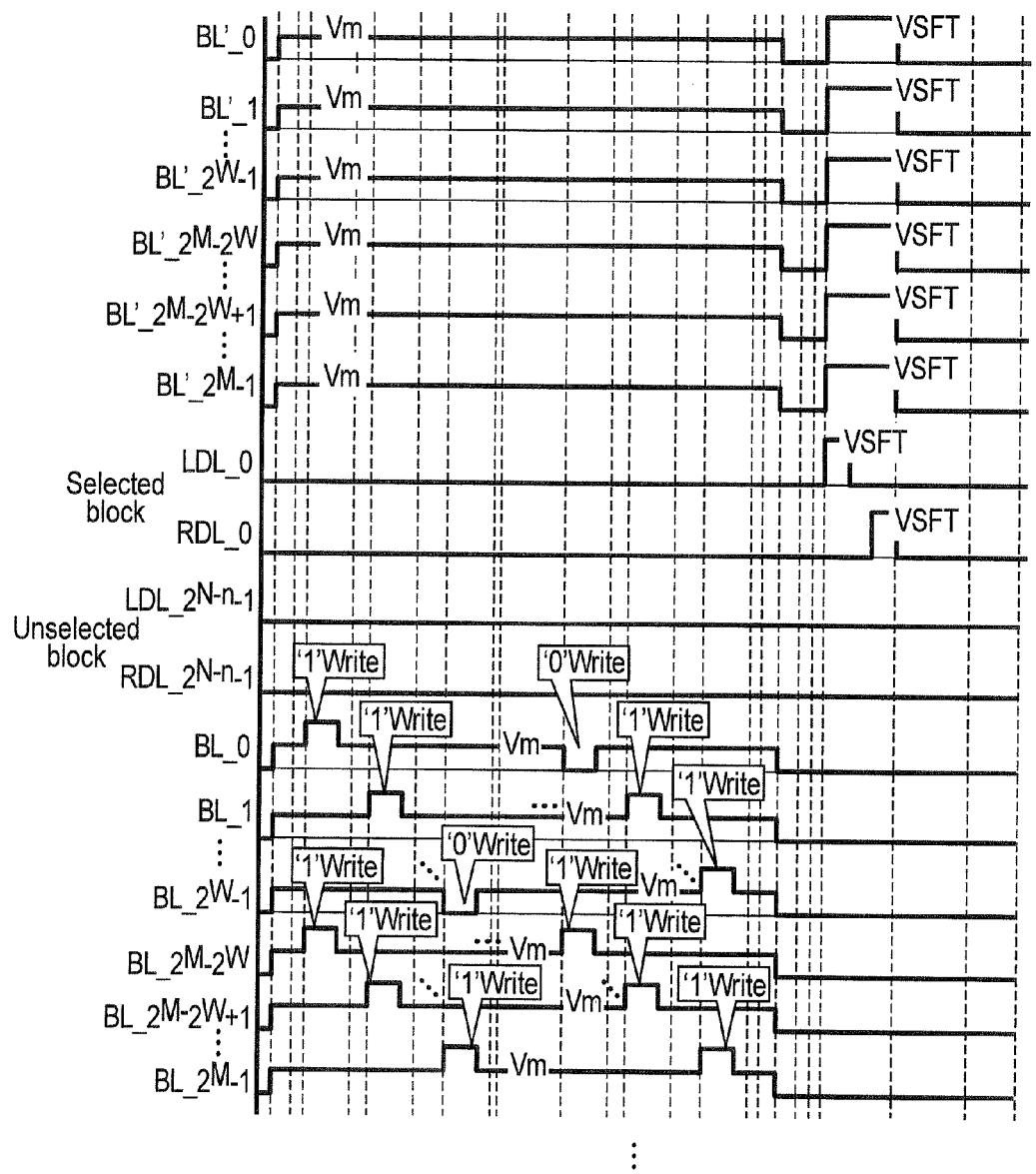

FIGS. 57A and 57B are an illustrative timing chart for some nodes during a write of the magnetic memory device according to the eleventh embodiment. A write-target magnetic domain array DA is already located in the write position at the start of FIGS. 57A and 57B, i.e., the write-target magnetic domain array DA is already selected. FIGS. 57A and 57B illustrate a write for a single select magnetic domain array DA and the following motion to another selected magnetic domain array DA, and illustrate an example of the block BLK_0 selected. Moreover, FIGS. 57A and 57B illustrate the block BLK_$2^{N-n}$−1 as a representative of unselected blocks, and word lines WL_$2^n$ and WL_$2^N$−1 as a representative of the word lines in an unselected block.

As described above, the magnetic memory device MD can have the bit lines BL_0 to BL_$2^M$−1 divided into groups and be configured to write in parallel in units of groups. FIGS. 57A and 573 illustrate an example of a parallel write of a group of bit lines BL_0 to BL_$2^W$−1 and a group of bit lines BL_$2^M$-2 W-BL_$2^M$−1 as an example.

First of all, the signal WRT (not shown) remains high during the write including the period of FIGS. 57A and 57B. Moreover, the write signals WR0 and WR1 are still both low, and therefore the transistor TN62 of FIG. 56 is on and the node nW is fixed to the potential Vm. In this state, the sequencer SQ makes all column select signals CSL_0 to CSL_$2^M$−1 high to turn on the column select transistors BLST_0 to BLST_$2^M$−1 from time t71 to t72. This precharges the bit lines BL_0 to BL_$2^M$−1 to the potential Vm. Moreover, bit lines BL'_0 to BL'_$2^M$−1 are fixed to the potential Vm from time t71 until the end of the write.

At time t72, the sequencer SQ makes the first word line WL_0 high for selection thereof. While the word line WL_0 is selected, the sequencer SQ makes the column select signals CSL_0 to CSL_$2^W$−1 high one after another in order to select columns. In parallel with this, the sequencer SQ makes the column select signals CSL_$2^M$-$2^W$ to CSL_$2^M$−1 high one after another. FIGS. 57A and 57B illustrate selection of the column select signals CSL_0 to CSL_$2^W$−1 in ascending order, and selection of the column select signals CSL_$2^M$-$2^W$ to CSL_$2^M$−1 in ascending order. Specifically, the sequencer SQ keeps the column select signals CSL_0 and CSL_$2^M$-$2^W$ high from time t73 to t74. As a result, the bit line BL_0 is coupled to the node nW of a particular write circuit unit WCU, and bit line BL_$2^M$-$2^W$ to the node nW of another write circuit unit WCU in a similar manner as illustrated in FIG. 56. The sequencer SQ then makes the signal WR0 or WR1 high in accordance with the data to be written (not shown). This enables the 0-data write section WCU0 or 1-data write section WCU1 of the write circuit unit WCU to result in the potentials of the bit lines BL_0 and BL_$2^M$-$2^W$ falling to a 0-data write potential (or, VSS) or rising to a 1-data write potential. FIGS. 57A and 57B illustrate the 1-data write. As a result of the application of the 1-data write voltage to the bit lines BL_0 and BL_$2^M$-$2^W$, the 1-write data current is supplied to the selected write target cells, i.e., the MTJ structure MTJ including the magnetic domain at the intersection of the word line WL_0 and bit line BL_0 within the selected magnetic domain array DA and the MTJ structure MTJ including the magnetic domain at the intersection of the word line WL_0 and bit line BL_$2^M$-$2^W$. Thus, the 1-data is written in the selected cells.

The sequencer SQ then maintains the column select signals CSL_1 and CSL_$2^M$-$2^W$+1 high from time t75 to t77 as in from time t73 to t74. As a result, bit line BL_1 is coupled to the node nW of the write circuit unit WCU, and bit lines BL_$2^M$-$2^W$+1 to the node nW of another write circuit unit WCU as illustrated in FIG. 56. The sequencer SQ then makes the signal WR0 or WR1 high in accordance with the data to be written. FIGS. 57A and 57B illustrate an example where the signal WR1 input to the write circuit unit WCU coupled to the bit line BL_1 is high, and the signal WR1 input to the write circuit unit WCU coupled to the bit line BL_$2^M$-$2^W$+1 is high. With this, by the same operation described for the bit lines BL_0 and BL_$2^M$-$2^W$, 1-data is written in the selected cells, i.e., the MTJ structure MTJ including the magnetic domain at the intersection of the word line WL_0 and bit line BL_1 within the selected magnetic domain array DA, and the MTJ structure MTJ including the magnetic domain at the intersection of the word line WL_0 and bit line BL_$2^M$-$2^W$+1. Similarly, the sequencer SQ makes multiple or for example all column select signals CSL in a single block BLK high at least once by time t79 while the word line WL_0 is high. Specifically, the sequencer SQ makes the column select signals CSL_0 to CSL_$2^W$-1 high one after another, and column select signals CSL_$2^M$-$2^W$ to CSL_$2^M$-1 high one after another. As a result, data is written in the cells at each intersection between the word line WL_0 and bit lines BL_0 to BL_$2^M$-1 within the selected magnetic domain array DA one after another.

A parallel write to three or more groups can also be implemented by executing the two-group parallel write described so far to the three or more groups. In contrast, in an example with the magnetic memory device MD not supporting parallel writes of bit-line groups, the column select signals CSL_0 to CSL_$2^M$-1 in a single block BLK are made high one after another while the word line WL_0 is high.

The sequencer SQ makes the word line WL_0 low at time t80 after time t79.

The sequencer SQ repeats the operation for a single word line WL from time t72 to t80 for the remaining word lines WL in the block BLK_0 until time t81. Thus, the write to a single selected magnetic domain array DA completes. FIGS. 57A and 57B illustrate the word line WL_$2^n$-1 as the last word line WL in the selected block BLK_0. Fixation of the bit lines BL'_0 to BL'_$2^W$-1 to the potential Vm continues until time t80.

The sequencer SQ maintains all electrodes LDL_0 to LDL_$2^{N-n}$-1, all electrodes RDL_0 to RDL_$2^{N-n}$-1, signals DSFT and USFT, all word lines WL in the unselected blocks, and all block select signals BSL_0 to BSL_$2^{N-n}$-1 low from time t71 to t80.

Following the completion of the write to the selected magnetic domain array DA, the sequencer SQ makes all column select signals CSL_0 to CSL_$2^M$-1 high to turn on the column select transistors BLST_0 to BLST_$2^M$-1 from time t82 to t83. This discharges the bit line BL_0 to BL_$2^M$-1 to the potential VSS.

The sequencer SQ then selects the next magnetic domain array DA in the selected block. The selection of the next magnetic domain array DA is the same as described with reference to FIGS. 55A and 55B. Specifically, the operation from time t52 in FIGS. 55A and 55B is executed although FIGS. 55A and 55B illustrate an example of selection of the magnetic domain array DA adjacent the previously-selected magnetic domain array DA at the side nearer to the substrate. For this reason, the signal USFT instead of the signal DSFT is made high from time t84 to t87, whereas the signal DSFT remains low. This results in the voltage VSFT applied to the electrode LDL_0 of the selected block BLK_0 and then to the electrode RDL_0 from time t85 to t86. From the start of the application of the voltage VSFT to the electrodes LDL_0 to the end of the application of the voltage VSFT to the electrode RDL_0, i.e., from time t85 to t86, all bit lines BL'_0 to BL'_$2^M$-1 are also applied with the voltage VSFT. When the next magnetic domain array DA is selected, the sequencer SQ repeats the operation from time t71 to t87.

According to the eleventh embodiment, multiple rows (or, multiple magnetic thin wire sets MLS) have the magnetic domains moved together. This makes many magnetic thin wires ML targeted for a read, and accommodating this by providing the sense amplifier SA in an area with packed cell arrays CA would require a large area. This is because sense amplifiers generally have large areas. To address this, preamplifiers, which have small areas, are provided in the area with packed cell arrays CA, and in addition, a single preamplifier and write circuit PAW is shared by adjacent cell arrays CA (or, circuit sets). This allows for magnetic domain motion and data reads and writes in units of blocks with suppression of an increase of the area.

Twelfth Embodiment

The twelfth embodiment relates to modification of the eleventh embodiment.

FIG. 58 illustrates a part of the cell array and related components and connections according to the twelfth embodiment. In the eleventh embodiment (FIG. 45), the pairs of the bit lines BL (BL_0 to BL_$2^M$-1) and BL' (BL'_0 to BL'_$2^M$-1) are coupled to the opposite ends of the respective serially-connected structures of the corresponding magnetic thin wire ML and row select transistor RST. In contrast, in the twelfth embodiment, bit lines BL' are coupled between MTJ structures MTJ and magnetic thin wires ML as illustrated in FIG. 58. This avoids generation of a potential difference between the opposite ends of the respective magnetic thin wires ML during reads and writes, and therefore current does not flow through the magnetic thin wires ML. For the remaining features, the twelfth embodiment is the same as the eleventh embodiment.

According to the twelfth embodiment, multiple rows have the magnetic domains moved together, and preamplifiers, which have small areas, are provided in the area with packed cell arrays CA, and in addition a single preamplifier and write circuit PAW is shared by adjacent cell arrays CA (or, circuit sets). This can produce the same advantages as the eleventh embodiment. Moreover, according to the twelfth embodiment, bit lines BL' are coupled between the MTJ structures MTJ and magnetic thin wires ML. This avoids generation of a potential difference between the opposite ends of the respective magnetic thin wires ML during reads and writes, and therefore current does not flow through the magnetic thin wires ML. This in turn prevents unintentional motion of the magnetic domain walls due to currents through the magnetic thin wires ML during reads or writes.

Thirteenth Embodiment

Figure 59:
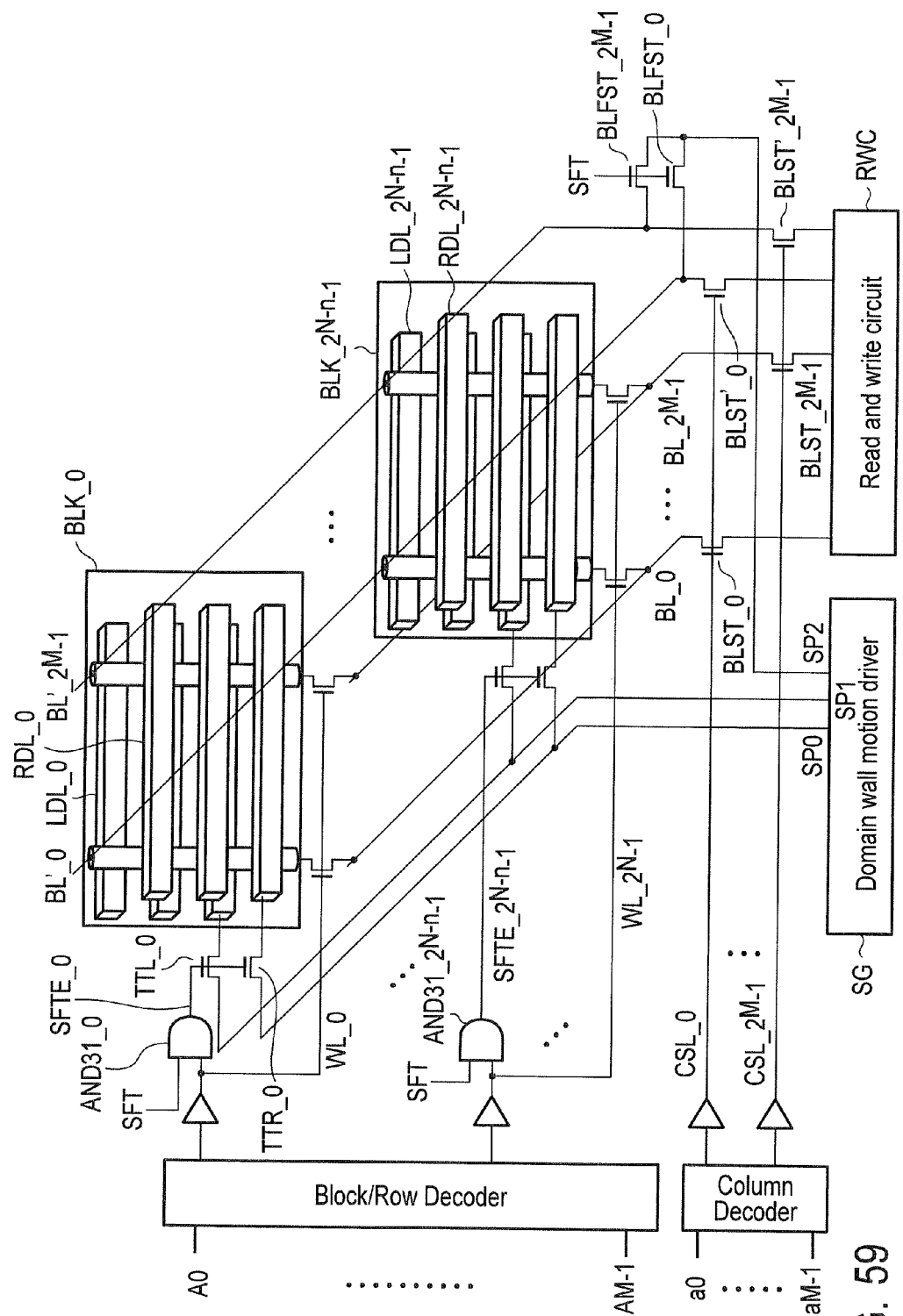
FIG. 59 illustrates a part of a cell array and related components and connections according to a thirteenth embodiment.

The thirteenth embodiment relates to a modification of the eleventh embodiment. FIG. 59 illustrates a part of the cell array and related components and connections according to the thirteenth embodiment. The thirteenth embodiment relates to an example of n=0 of the eleventh embodiment. Specifically, a single block BLK only includes a single row, i.e., a magnetic thin wire set MLS, an electrode LDL, and an electrode RDL. A single block BLK only includes a single row, i.e., a single word line WL, and therefore the block select signals BSL are also supplied to the word lines WL. For the remaining features, the thirteenth embodiment is the same as the eleventh embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a magnetic thin wire comprising magnetic domains along a direction in which the magnetic thin wire extends, magnetization directions of the magnetic domains being variable;
a magnetic tunnel junction (MTJ) structure comprising a pinned layer with a fixed magnetization direction and an insulator, and making an MTJ comprising the pinned layer, the insulator and a magnetic domain in the magnetic thin wire in a first position to sandwich the insulator with the pinned layer;
first and second electrodes at both ends of the magnetic thin wire; and
at least one third electrode coupled to the magnetic thin wire between the first and second electrodes.

2. The device of claim 1, wherein
pairs of adjoining two of the first and second electrodes and the at least one third electrode have the same interval.

3. The device of claim 1, wherein
among the first and second electrodes and the at least one third electrode, a voltage is applied between a pair other than the pair of the first and second electrodes, and a voltage is applied to remaining electrodes so that no potential difference is formed between each pair formed from adjoining members of the remaining electrodes and the voltage-applied pair.

4. The device of claim 1, wherein
among the first and second electrodes and the at least one third electrode, a voltage is applied between a pair other than the pair of the first and second electrodes, and remaining electrodes are not fixed to a potential.

5. The device of claim 1, wherein:
the device further comprises a second magnetic thin wire,
the second magnetic thin wire comprises magnetic domains along a direction in which the second magnetic thin wires extends, magnetization directions of the magnetic domains being variable, and
the first and second electrodes and the at least one third electrode are also coupled to the second magnetic thin wire.

6. The device of claim 5, wherein
a position of the at least one third electrode in the magnetic thin wire is the same as a position of the at least one third electrode in the second magnetic thin wire.

7. The device of claim 5, wherein
the magnetic thin wire and the second magnetic thin wire extend along a surface of a substrate and are in a line along a direction intersecting the surface of the substrate, and
the first and second electrodes and the at least one third electrode extend along a direction intersecting the surface of the substrate.

8. The device of claim 1, wherein
the device further comprises a second magnetic thin wire coupled to the first electrode,
the second magnetic thin wire comprises magnetic domains along a direction in which the second magnetic thin wire extends, magnetization directions of the second magnetic domains being variable,
the second electrode comprises a third magnetic thin wire, and
the third magnetic thin wire comprises magnetic domains along a direction in which the third magnetic thin wire extends, magnetization directions of the third magnetic domains being variable.

9. The device of claim 8, wherein
a voltage is applied between an end of the third magnetic thin wire opposite the first magnetic thin wire and the first electrode to move the magnetic domains in the third magnetic thin wire.

10. The device of claim 8, wherein
the at least one third electrode comprises a fourth magnetic thin wire, and
the fourth magnetic thin wire comprises magnetic domains along a direction in which the fourth magnetic thin wire extends, the magnetization directions of the fourth magnetic domains being variable.

11. A magnetic memory device comprising:
a magnetic thin wire comprising magnetic domains along a direction in which the magnetic thin wire extends, the magnetic domains including a first magnetic domain, magnetization directions of the magnetic domains being variable;
a magnetic tunnel junction (MTJ) structure comprising a pinned layer with a fixed magnetization direction and an insulator, and making an MTJ comprising the pinned layer, the insulator and a magnetic domain in the magnetic thin wire in a position to sandwich the insulator with the pinned layer, the pinned layer and the first magnetic domain having the same magnetization direction;
a first node having a potential based on a read current from the MTJ structure; and
a feedback loop holding a bias to the first node when a potential based on a read current from the MTJ structure including the first magnetic domain is equal to a first potential.

12. The device of claim 11, wherein
the first magnetic domain is a magnetic domain of the magnetic domains other than magnetic domains used for storing data.

13. The device of claim 11, wherein
the magnetic thin wire comprises pinning sites along a direction in which the magnetic thin wire extends at uneven intervals.

14. The device of claim 13, wherein
the pinning sites have a cross section smaller than other sections.

15. The device of claim 13, wherein
the pinning sites are located so that, among intervals of adjacent two of both ends of the magnetic thin wire and the pinning sites, a pair nearer to an end of the magnetic thin wire has a larger interval.

16. A magnetic memory device comprising:
magnetic thin wires comprising magnetic domains along directions in which the magnetic thin wires extend, magnetization of the magnetic domains being variable;
MTJ structures comprising respective parts of the magnetic thin wires, respectively;
a first bit line;
first transistors coupled, respectively between the MTJ structures and the first bit lines; and
a first electrode comprising first electrode sections between the magnetic thin wires, the first electrode sections being coupled to each other; and
a second transistor coupled between the first electrode and a driver.

17. The device of claim 16, wherein
the device further comprises a second electrode and a third transistor coupled between the second electrode and the driver, and
the second electrode comprises second electrode sections between the magnetic thin wires,
the second electrode sections are coupled to each other,
each of the magnetic thin wires is located between a first electrode section and a second electrode section, and
the driver is configured to apply a voltage to the first and second electrodes to move respective magnetic domains of the magnetic thin wires.

18. The device of claim 17, further comprising a controller which outputs a first selection signal to turn on the second and third transistors, and a second selection signal to turn on one of the first transistors.

19. The device of claim 18, wherein
the magnetic thin wires, MTJ structures, first to third transistors, and first and second electrodes make a set,
the device further comprises a plurality of the sets, and
the controller is configured to output the first selection signal to a selected one of the sets.

20. The device of claim 16, further comprising:
cell arrays each comprising magnetic thin wires;
preamplifiers each provided for one or more of the cell arrays and mirroring a read current from a corresponding one or more of the cell arrays; and
a sense amplifier to determine data in accordance with the current from the preamplifiers.

* * * * *